(12) United States Patent
Wang et al.

(10) Patent No.: US 12,237,224 B2
(45) Date of Patent: Feb. 25, 2025

(54) SEMICONDUCTOR DEVICE AND METHOD

(71) Applicant: Taiwan Semiconductor Manufacturing Co., Ltd., Hsinchu (TW)

(72) Inventors: Wei-Ren Wang, New Taipei (TW); Jen Hung Wang, Hsinchu (TW); Tze-Liang Lee, Hsinchu (TW)

(73) Assignee: Taiwan Semiconductor Manufacturing Co. Ltd., Hsinchu (TW)

( * ) Notice: Subject to any disclaimer, the term of this patent is extended or adjusted under 35 U.S.C. 154(b) by 372 days.

(21) Appl. No.: 17/710,457

(22) Filed: Mar. 31, 2022

(65) Prior Publication Data

US 2023/0121210 A1 Apr. 20, 2023

Related U.S. Application Data

(60) Provisional application No. 63/254,780, filed on Oct. 12, 2021.

(51) Int. Cl.
| | |
|---|---|
| *H01L 23/535* | (2006.01) |
| *H01L 21/02* | (2006.01) |
| *H01L 21/768* | (2006.01) |
| *H01L 21/8238* | (2006.01) |
| *H01L 27/092* | (2006.01) |

(Continued)

(52) U.S. Cl.
CPC .... *H01L 21/76897* (2013.01); *H01L 21/0259* (2013.01); *H01L 21/823807* (2013.01); *H01L 21/823814* (2013.01); *H01L 21/823871* (2013.01); *H01L 23/535* (2013.01); *H01L 27/092* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 2015/0262860 A1* | 9/2015 | Kao | H01L 23/53295 438/653 |
| 2017/0278744 A1* | 9/2017 | Wang | H01L 21/31116 |

(Continued)

FOREIGN PATENT DOCUMENTS

| | | | | |
|---|---|---|---|---|
| CN | 118315337 A | * | 7/2024 | H01L 21/30608 |
| DE | 102019106654 A1 | * | 4/2020 | H01L 21/743 |
| DE | 102023107765 A1 | * | 5/2024 | H01L 21/823412 |

*Primary Examiner* — Michael Lebentritt
(74) *Attorney, Agent, or Firm* — Slater Matsil, LLP

(57) ABSTRACT

An improved method of forming conductive features and a semiconductor device formed by the same are disclosed. In an embodiment, a method includes forming a metal line extending through a first dielectric layer, the metal line being electrically coupled to a transistor; selectively depositing a sacrificial material over the metal line; selectively depositing a first dielectric material over the first dielectric layer and adjacent to the sacrificial material; selectively depositing a second dielectric material over the first dielectric material; removing the sacrificial material to form a first recess exposing the metal line; and forming a metal via in the first recess and electrically coupled to the metal line.

20 Claims, 80 Drawing Sheets

(51) Int. Cl.
    *H01L 29/06*     (2006.01)
    *H01L 29/423*     (2006.01)
    *H01L 29/66*     (2006.01)
    *H01L 29/786*     (2006.01)

(56) References Cited

U.S. PATENT DOCUMENTS

| | | | |
|---|---|---|---|
| 2019/0115297 A1* | 4/2019 | Yang | H01L 23/53271 |
| 2019/0341461 A1* | 11/2019 | Wang | H01L 21/76897 |
| 2020/0043796 A1* | 2/2020 | Yeong | H01L 21/76897 |
| 2021/0082802 A1 | 3/2021 | Huang et al. | |
| 2021/0104616 A1* | 4/2021 | Su | H01L 29/78696 |
| 2021/0193511 A1* | 6/2021 | Wang | H01L 21/7685 |
| 2021/0202238 A1* | 7/2021 | Wang | H01L 21/0274 |
| 2021/0343588 A1* | 11/2021 | Lin | H01L 21/76802 |
| 2022/0406653 A1* | 12/2022 | Hsiung | H01L 29/41733 |
| 2023/0135172 A1* | 5/2023 | Wang | H01L 21/7685 |
| | | | 438/396 |
| 2023/0335436 A1* | 10/2023 | Wang | H01L 23/485 |
| 2024/0250134 A1* | 7/2024 | Chen | H01L 21/823871 |

\* cited by examiner

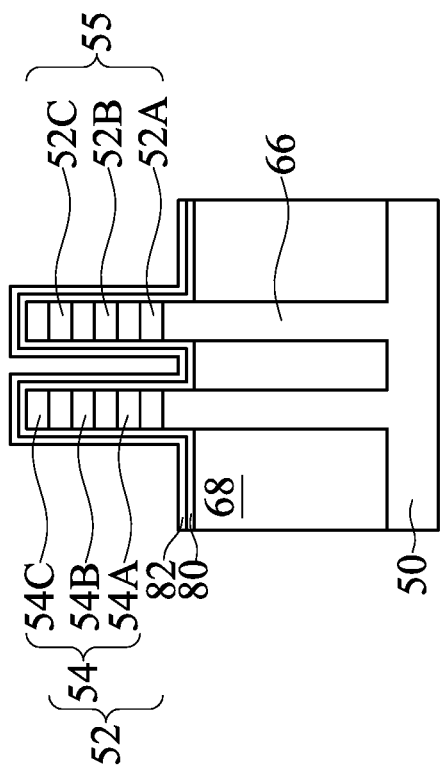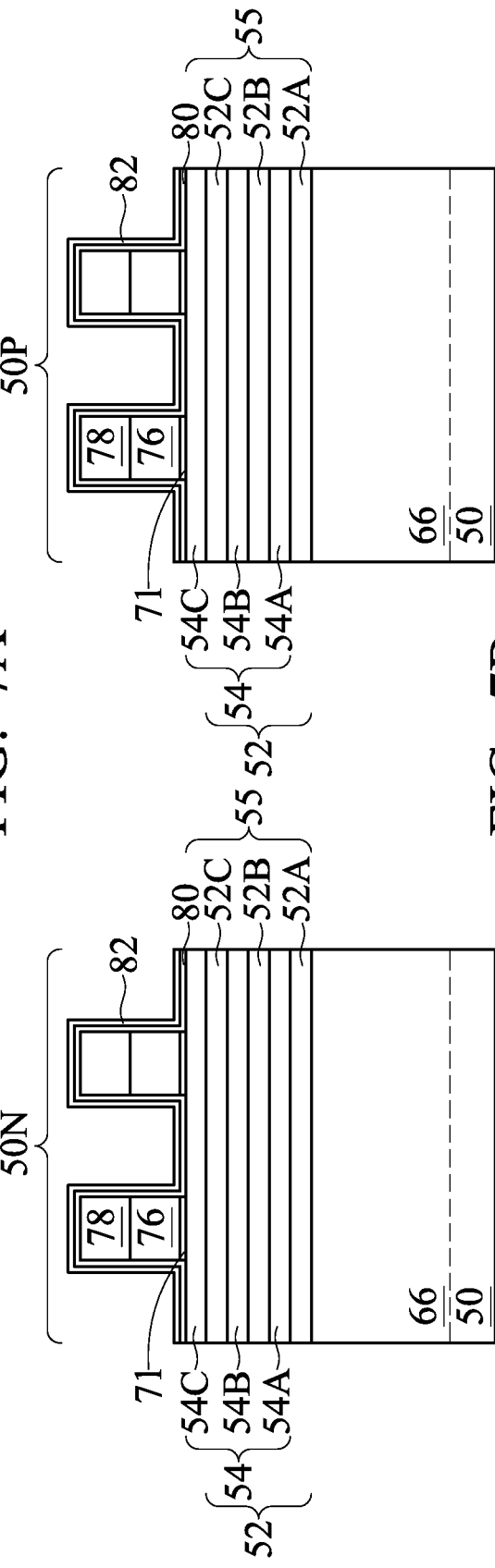
FIG. 7A
FIG. 7B

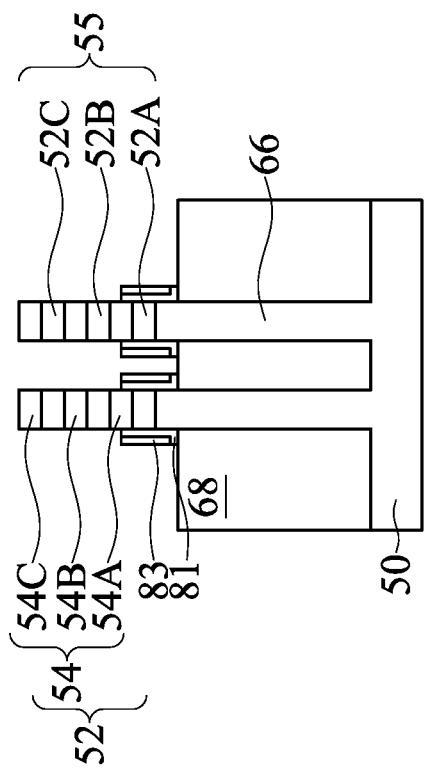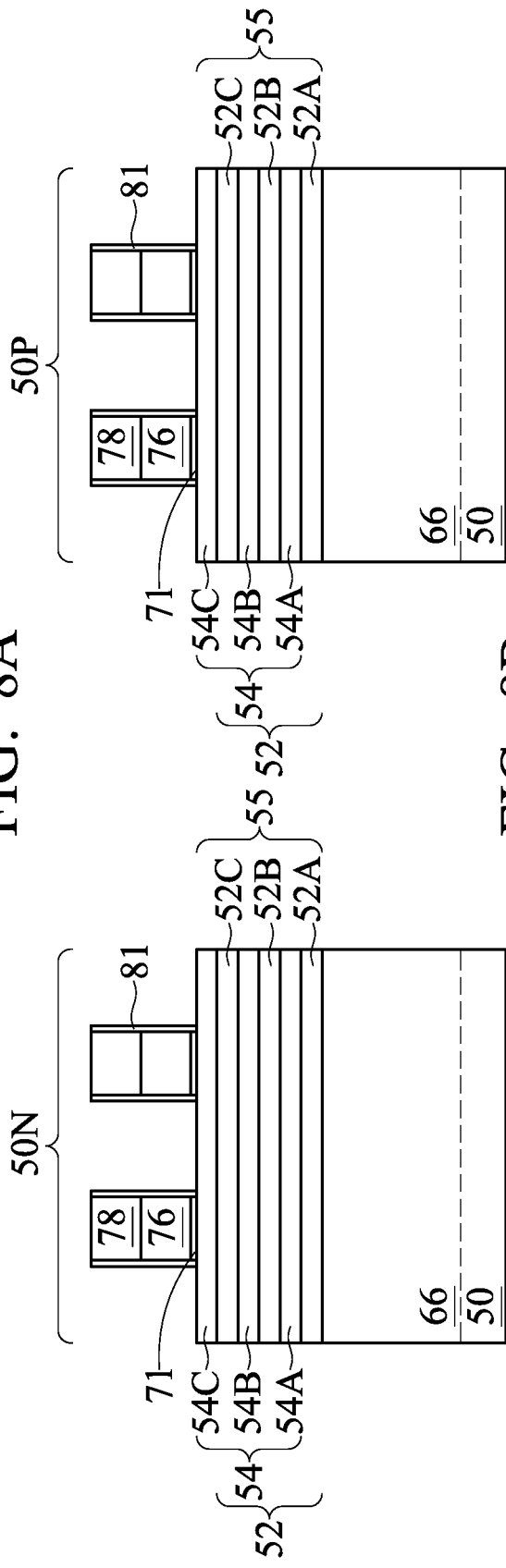
FIG. 8A
FIG. 8B

SEMICONDUCTOR DEVICE AND METHOD

PRIORITY CLAIM AND CROSS-REFERENCE

This application claims the benefit of U.S. Provisional Application No. 63/254,780, filed on Oct. 12, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 19C, 20A, 20B, 20C, 21A, 21B, 21C, 22A, 22B, 22C, 23A, 23B, 24A, 24B, 25A, 25B, 26A, 26B, 26C, 26D, 27A, 27B, 28A, 28B, 28C, 28D, 29A, 29B, 30A, 30B, 31A, 31B, 32A, 32B, 33A, 33B, 34A, 34B, 35A, 35B, 36A, 36B, 37A, 37B, 38A, 38B, 39A, 39B, 40A, 40B, 41A, and 41B are cross-sectional views of intermediate stages in the manufacturing of nanostructure FETs, in accordance with some embodiments.

DETAILED DESCRIPTION

Figure 1:
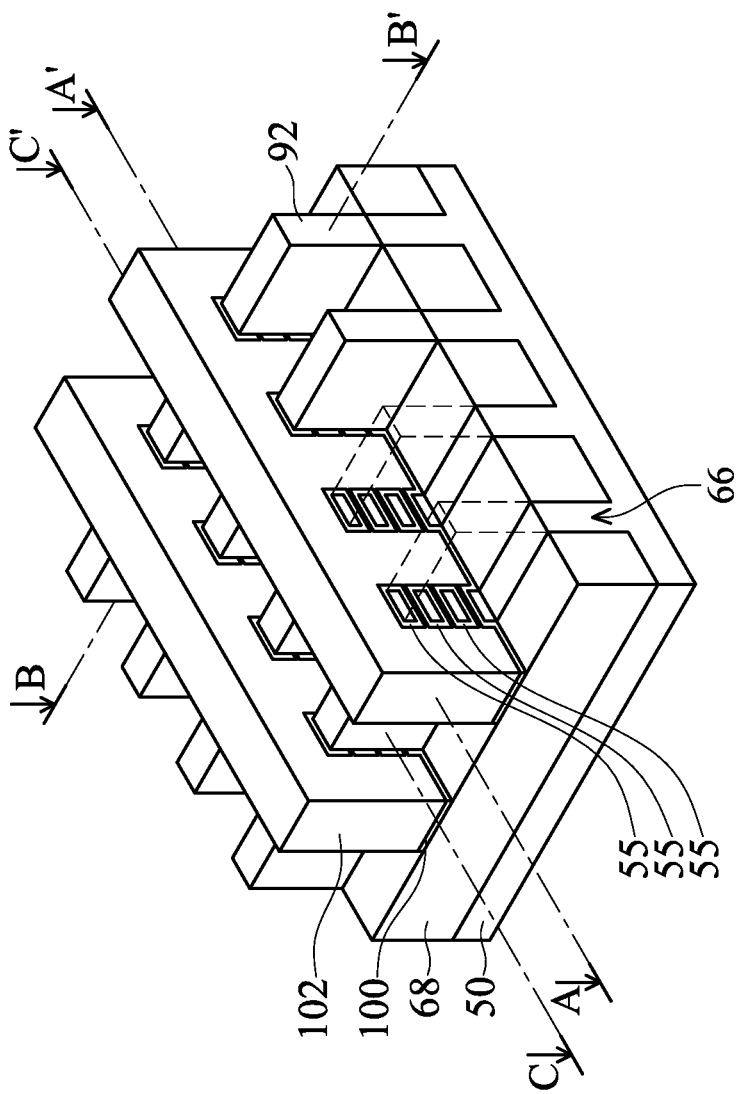
FIG. 1 illustrates an example of a nanostructure field-effect transistor (nanostructure FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved methods for forming metal lines and metal vias in dielectric layers and semiconductor devices formed by the same. The method includes selectively depositing a sacrificial material over underlying metal lines and selectively depositing a first dielectric material adjacent the sacrificial material and over an underlying dielectric layer. In some embodiments, the sacrificial material is trimmed using a plasma process. A second dielectric material is selectively deposited over the first dielectric material adjacent the sacrificial material. In some embodiments, a second dielectric layer is deposited over the sacrificial material, the first dielectric material, and the second dielectric material, the second dielectric layer is etched through to form first recesses exposing the sacrificial material, and the sacrificial material is selectively removed to form second recesses exposing the underlying metal lines. In some embodiments, the sacrificial material is selectively removed, the second dielectric layer is deposited over the underlying metal lines, the first dielectric material, and the second dielectric material, and the second dielectric layer is etched through to form third recesses exposing the underlying metal lines. Metal vias are formed in the second recesses, the first recesses, and the third recesses. In some embodiments, the first dielectric material is selectively deposited over the underlying dielectric layer, then the sacrificial material is deposited adjacent the first dielectric material and over the underlying metal lines, the sacrificial material is trimmed, and the second dielectric material is deposited adjacent the sacrificial material and over the first dielectric material. Using selective processes for the above-described deposition and etching processes helps ensure maximum contact between the metal vias and the metal lines and reduce misalignment of the metal vias over the metal lines, which reduces resistance-capacitance (RC) delay, reduces electromigration (EM) reliability issues, reduces time-dependent dielectric breakdown (TDDB), reduces device defects, and improves device performance. Further, the second dielectric material may be formed over low-k materials, which may be used to reduce parasitic capacitance, further improving device performance.

Embodiments are described below in a particular context, a die comprising nanostructure FETs. Various embodiments may be applied, however, to dies comprising other types of transistors (e.g., fin field effect transistors (FinFETs), planar transistors, or the like) in lieu of or in combination with the nanostructure FETs.

FIG. 1 illustrates an example of nanostructure FETs (e.g., nanowire FETs, nanosheet FETs (Nano-FETs), multi-bridge-channel FETs (MBCFETs), gate-all-around FETs (GAA FETs), nano-ribbon FETs, or the like) in a three-dimensional view. The nanostructure FETs comprise nanostructures 55 (e.g., nanosheets, nanowires, or the like) over fins 66 on a substrate 50 (e.g., a semiconductor substrate). The nanostructures 55 act as channel regions for the nanostructure FETs. The nanostructures 55 may include p-type nanostructures, n-type nanostructures, or a combination thereof. Isolation regions 68 are disposed between adjacent fins 66. The fins 66 may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 is illustrated as being a single, continuous material with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces and sidewalls of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nanostructure FET. Cross-section B-B' is perpendicular to cross-section A-A' and is parallel to a longitudinal axis of a fin 66 of the nanostructure FET and in a direction of, for example, the current flow between the epitaxial source/drain regions 92 of the nanostructure FET. Cross-section C-C' is parallel to cross-section A-A' and extends through the epitaxial source/drain regions 92 of the nanostructure FET. Subsequent figures refer to these reference cross-sections for clarity.

Some embodiments discussed herein are discussed in the context of nanostructure FETs formed using a gate-last process. In other embodiments, a gate-first process may be used. Also, some embodiments contemplate aspects used in planar devices, such as planar FETs or in fin field-effect transistors (FinFETs).

FIGS. 2 through 41B are cross-sectional views of intermediate stages in the manufacturing of nanostructure FETs, in accordance with some embodiments. FIGS. 2 through 5, 6A, 13A, 14A, 15A, 16A, 17A, 18A, 19A, 20A, 21A, 22A, 23A, 24A, 25A, 26A, 26C, 27A, 28A, 28C, 29A, 30A, 31A, 32A, 33A, 34A, 35A, 36A, 37A, 38A, 39A, 40A, and 41A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, 24B, 25B, 26B, 26D, 27B, 28B, 28D, 29B, 30B, 31B, 32B, 33B, 34B, 35B, 36B, 37B, 38B, 39B, 40B, and 41B illustrate reference cross-section B-B' illustrated in FIG. 1. FIGS. 7A, 8A, 9A, 10A, 11A, 12A, 12C, 13C, 19C, 20C, 21C, and 22C illustrate reference cross-section C-C' illustrated in FIG. 1.

Figure 2:
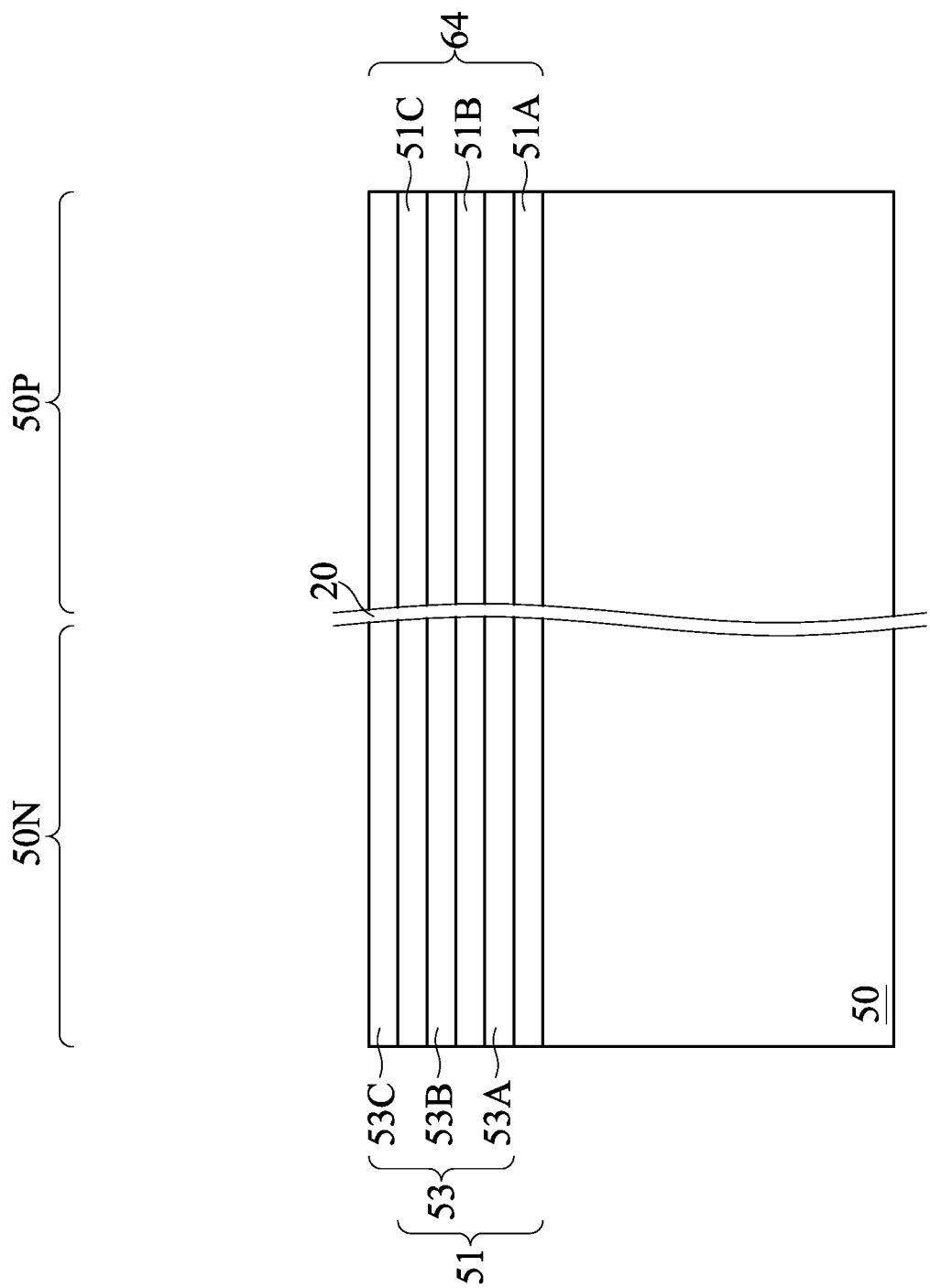

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure FETs. The p-type region 50P can be for forming p-type devices, such as PMOS transistors, e.g., p-type nanostructure FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nanostructure FETs in the p-type region 50P. The first semiconductor layers 51 will be removed and the second semiconductor layers 53 will be patterned to form channel regions of nanostructure FETs in the n-type region 50N. Nevertheless, in some embodiments the first semiconductor layers 51 may be removed and the second semiconductor layers 53 may be patterned to form channel regions of nanostructure FETs in the n-type region 50N, and the second semiconductor layers 53 may be removed and the first semiconductor layers 51 may be patterned to form channel regions of nanostructure FETs in the p-type region 50P.

Figure 22A:
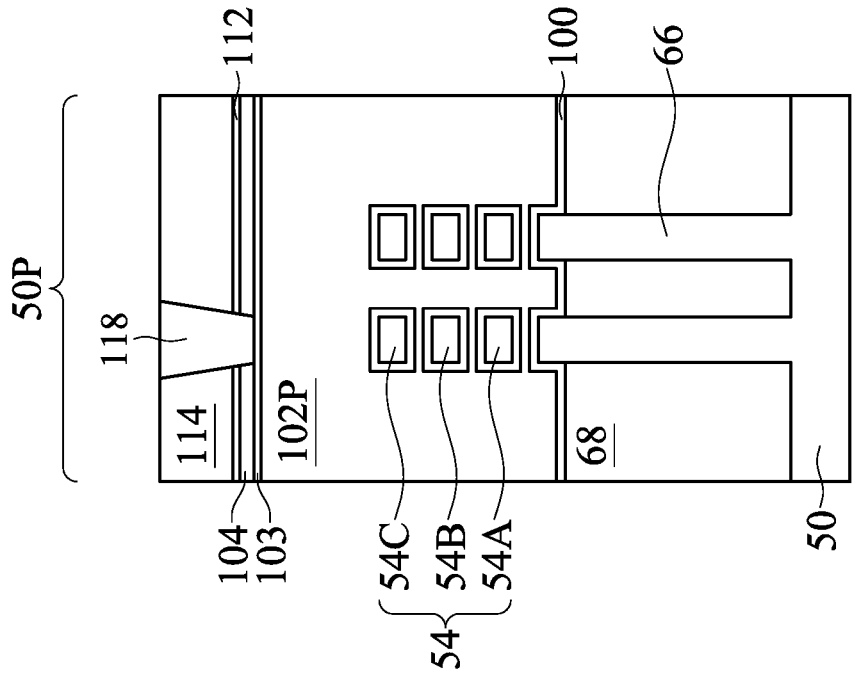
Figure 22A:
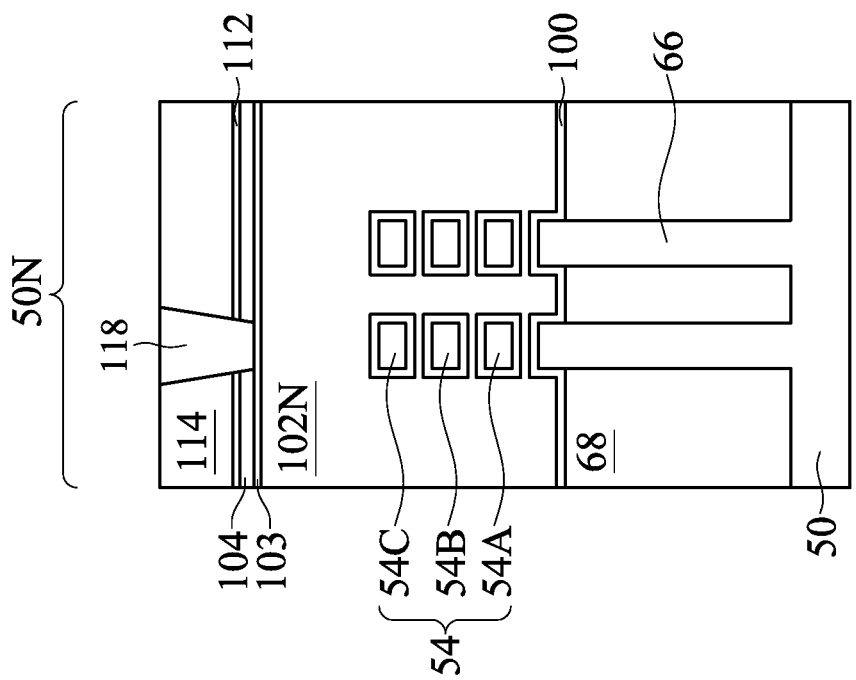
Figure 22B:
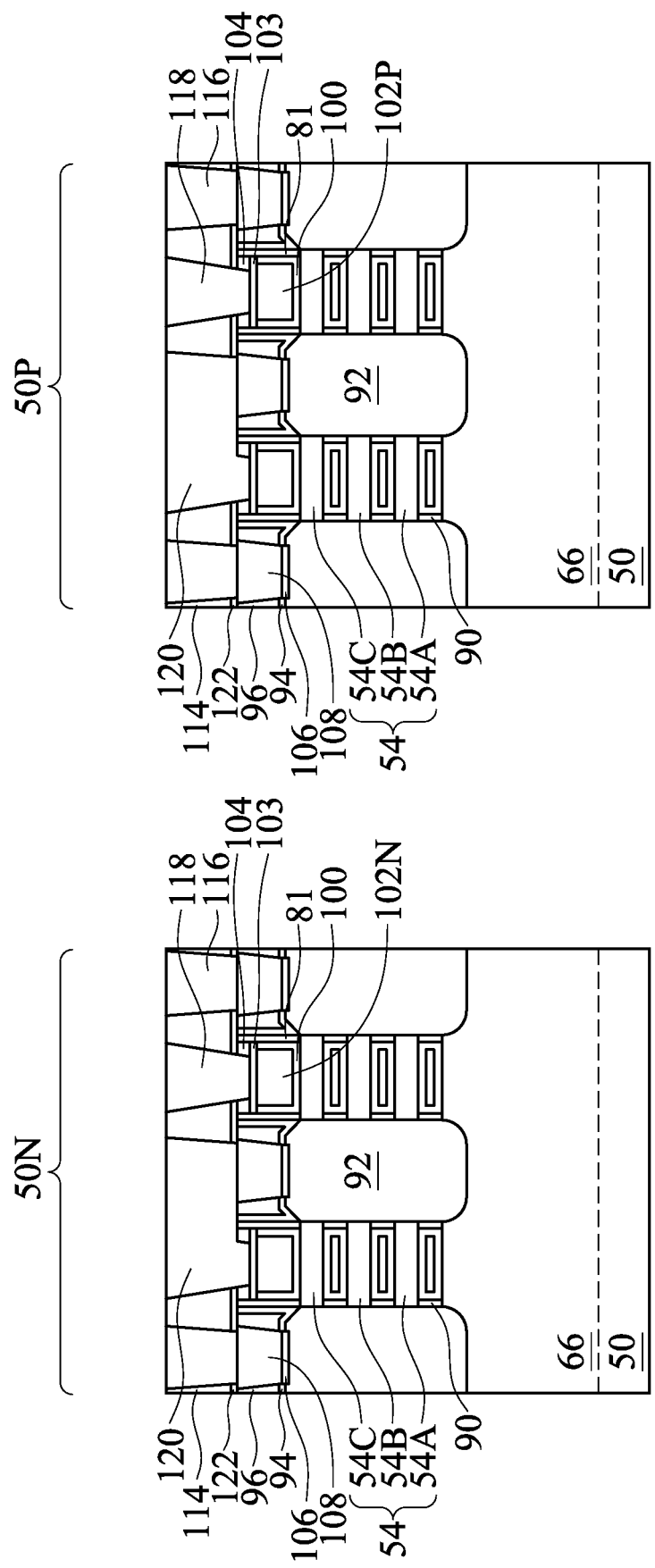
Figure 22C:
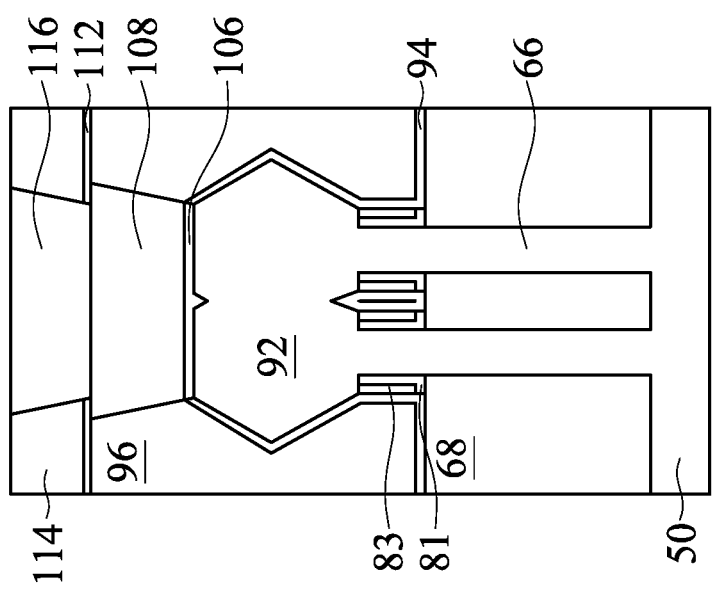

In some embodiments, the first semiconductor layers 51 may be removed and the second semiconductor layers 53 may be patterned to form channel regions of nanostructure FETS in both the n-type region 50N and the p-type region 50P. In some embodiments, the second semiconductor layers 53 may be removed and the first semiconductor layers 51 may be patterned to form channel regions of nanostructure FETs in both the n-type region 50N and the p-type region 50P. In such embodiments, the channel regions in both the n-type region 50N and the p-type region 50P may have a same material composition (e.g., silicon, or another semiconductor material) and be formed simultaneously. FIGS. 22A, 22B, and 22C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. The first semiconductor layers 51 may be formed of a first semiconductor material suitable for p-type nanostructure FETs, such as silicon germanium or the like. The second semiconductor layers 53 may be formed of a second semiconductor material suitable for n-type nanostructure FETs, such as silicon, silicon carbon, or the like. The multi-layer stack 64 is illustrated as having a bottommost semiconductor layer suitable for p-type nanostructure FETs (e.g., the first semiconductor layers 51) for illustrative purposes. In some embodiments, the multi-layer stack 64 may be formed such that the bottommost layer is a semiconductor layer suitable for n-type nanostructure FETs (e.g., the second semiconductor layers 53).

The first semiconductor materials and the second semiconductor materials may be materials having a high etch selectivity to one another. As such, the first semiconductor layers 51 formed of the first semiconductor materials may be removed without significantly removing the second semiconductor layers 53 formed of the second semiconductor materials in the n-type region 50N. This allows the second semiconductor layers 53 to be patterned to form channel regions of n-type nanostructure FETs. Similarly, the second semiconductor layers 53 formed of the second semiconductor materials may be removed without significantly removing the first semiconductor layers 51 formed of the first semiconductor materials in the p-type region 50P. This allows the first semiconductor layers 51 to be patterned to form channel regions of p-type nanostructure FETs.

Figure 3:
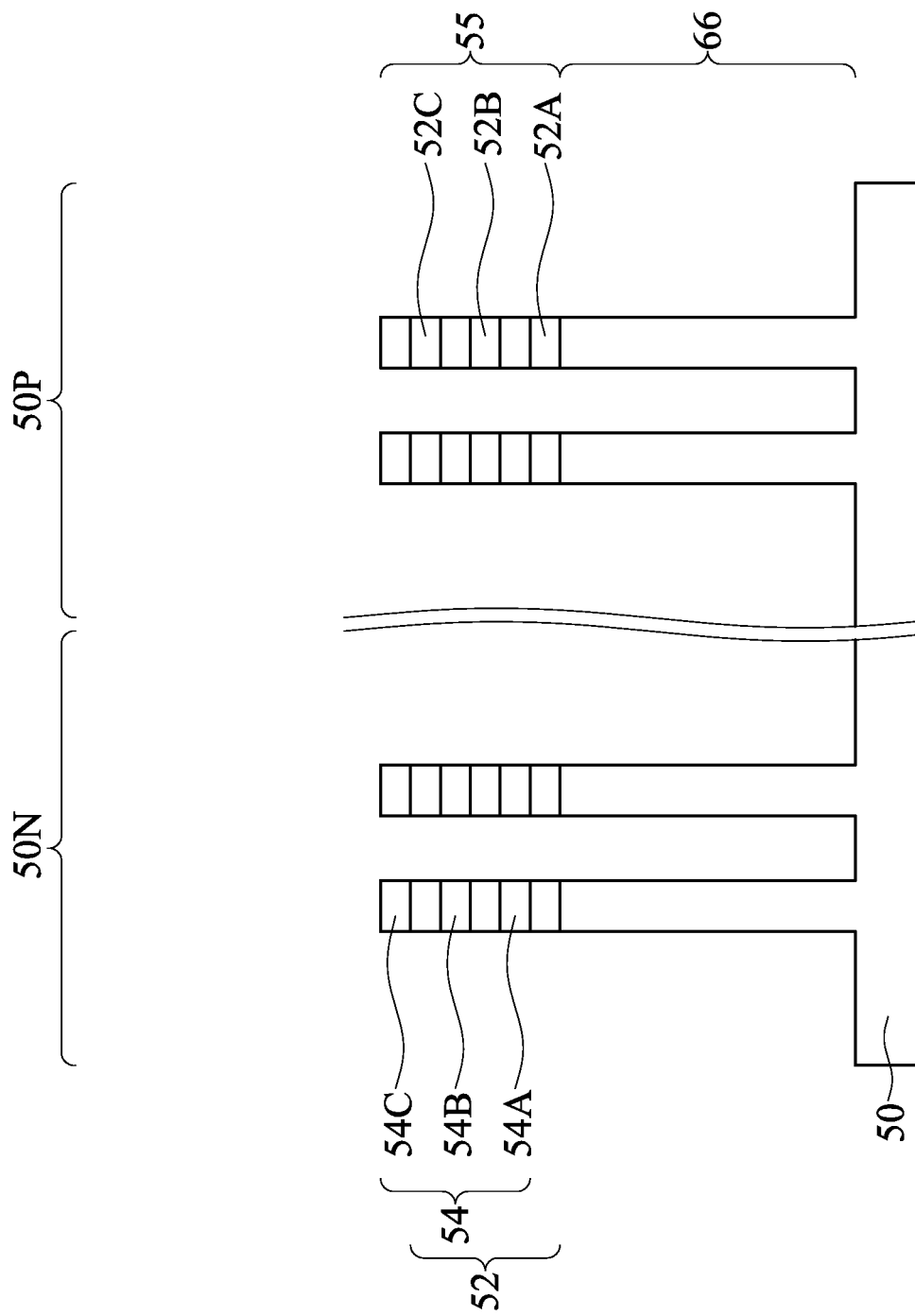

In FIG. 3, fins 66 are formed in the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as first nanostructures 52) from the first semiconductor layers 51 and define second nanostructures 54A-C (collectively referred to as second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers are used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater than or less than widths of the fins 66 in the p-type region 50P. Further, while each of the fins 66 and the nanostructures 55 are illustrated as having a consistent width throughout, in some embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and may be trapezoidal in shape.

Figure 4:
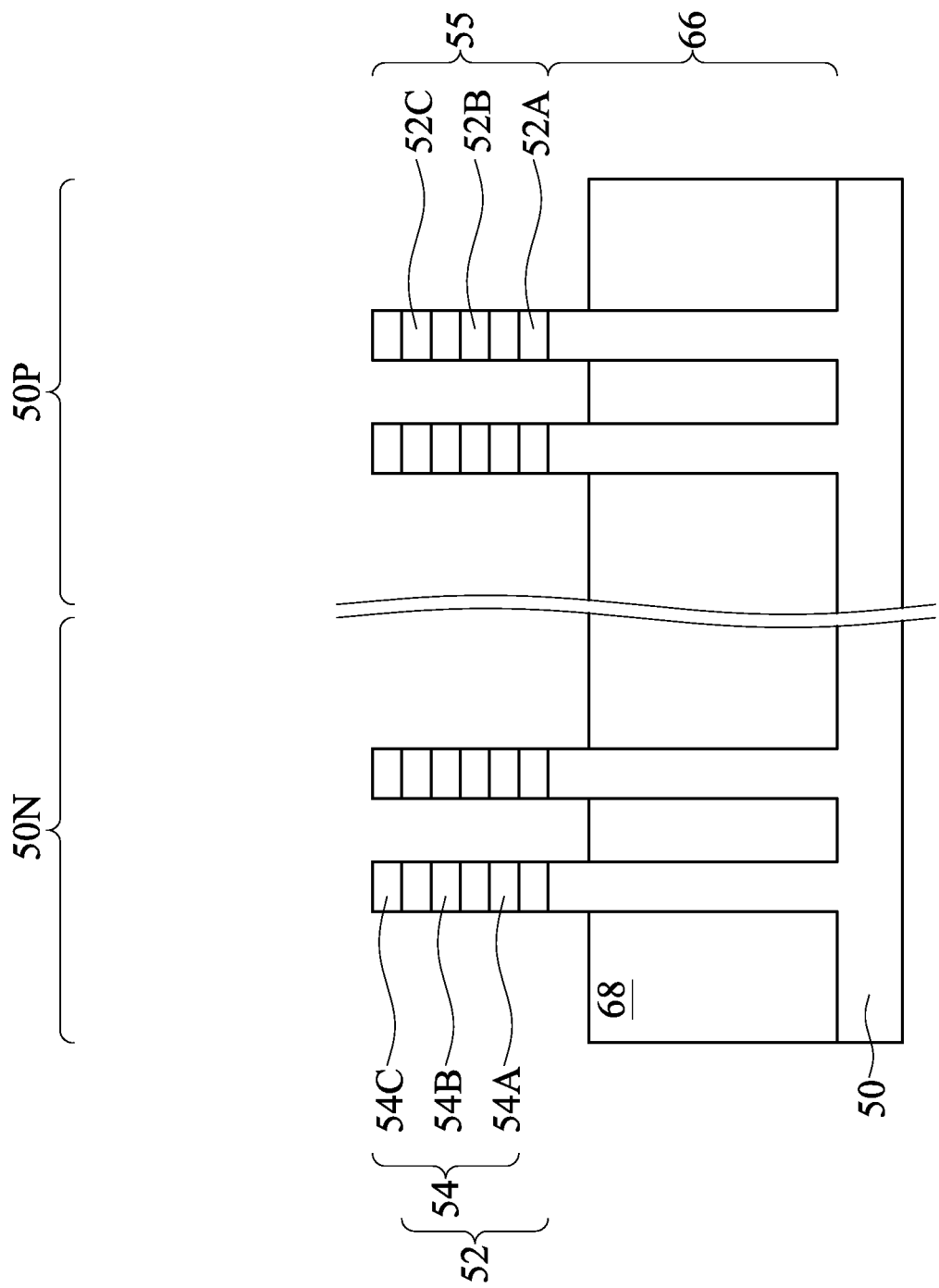

In FIG. 4, shallow trench isolation (STI) regions 68 are formed adjacent the fins 66. The STI regions 68 may be formed by depositing an insulation material over the substrate 50, the fins 66, and the nanostructures 55, and between adjacent fins 66. The insulation material may be an oxide (such as silicon oxide), a nitride, the like, or a combination thereof. The insulation material may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments, a liner (not separately illustrated) may be formed along surfaces of the substrate 50, the fins 66, and the nanostructures 55. Thereafter, a fill material, such as those discussed above, may be formed over the liner.

A removal process is then applied to the insulation material to remove excess insulation material over the nanostructures 55. In some embodiments, a planarization process, such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of the fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etch process, such as one that is selective to the material of the insulation material (e.g., etches the material of the insulation material at a faster rate than the material of the fins 66 and the nanostructures 55). An oxide removal using dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth. This may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66, the nanostructures, and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
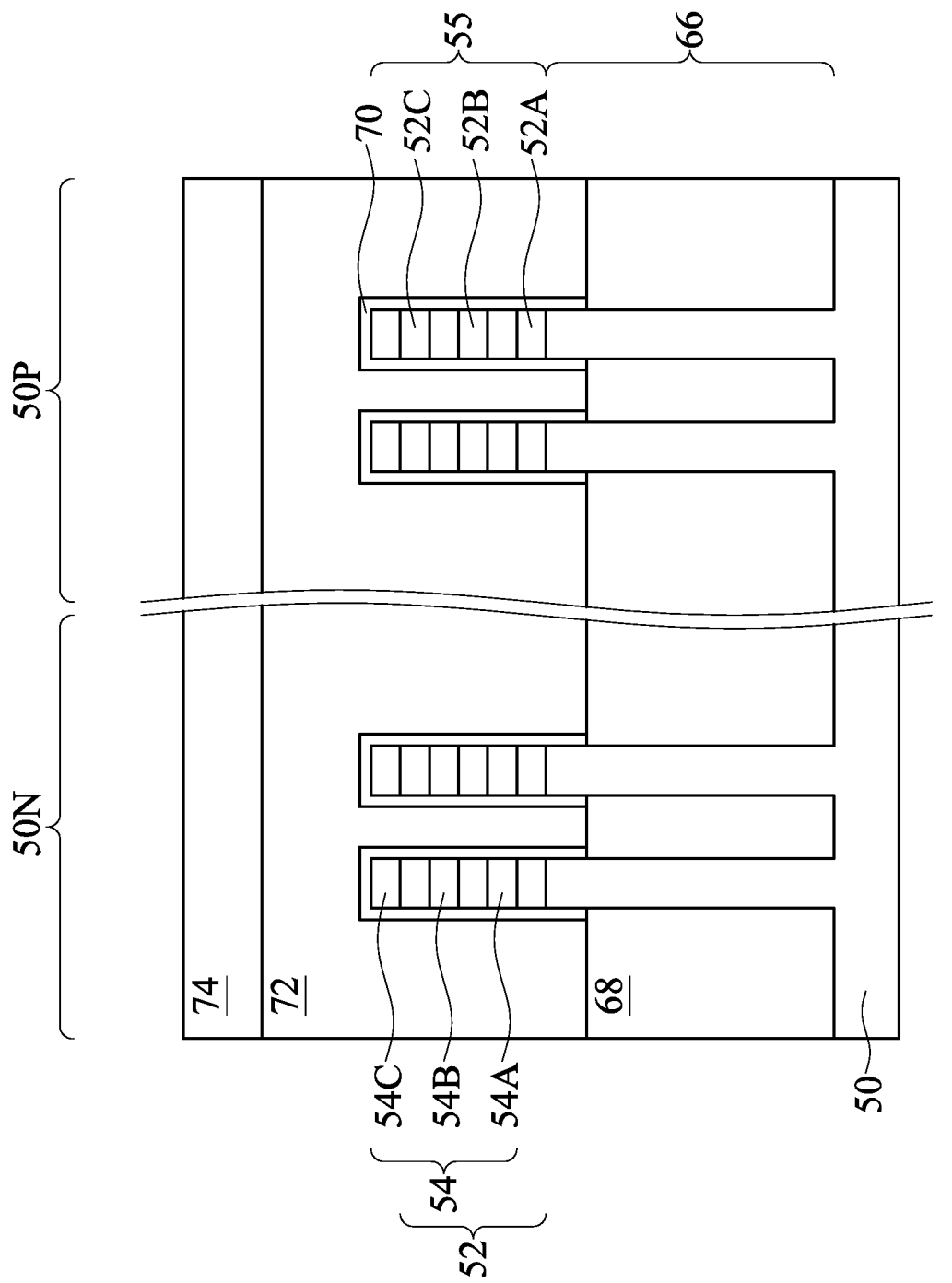

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques.

A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etch selectivity from the etching of isolation regions.

The mask layer 74 may be deposited over the dummy gate layer 72. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68. As such, the dummy dielectric layer 70 may extend between the dummy gate layer 72 and the STI regions 68.

Figure 6A:
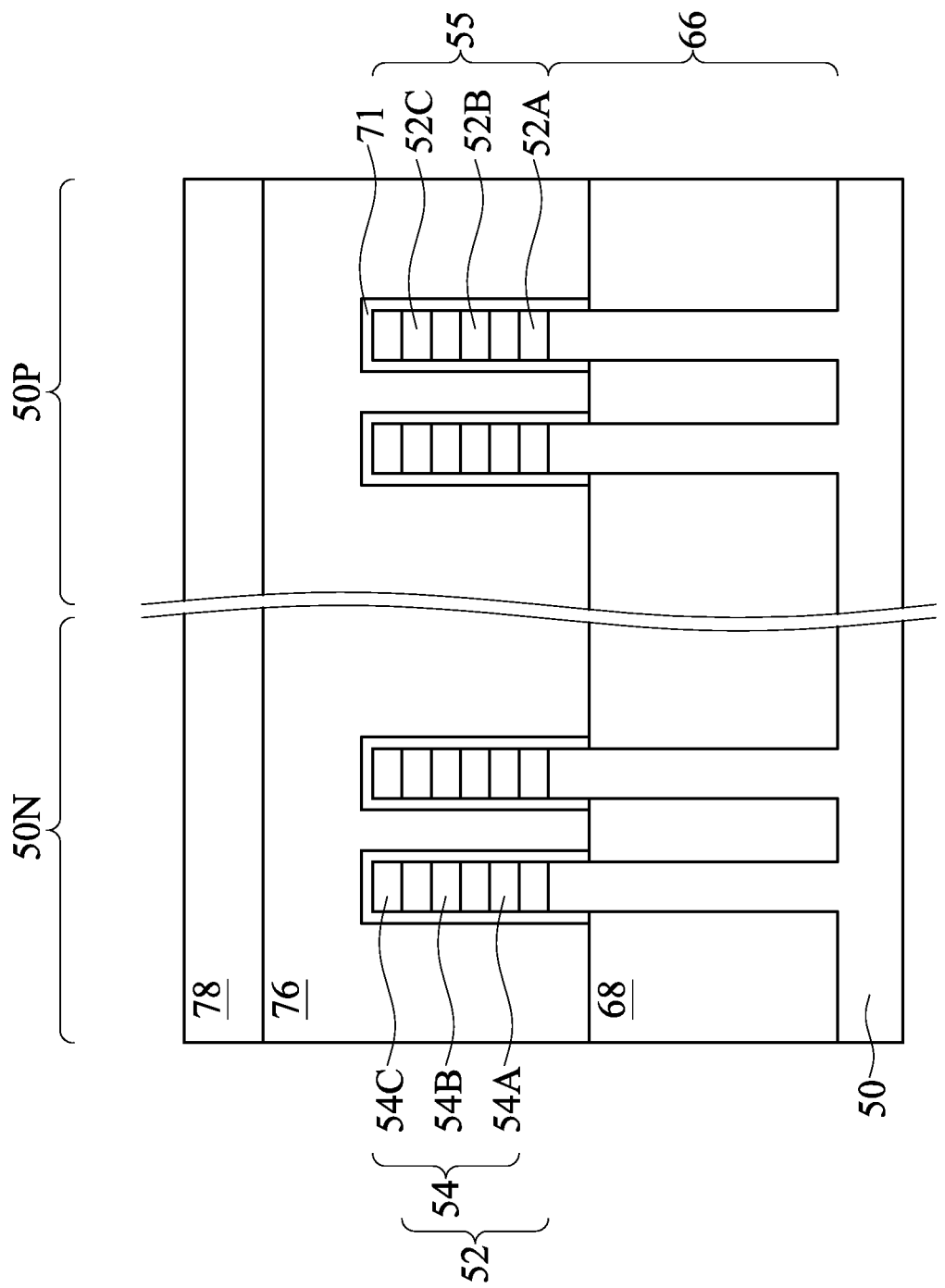
Figure 6B:
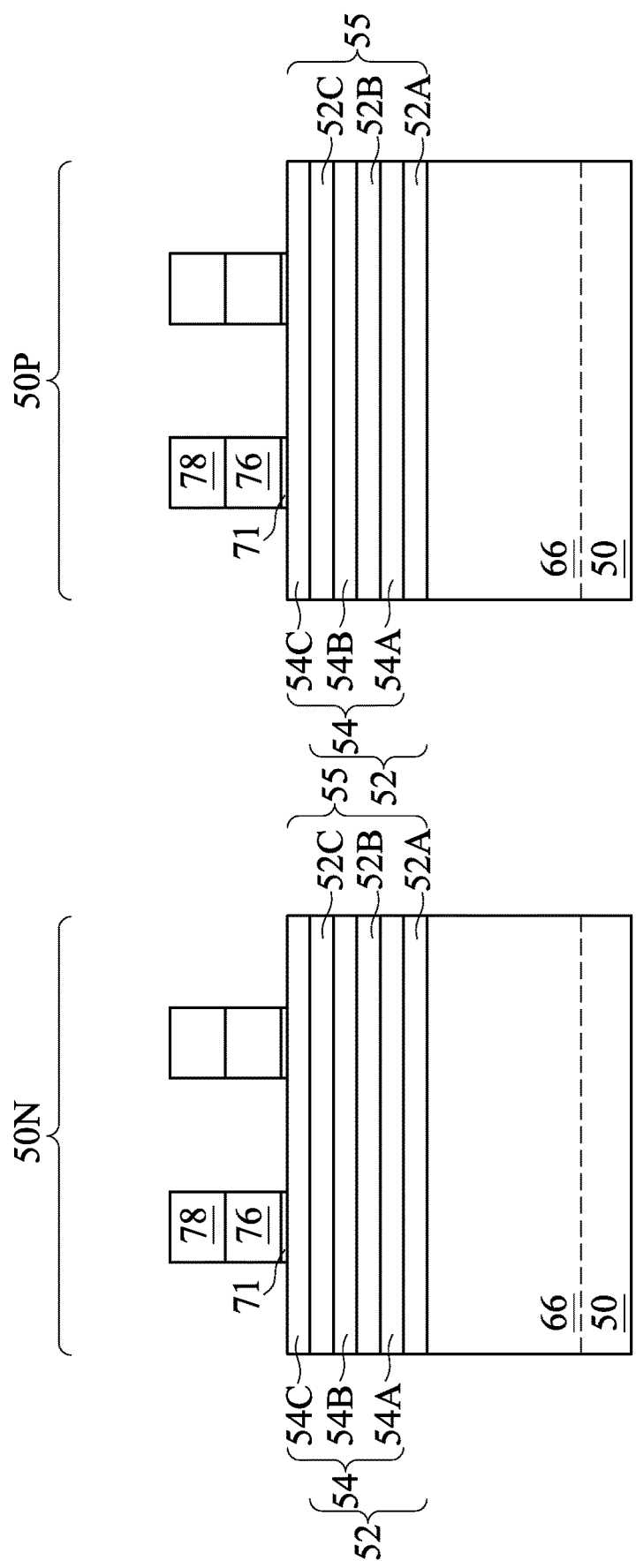

FIGS. 6A through 41B illustrate various additional steps in the manufacturing of embodiment devices. FIGS. 7A, 8A, 9A, 10A, 11A, 12A, 12C, 13A, 13C, 14A, 15A, 19A, 20C, 21C, and 22C illustrate features in either the n-type regions 50N or the p-type regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may also have a lengthwise direction substantially perpendicular to the lengthwise direction of respective fins 66. The masks 78, the dummy gates 76, and the dummy gate dielectrics 71 may be collectively referred to as "dummy gate structures."

In FIGS. 7A and 7B, a first spacer layer 80 and a second spacer layer 82 are formed over dummy gate structures, the nanostructures 55, and the STI regions 68. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the nanostructures 55 and the masks 78; and sidewalls of the dummy gates 76, the dummy gate dielectrics 71, and the fins 66. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P. Appropriate type (e.g., p-type) impurities may be implanted into the exposed fins 66 and the nanostructures 55 in the p-type region 50P. The mask may then be removed. Subsequently, a mask, such as a photoresist, may be formed over the p-type region 50P while exposing the n-type region 50N. Appropriate type impurities (e.g., n-type) may be implanted into the exposed fins 66 and the nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

In FIGS. 8A and 8B, the first spacer layer 80 and the second spacer layer 82 (see FIGS. 7A and 7B) are etched to form first spacers 81 and second spacers 83. As will be discussed in greater detail below, the first spacers 81 and the second spacers 83 act to self-align subsequently formed source drain regions, as well as to protect sidewalls of the fins 66 and/or the nanostructures 55 during subsequent processing. The first spacer layer 80 and the second spacer layer 82 may be etched using a suitable etch process, such as an isotropic etch process (e.g., a wet etch process), an anisotropic etch process (e.g., a dry etch process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process wherein the first spacer layer 80 acts as an etch stop layer. Remaining portions of the second spacer layer 82 form second spacers 83, as illustrated in FIG. 8A. The second spacers 83 then act as a mask while etching exposed portions of the first spacer layer 80, thereby forming first spacers 81 as illustrated in FIGS. 8A and 8B.

As illustrated in FIG. 8A, the first spacers 81 and the second spacers 83 are disposed on sidewalls of the fins 66 and/or the nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and only the first spacers 81 are disposed on sidewalls of the masks 78, the dummy gates 76, and the dummy dielectric layers 70. In some embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
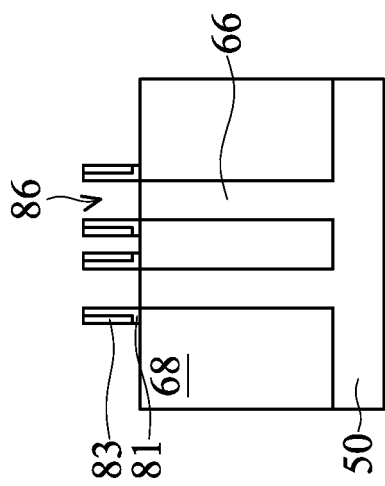
Figure 9B:
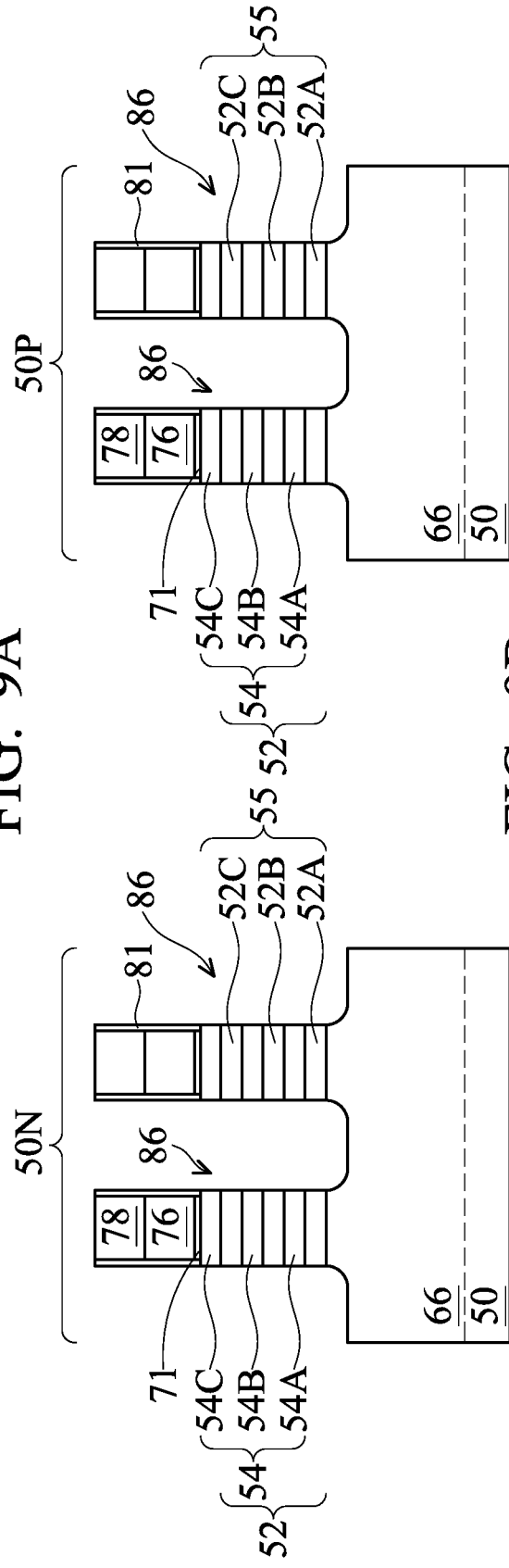

In FIGS. 9A and 9B, first recesses 86 are formed in the nanostructures 55, the fins 66, and the substrate 50. Epitaxial source/drain regions will be subsequently formed in the first recesses 86. The first recesses 86 may extend through the first nanostructures 52, the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed above the top surfaces of the STI regions 68, below the top surfaces of the STI regions 68, or the like. The first recesses 86 may be formed by etching the nanostructures 55, the fins 66, and the substrate 50 using an anisotropic etch processes, such as RIE, NBE, or the like. The first spacers 81, the second spacers 83, and the masks 78 mask portions of the nanostructures 55, the fins 66, and the substrate 50 during the etch processes used to form the first recesses 86. A single etch process or multiple etch processes may be used to etch each layer of the nanostructures 55, the fins 66, and/or the substrate 50. Timed etch processes may be used to stop the etching of the first recesses 86 after the first recesses 86 reach a desired depth.

Figure 10A:
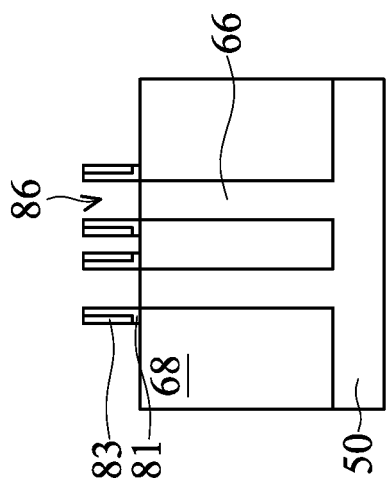
Figure 10B:
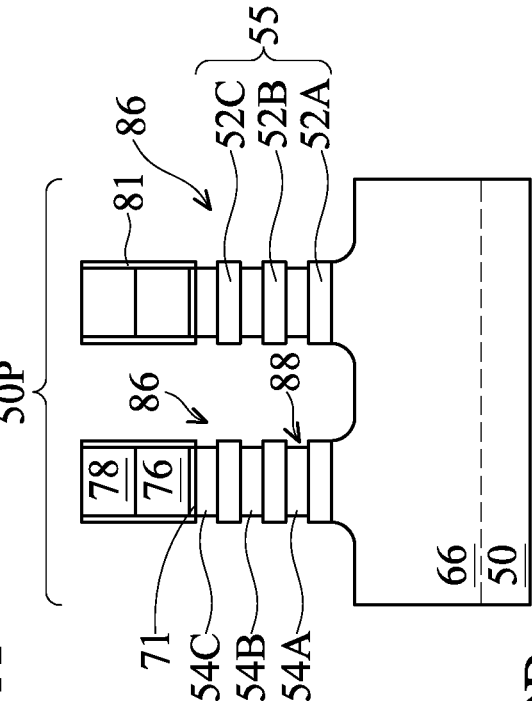
Figure 10B:
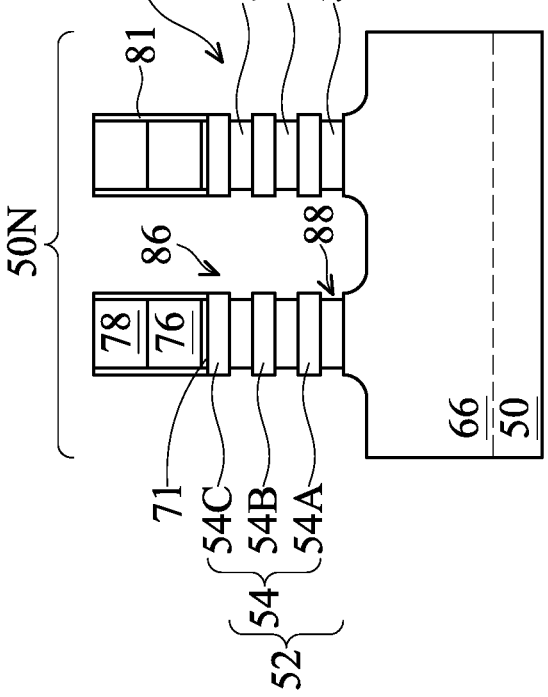

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 adjacent the sidewall recesses 88 are illustrated as being straight in FIG. 10B, the sidewalls may be concave or convex. The sidewalls may be etched using isotropic etch processes, such as a wet etch or the like. The p-type region 50P may be protected using a mask (not separately illustrated), while etchants selective to the first semiconductor materials are used to etch the first nanostructures 52. As such, the second nanostructures 54 and the substrate 50 in the n-type region 50N remain relatively un-etched as compared to the first nanostructures 52. Similarly, the n-type region 50N may be protected using a mask (not separately illustrated), while etchants selective to the second semiconductor materials are used to etch the second nanostructures 54. As such, the first nanostructures 52 and the substrate 50 in the p-type region 50P remain relatively un-etched as compared to the second nanostructures 54. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N. A wet or dry etch process with hydrogen fluoride, another fluorine-based etchant, or the like may be used to etch sidewalls of the second nanostructures 54 in the p-type region 50P.

Figure 11A:
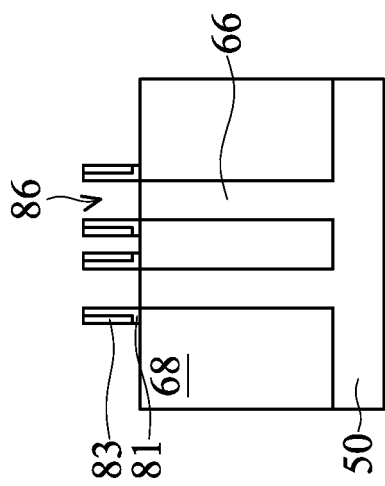
Figure 11B:
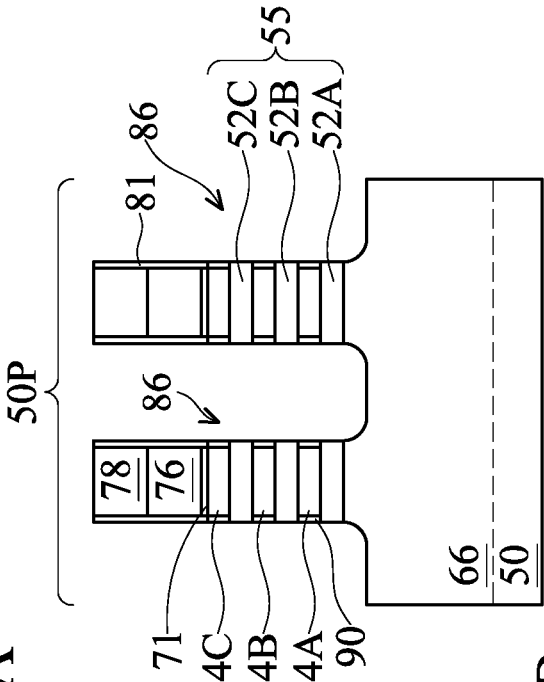
Figure 11B:
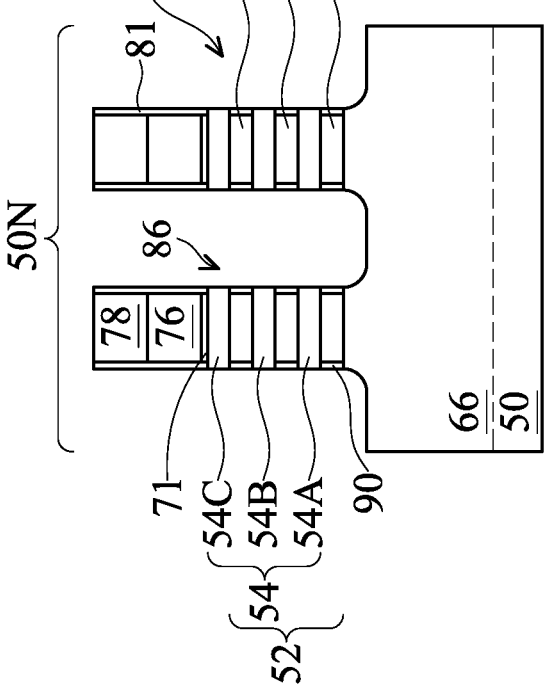
Figure 11C:
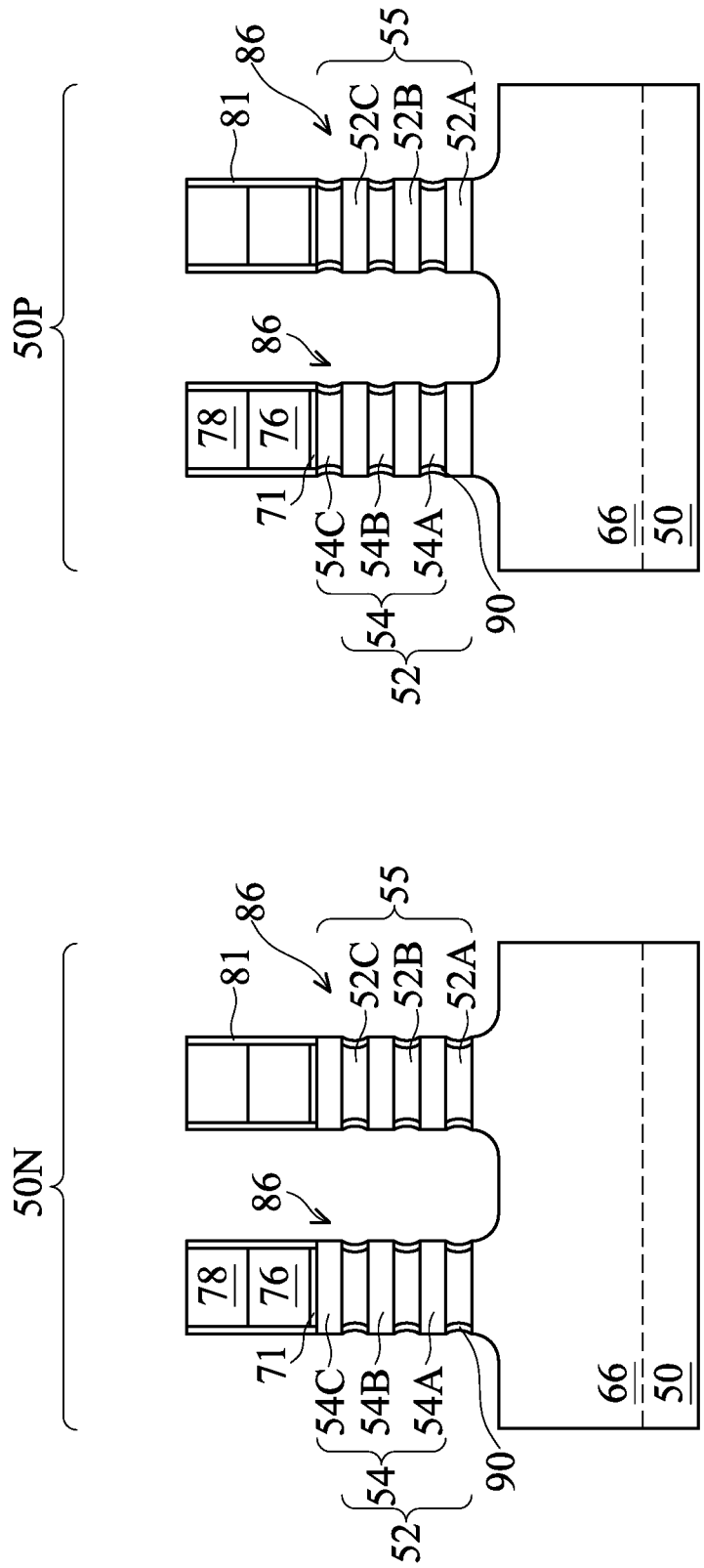

In FIGS. 11A through 11C, first inner spacers 90 are formed in the sidewall recesses 88. The first inner spacers 90 may be formed by depositing an inner spacer layer (not separately illustrated) over the structures illustrated in FIGS. 10A and 10B. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may be anisotropically etched to form the first inner spacers 90, using a process such as RIE, NBE, or the like.

Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52. Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Further in FIG. 11C, sidewalls of the second nanostructures 54 are concave, outer sidewalls of the first inner spacers 90 are concave, and the first inner spacers 90 are recessed from sidewalls of the first nanostructures 52 in the p-type region 50P.

The first inner spacers 90 act as isolation features between subsequently formed source/drain regions (such as the epitaxial source/drain regions 92, discussed below with respect to FIGS. 12A through 12D) and gate structures (such as the gate structures including the gate dielectric layers 100 and the gate electrodes 102, discussed below with respect to FIGS. 17A and 17B). The first inner spacers 90 may also prevent damage to the epitaxial source/drain regions 92 by subsequent etching processes, such as etching processes used to form the gate structures including the gate dielectric layers 100 and the gate electrodes 102

Figure 12A:
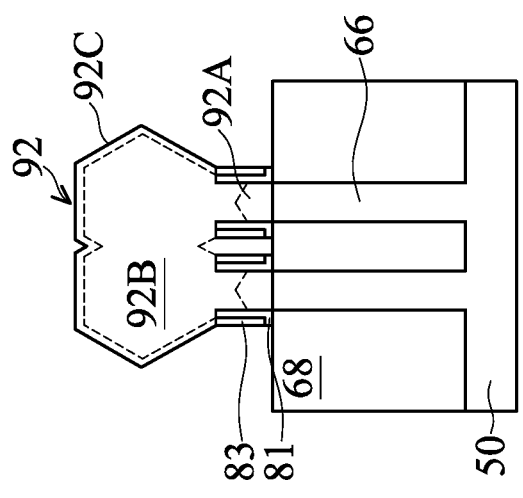
Figure 12B:
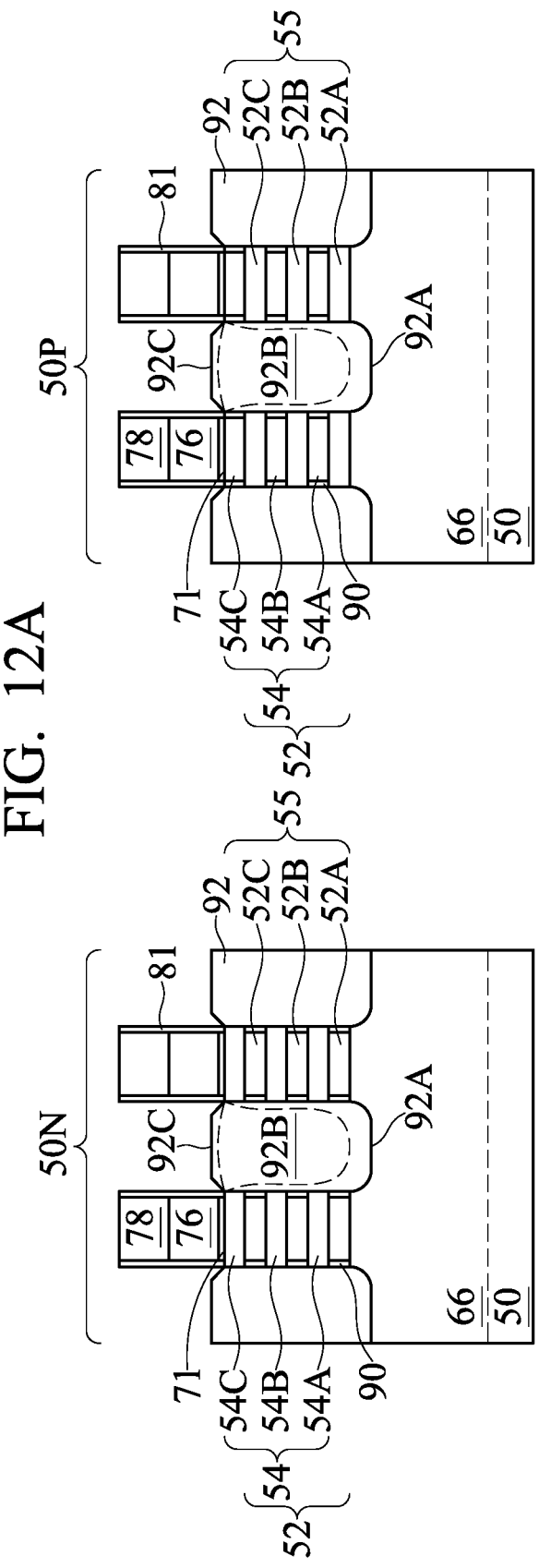

In FIGS. 12A through 12D, epitaxial source/drain regions 92 (which may include a first semiconductor material layer 92A, a second semiconductor material layer 92B, and a third semiconductor material layer 92C) are formed in the first recesses 86 (illustrated in FIGS. 11B and 11C). In some embodiments, the epitaxial source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each of the dummy gates 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by appropriate lateral distances to prevent shorts between the epitaxial source/drain regions 92 and subsequently formed gate structures (such as the gate structures including the gate dielectric layers 100 and the gate electrodes 102, discussed below with respect to FIGS. 17A and 17B).

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nanostructure FETs. For example, in embodiments in which the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nanostructure FETs. For example, in embodiments in which the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the nanostructures 55, the fins 66, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for the source/drain regions may be any of the impurities previously discussed. In some embodiments, the epitaxial source/drain regions 92 may be in situ doped during growth.

Figure 12C:
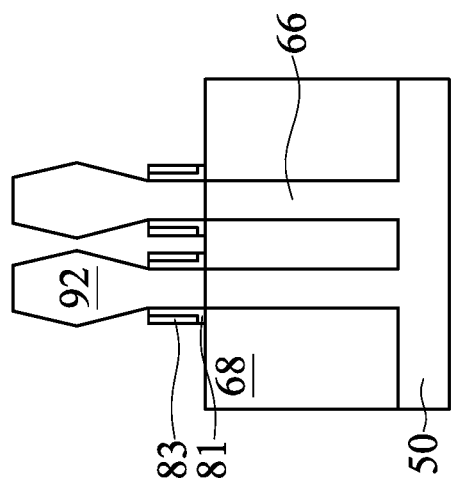

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nanostructure FET to merge, as illustrated by FIG. 12A. In other embodiments, adjacent epitaxial source/drain regions 92 remain separated after the epitaxy process is completed, as illustrated by FIG. 12C. In the embodiments illustrated in FIGS. 12A and 12C, the first spacers 81 may be formed extending to top surfaces of the STI regions 68, thereby blocking the epitaxial growth. In some embodiments, the first spacers 81 may cover portions of the sidewalls of the nanostructures 55, further blocking the epitaxial growth. In some embodiments, the spacer etch used to form the first spacers 81 may be adjusted to remove the spacer material, allowing the epitaxial source/drain regions 92 to extend to the surfaces of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
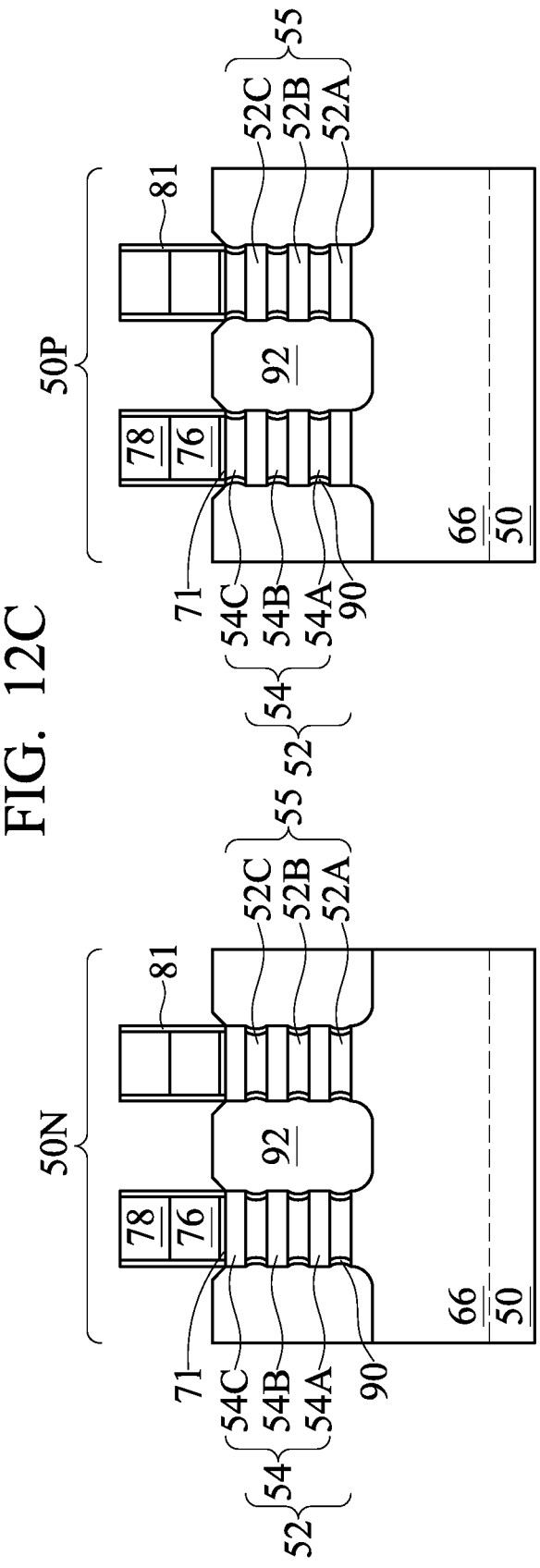

FIG. 12D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 13A:
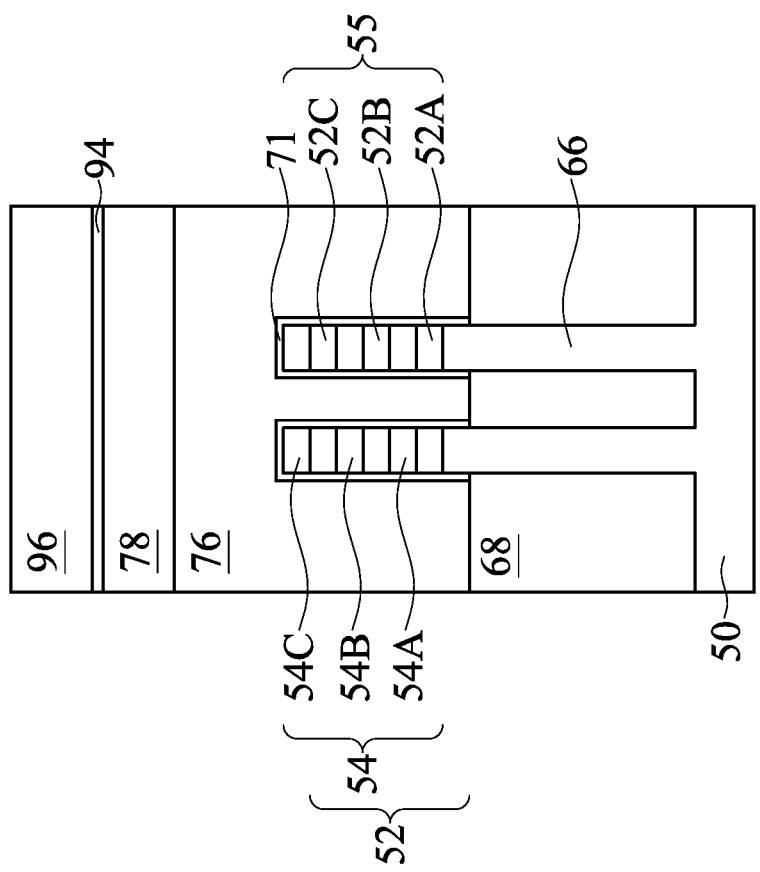
Figure 13B:
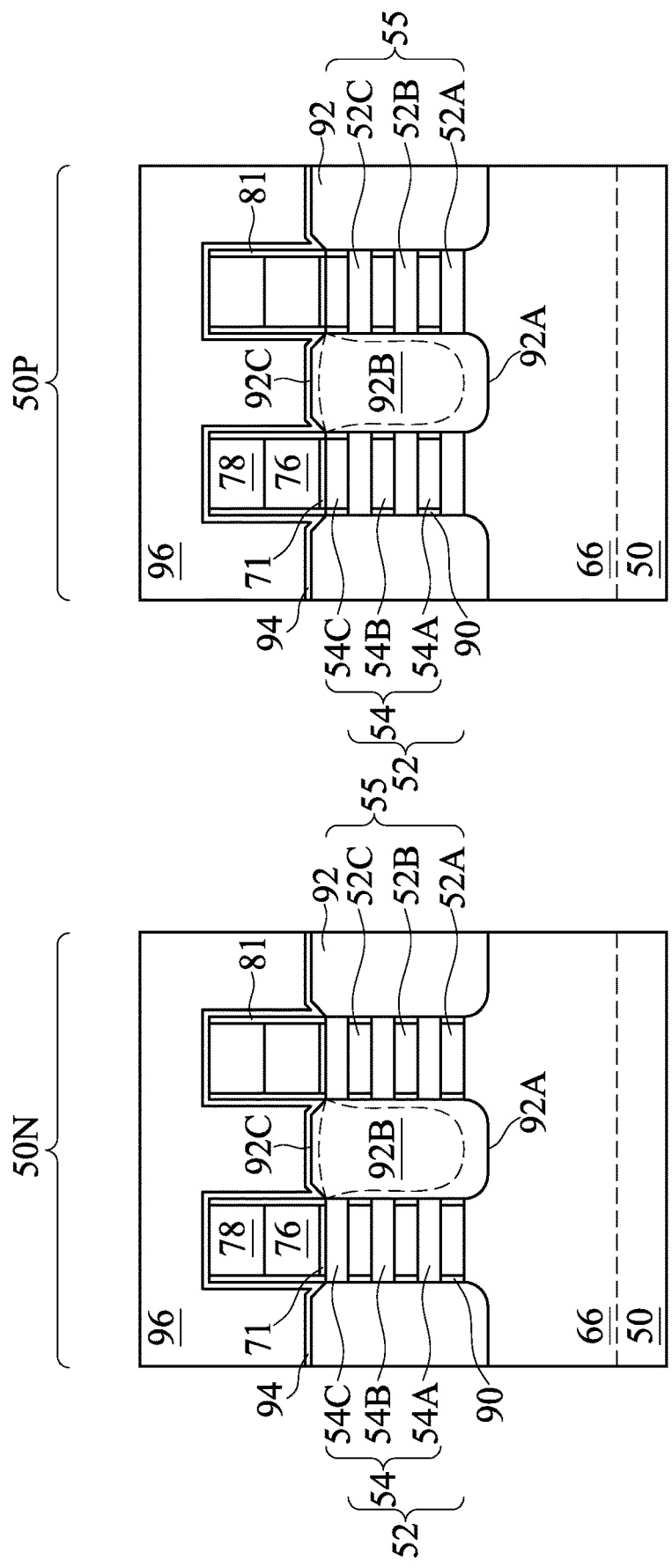
Figure 13C:
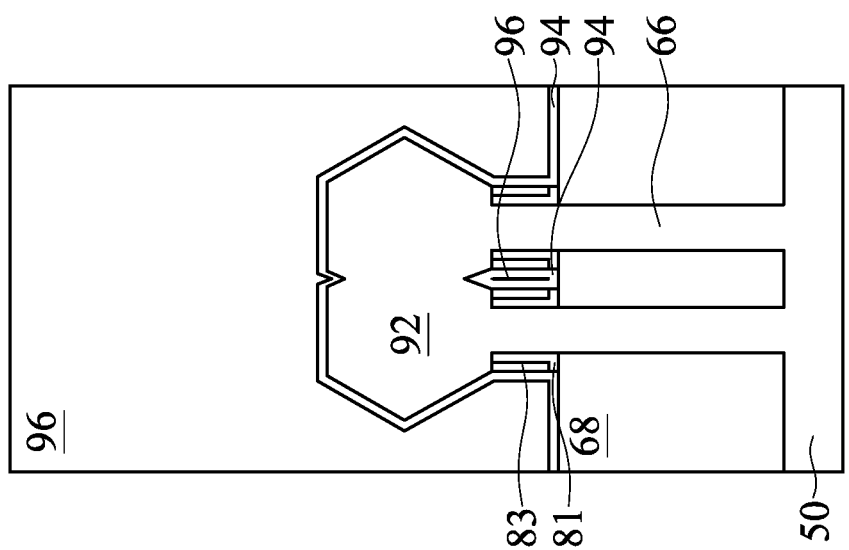

In FIGS. 13A through 13C, a contact etch stop layer (CESL) 94 and a first interlayer dielectric (ILD) 96 are deposited over the epitaxial source/drain regions 92, the dummy gate structures, the first spacers 81, and the STI regions 68. The CESL 94 may comprise a dielectric material, such as, silicon nitride, silicon oxide, silicon oxynitride, or the like, having a different etch rate than the material of the overlying first ILD 96. The CESL 94 may be deposited by ALD, CVD, or the like. The CESL 94 may be optional and may be omitted in some embodiments. The first ILD 96 may be formed of a dielectric material, and may be deposited by any suitable method, such as CVD, plasma-enhanced CVD (PECVD), or FCVD. Suitable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 14A:
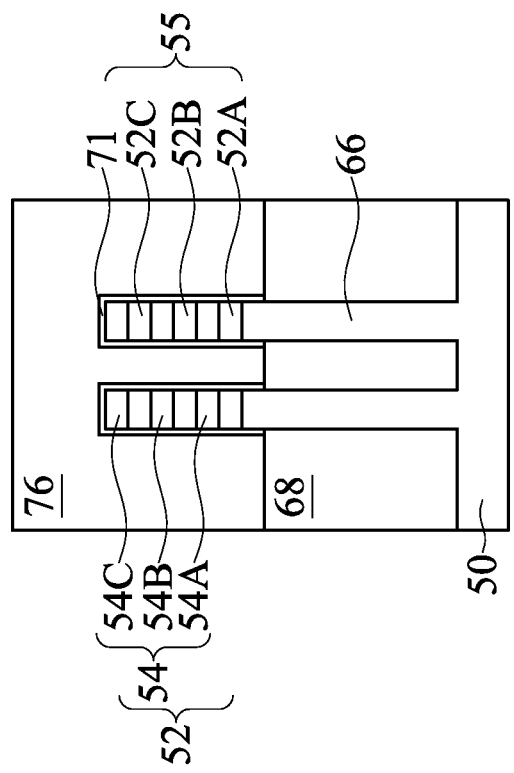
Figure 14B:
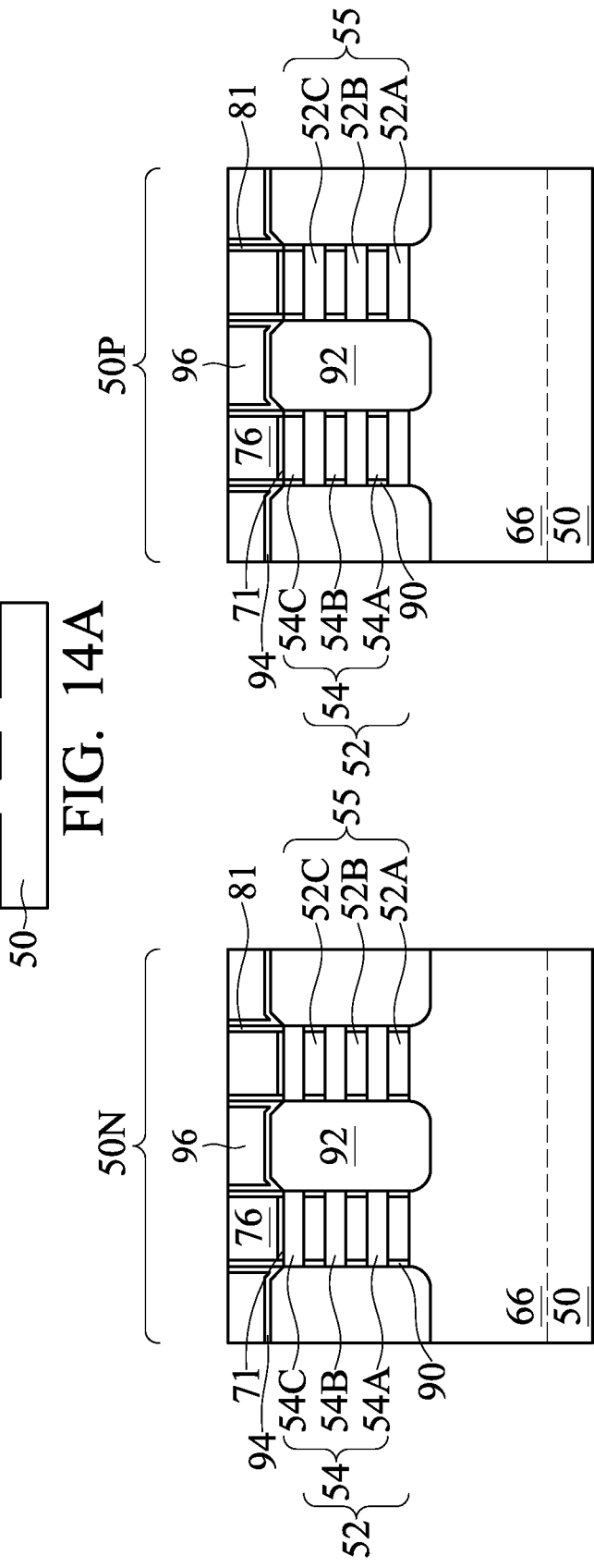

In FIGS. 14A and 14B, a planarization process, such as a CMP, is performed to level top surfaces of the first ILD 96 with top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the CESL 94, and the first ILD 96 are level with one another (within process variations). Accordingly, the top surfaces of the dummy gates 76 are exposed through the first ILD 96 and the CESL 94. In some embodiments, the masks 78 may remain, in which case the planarization process levels the top surfaces of the first ILD 96 and the CESL 94 with top surfaces of the masks 78 and the first spacers 81.

Figure 15A:
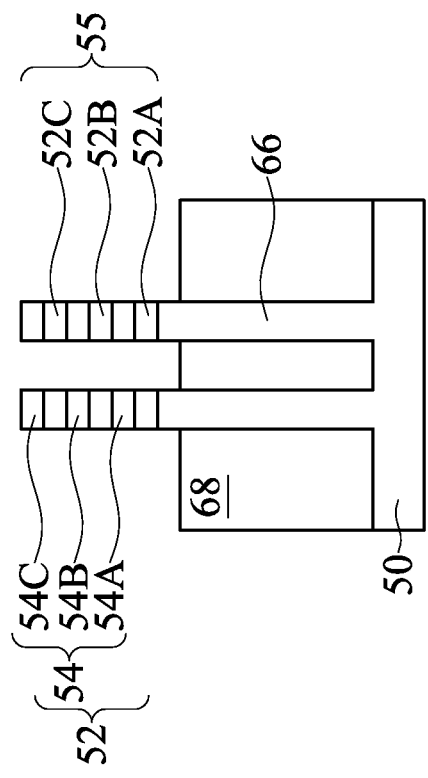
Figure 15B:
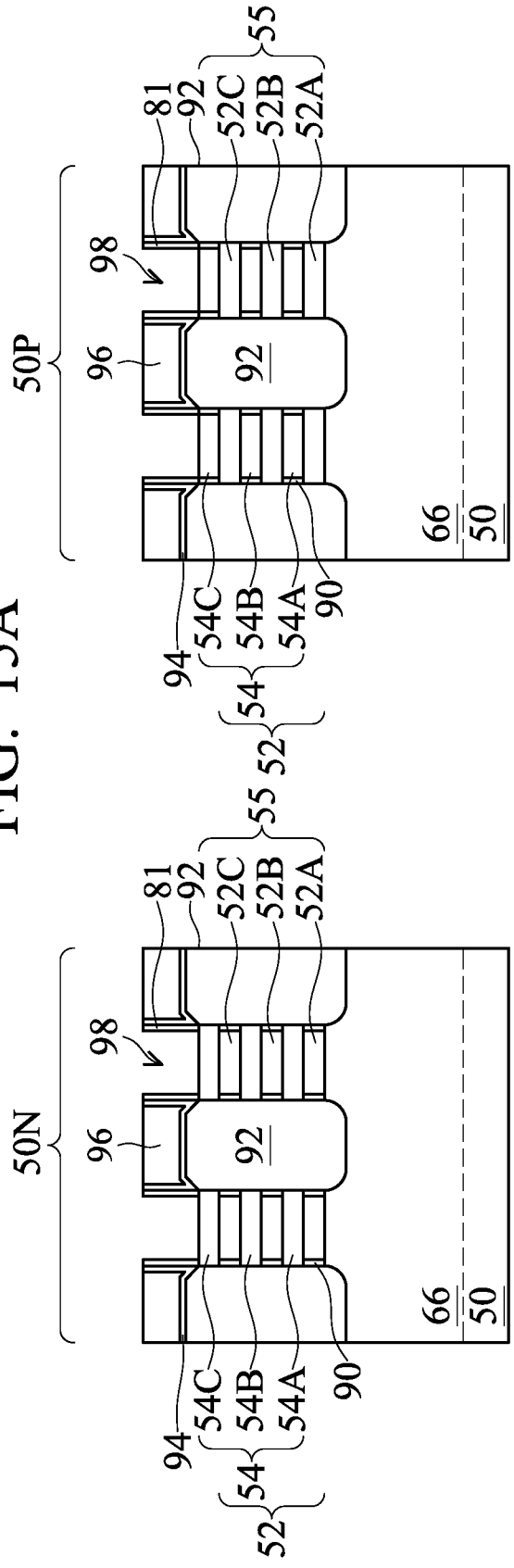

In FIGS. 15A and 15B, the dummy gates 76, the dummy gate dielectrics 71, and the masks 78, if present, are removed, forming second recesses 98. In some embodiments, the dummy gates 76 and the dummy gate dielectrics 71 are removed by one or more etch processes, such as anisotropic dry etch processes. The etch processes may include a dry etch process using reaction gas(es) that selectively etch the dummy gates 76 (at a faster rate than the first ILD 96, the CESL 94, or the first spacers 81). Each of the second recess 98 exposes and/or overlies portions of nanostructures 55, which act as channel regions in subsequently completed nanostructure FETs. The portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16A:
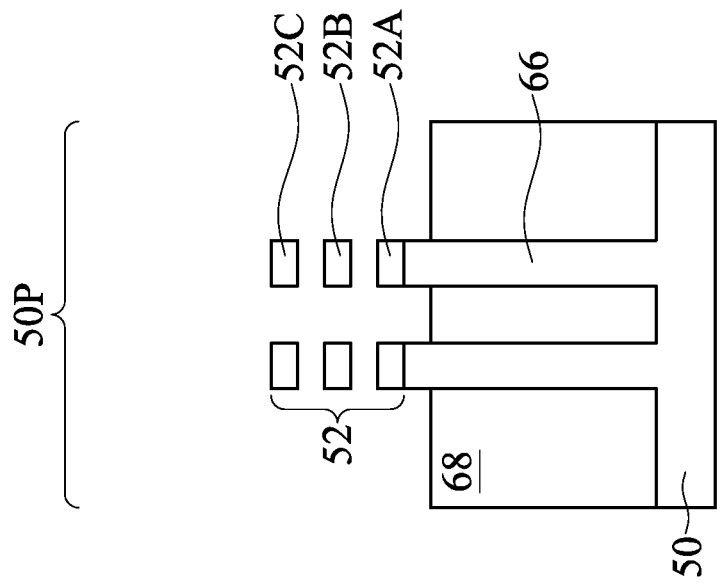
Figure 16A:
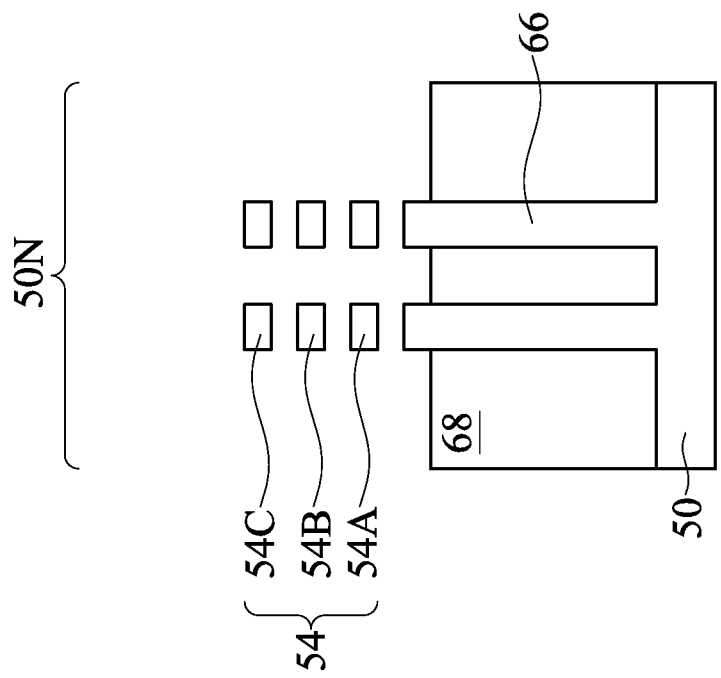
Figure 16B:
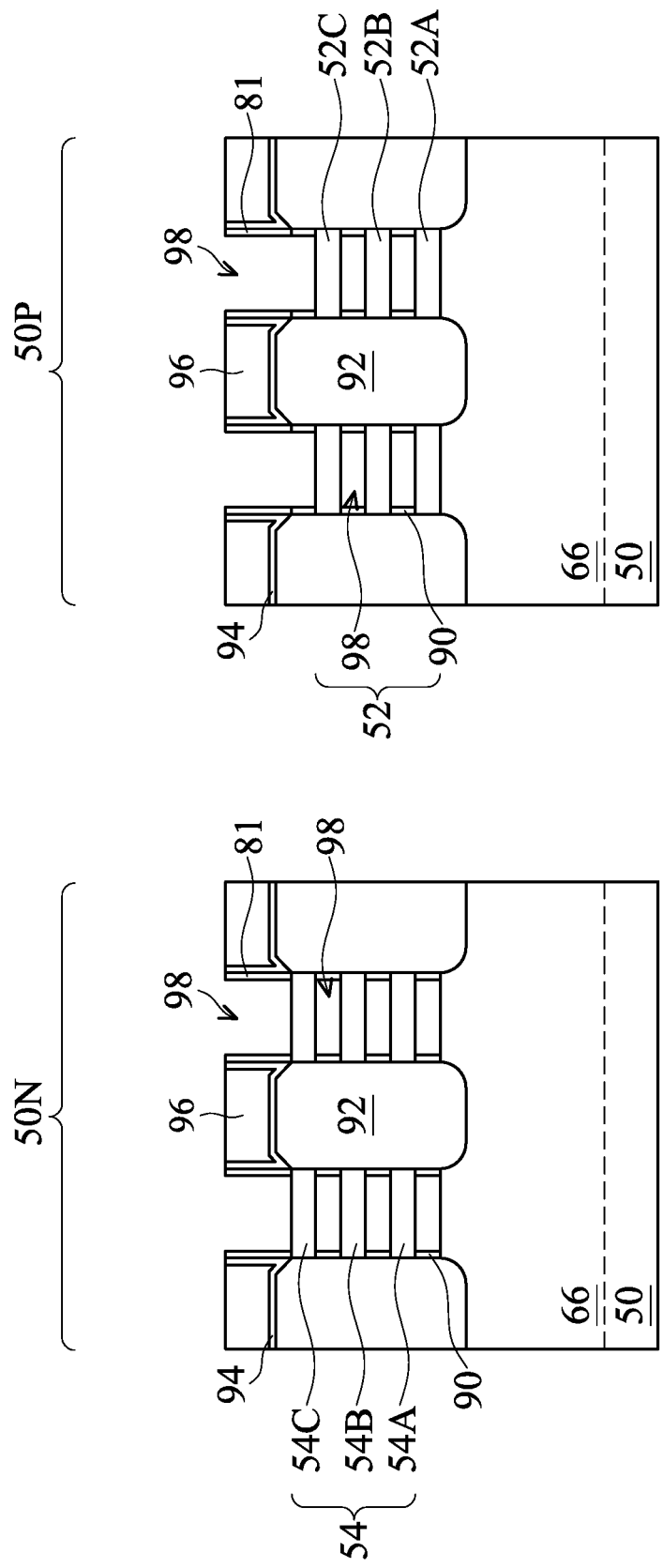

In FIGS. 16A and 16B, the first nanostructures 52 in the n-type region 50N and the second nanostructures 54 in the p-type region 50P are removed extending the second recesses 98. The first nanostructures 52 may be removed by forming a mask (not separately illustrated) over the p-type region 50P and performing an isotropic etching process, such as wet etching or the like, using etchants which are selective to the materials of the first nanostructures 52. The second nanostructures 54, the fins 66, the substrate 50, the STI regions 68, the first ILD 96, and the CESL 94 remain relatively un-etched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide (NH$_4$OH), or the like may be used to remove the first nanostructures 52 in the n-type region 50N.

The second nanostructures 54 in the p-type region 50P may be removed by forming a mask (not separately illustrated) over the n-type region 50N and performing an isotropic etching process such as wet etching or the like using etchants which are selective to the materials of the second nanostructures 54. The first nanostructures 52, the fins 66, the substrate 50, the STI regions 68, the first ILD 96, and the CESL 94 remain relatively un-etched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously. For example, the first nanostructures 52 in both the n-type region 50N and the p-type region 50P may be removed, or the second nanostructures 54 in both the n-type region 50N and the p-type region 50P may be removed. In such embodiments, channel regions of n-type nanostructure FETs and p-type nanostructure FETS may have a same material composition, such as silicon, silicon germanium, or the like. FIGS. 22A through 22C illustrate a structure resulting from such embodiments where the channel regions in both the p-type region 50P and the n-type region 50N are provided by the second nanostructures 54 and comprise silicon, for example.

Figure 17A:
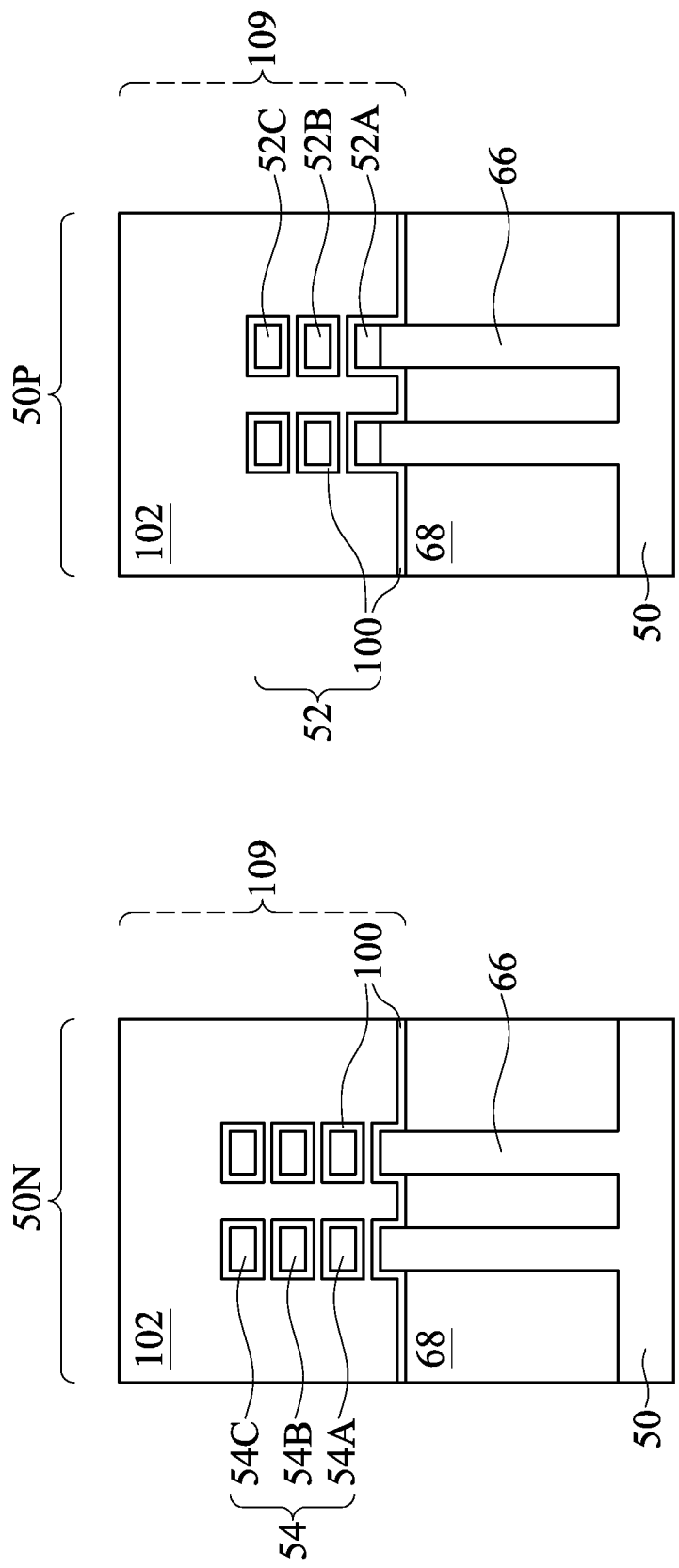
Figure 17B:
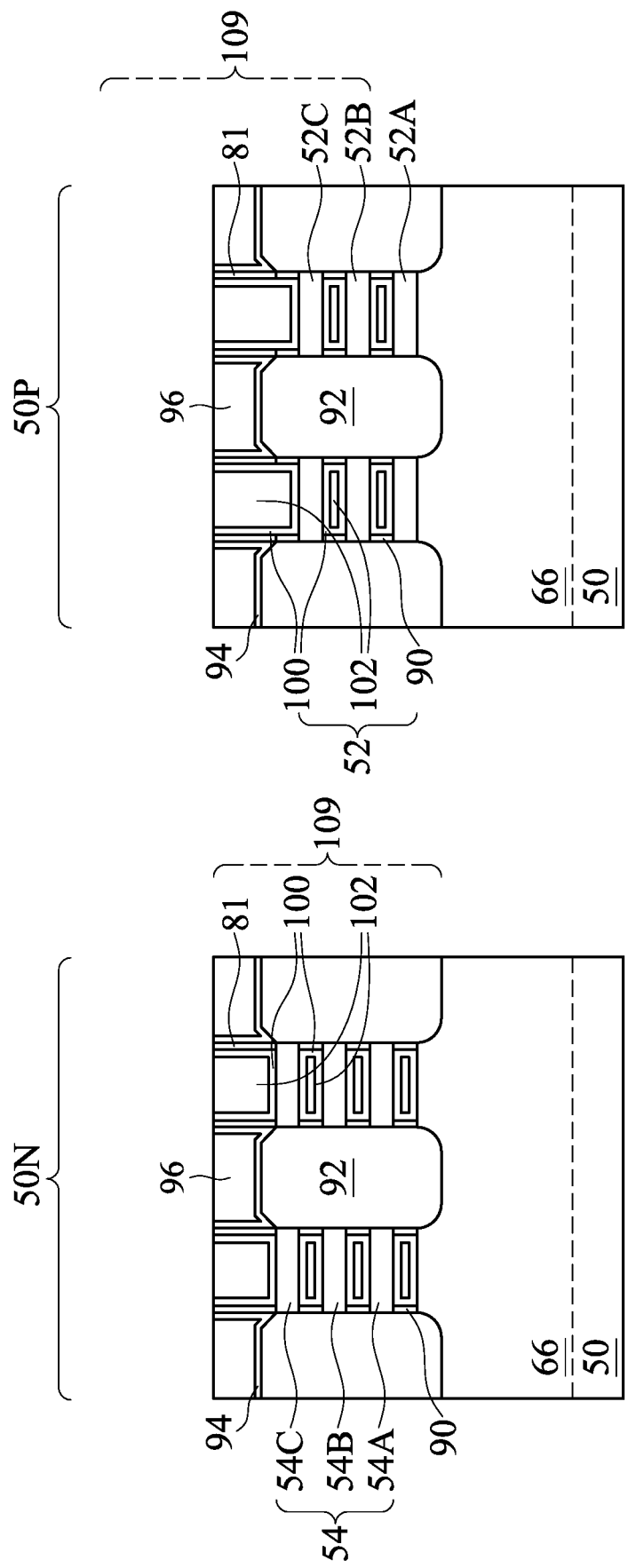

In FIGS. 17A and 17B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the fins 66 and on top surfaces, sidewalls, and bottom surfaces of the second nanostructures 54. In the p-type region 50P, the gate dielectric layers 100 may be formed on top surfaces and sidewalls of the fins 66, on top surfaces and sidewalls of the first nanostructures 52A, and on top surfaces, sidewalls, and bottom surfaces of the first nanostructures 52B and 52C. The gate dielectric layers 100 may also be deposited on top surfaces of the first ILD 96, the CESL 94, and the STI regions 58; on top surfaces and sidewalls of the first spacers 81; and on sidewalls of the first inner spacers 90.

In some embodiments, the gate dielectric layers 100 comprise one or more dielectric layers, such as an oxide, a metal oxide, the like, or combinations thereof. For example, the gate dielectric layers 100 may comprise a silicon oxide layer and a metal oxide layer over the silicon oxide layer. In some embodiments, the gate dielectric layers 100 include a high-k dielectric material, and the gate dielectric layers 100 may have a k-value greater than about 7.0. The gate dielectric layers 100 may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. Although single-layer gate electrodes 102 are illustrated in FIGS. 17A and 17B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructures 54A and the fins 66. Further, any combination of the layers which make up the gate electrodes 102 may be deposited in the p-type region 50P between adjacent ones of the first nanostructures 52.

The formation of the gate dielectric layers 100 in the n-type region 50N and the p-type region 50P may occur simultaneously, such that the gate dielectric layers 100 in each region are formed from the same materials. In some embodiments, the gate dielectric layers 100 in each region may be formed by distinct processes, such that the gate dielectric layers 100 may be different materials and/or have a different number of layers. The formation of the gate electrodes 102 in the n-type region 50N and the p-type region 50P may occur simultaneously such that the gate electrodes 102 in each region are formed from the same materials. The gate electrodes 102 in each region may be formed by distinct processes, such that the gate electrodes 102 may be different materials and/or have a different number of layers. Various masking steps may be used to mask and expose appropriate regions when using distinct processes.

After the second recesses 98 are filled, a planarization process, such as a CMP, may be performed to remove excess portions of the gate dielectric layers 100 and the material of the gate electrodes 102, which excess portions are over top surfaces of the first ILD 96, the CESL 94, and the first spacers 81. The remaining portions of material of the gate electrodes 102 and the gate dielectric layers 100 form replacement gate structures of the resulting nanostructure FETs. The gate electrodes 102 and the gate dielectric layers 100 may be collectively referred to as "gate structures." The epitaxial source/drain regions 92, the first nanostructures 52 or second nanostructures 54, and the gate structures (including the gate dielectric layers 100 and the gate electrodes 102) may collectively be referred to as transistor structures 109.

Figure 18A:
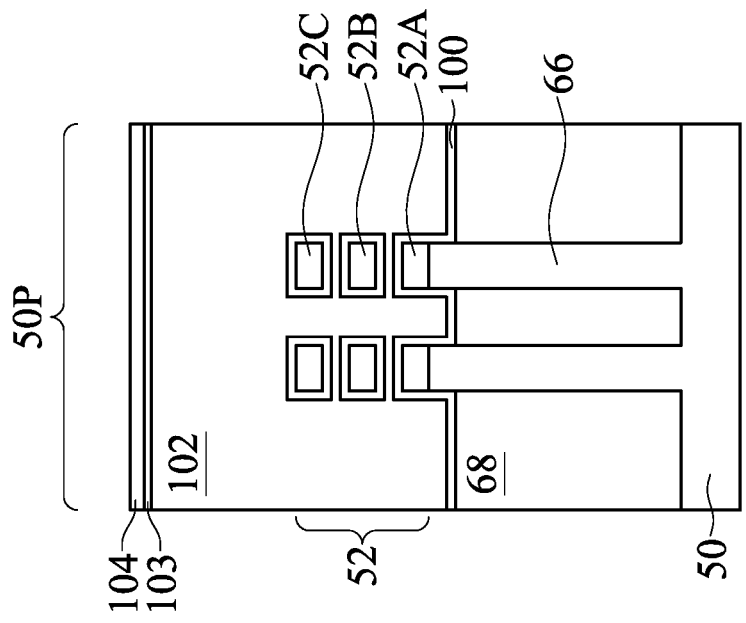
Figure 18A:
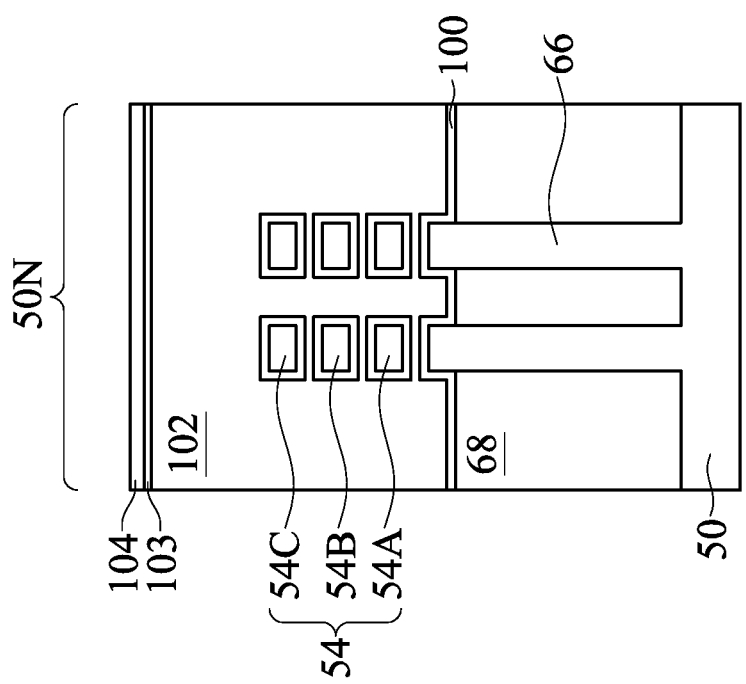
Figure 18B:
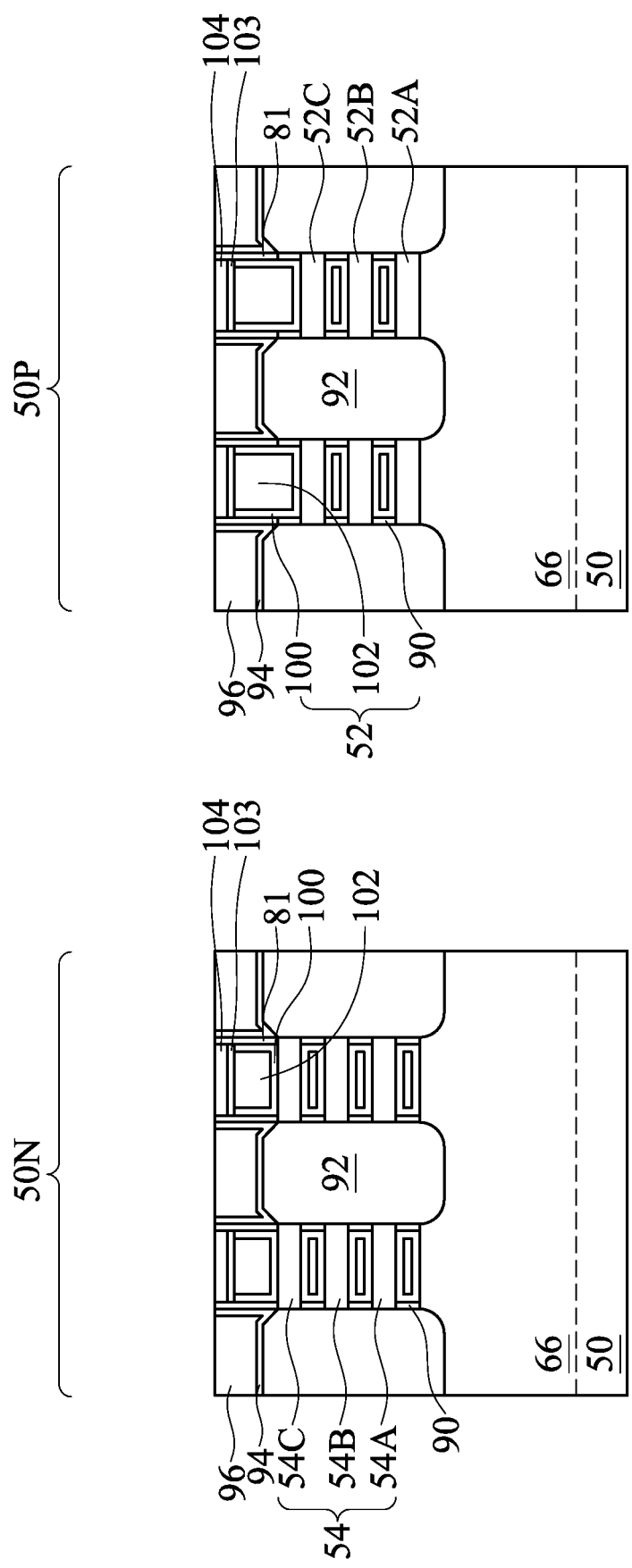

In FIGS. 18A and 18B, the gate structures (including the gate dielectric layers 100 and the corresponding overlying gate electrodes 102) are recessed, so that recesses are formed directly over the gate structures and between opposing portions of first spacers 81. An etch stop layer 103 may be deposited over the recessed gate structures. The etch stop layer 103 may include a conductive material, such as tungsten, ruthenium, cobalt, copper, molybdenum, nickel, combinations thereof, or the like. The etch stop layer 103 may have an etch rate different from that of a subsequently formed gate mask. The etch stop layer 103 may be deposited by ALD, CVD, PVD, or the like. In some embodiments, the etch stop layer 103 is formed of tungsten, such as fluorine-free tungsten (FFW), which is deposited by a selective deposition process, such as a selective CVD process. Because the etch stop layer 103 is formed of a conductive material, it can act to stop etching, and can also be used to tune the contact resistance to the gate structures. In some embodiments, the etch stop layer 103 may include a dielectric material, such as silicon nitride, silicon oxide, silicon oxynitride, or the like.

A gate mask 104 comprising one or more layers of dielectric material, such as silicon nitride, silicon oxynitride, or the like, is deposited over the etch stop layer 103 and fills the remainder of the recess. The deposition of the gate mask 104 may be followed by a planarization process to remove excess portions of the dielectric material, such as portions of the gate mask 104 extending over the first ILD 96, the CESL 94, and the first spacers 81. Subsequently formed gate contacts (such as the gate contacts 118 and the butted contacts 120, discussed below with respect to FIGS. 21A through 22C) penetrate through the gate mask 104 to contact top surfaces of the recessed etch stop layer 103.

Figure 19A:
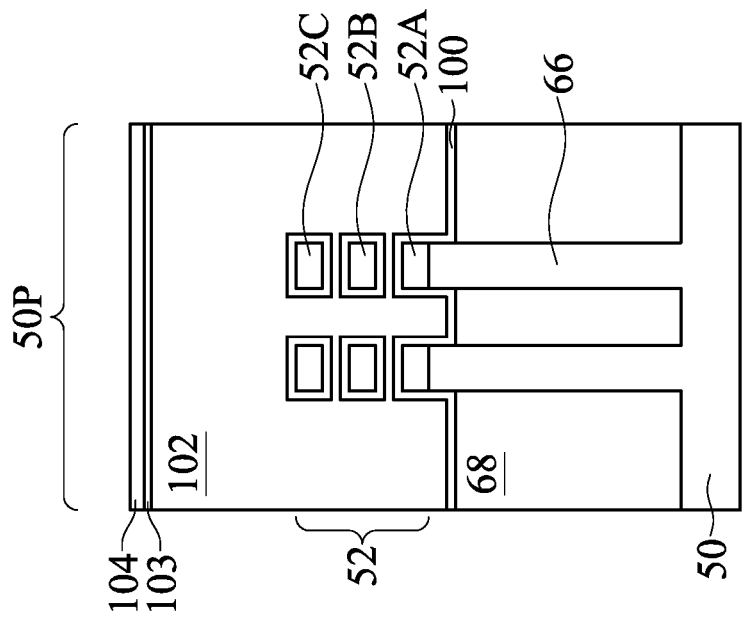
Figure 19A:
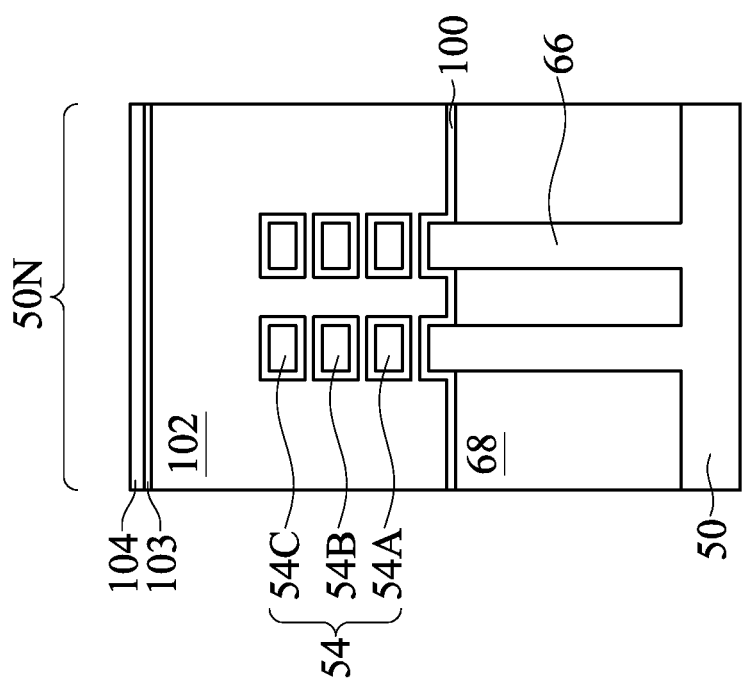
Figure 19B:
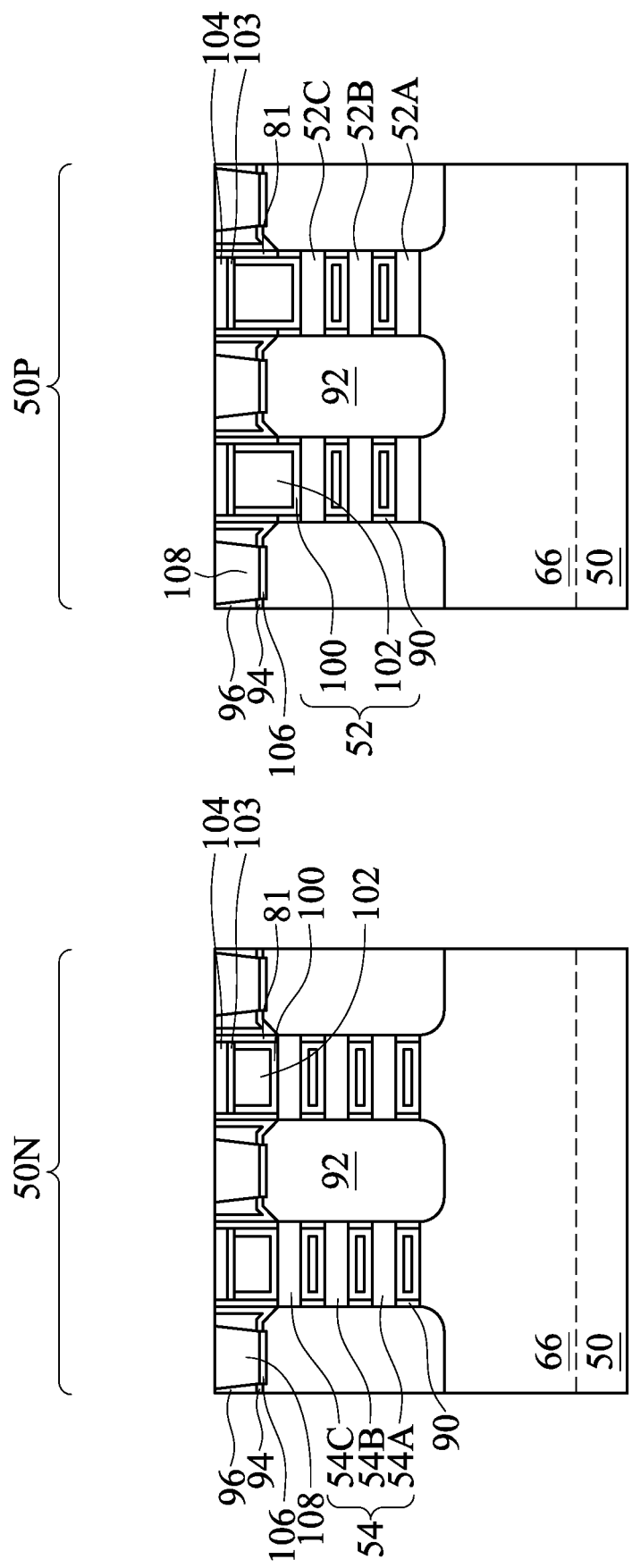
Figure 19C:
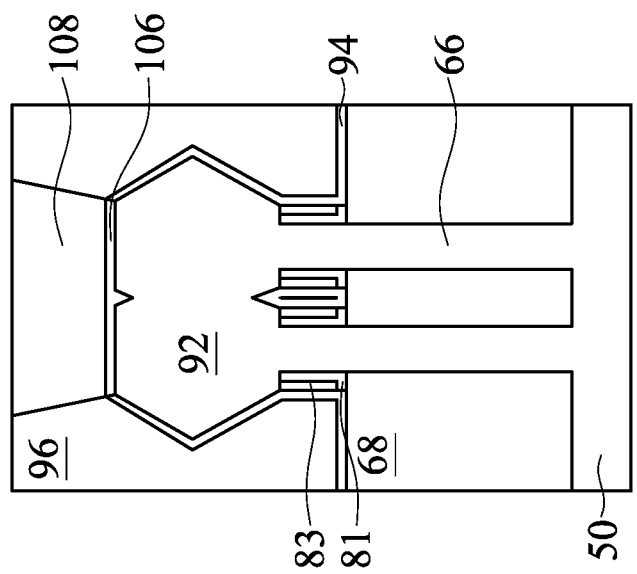

In FIGS. 19A through 19C, silicide regions 106 and first source/drain contacts 108 are formed through the first ILD 96 and the CESL 94. The first ILD 96 and the CESL 94 may be etched to form recesses exposing surfaces of the epitaxial source/drain regions 92. The recesses may be formed by etching using anisotropic etch processes, such as RIE, NBE, or the like. In some embodiments, the recesses may be etched through the first ILD 96 using a first etch process and may then be etched through the CESL 94 using a second etch process. A mask, such as a photoresist, may be formed and patterned over the first ILD 96 to mask portions of the first ILD 96, the CESL 94, the first spacers 81, and the gate mask 104 from the first etch process and the second etch process. In some embodiments, the etch processes may over-etch, and therefore, the recesses may extend into the epitaxial source/drain regions 92. Bottom surfaces of the recesses may be level with (e.g., at a same level, or having a same distance from the substrate 50), or lower than (e.g., closer to the substrate 50) top surfaces of the epitaxial source/drain regions 92.

After the recesses are formed, the silicide regions 106 may be formed over the epitaxial source/drain regions 92. In some embodiments, the silicide regions 106 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, over the exposed portions of the epitaxial source/drain regions 92. A thermal anneal process may then be performed to form the silicide regions 106. Un-reacted portions of the deposited metal are removed by an etch process. Although referred to as silicide regions, the silicide regions 106 may be replaced by germanide regions, silicon germanide regions (e.g., regions comprising silicide and germanide), or the like. In an embodiment, the silicide regions 106 comprise TiSi, and have a thickness ranging from about 2 nm to about 10 nm.

The first source/drain contacts 108 are then formed over the silicide regions 106 and filling the recesses. The first source/drain contacts 108 may each comprise one or more layers, such as barrier layers, diffusion layers, and fill materials. For example, in some embodiments, the first source/drain contacts 108 each include a barrier layer and a conductive material over the barrier layer. The conductive material of each of the first source/drain contacts 108 may be electrically coupled to the underlying epitaxial source/drain regions 92 through the silicide regions 106. The barrier layer may include titanium, titanium nitride, tantalum, tantalum nitride, or the like. The conductive material may be cobalt (Co), ruthenium (Ru), titanium (Ti), tungsten (W), copper (Cu), a copper alloy, silver (Ag), gold (Au), aluminum (Al), nickel (Ni), or the like. After the first source/drain contacts 108 are formed, a planarization process, such as a CMP, may be performed to remove excess material from surfaces of the first ILD 96, the CESL 94, the first spacers 81, and the gate mask 104.

Figure 20A:
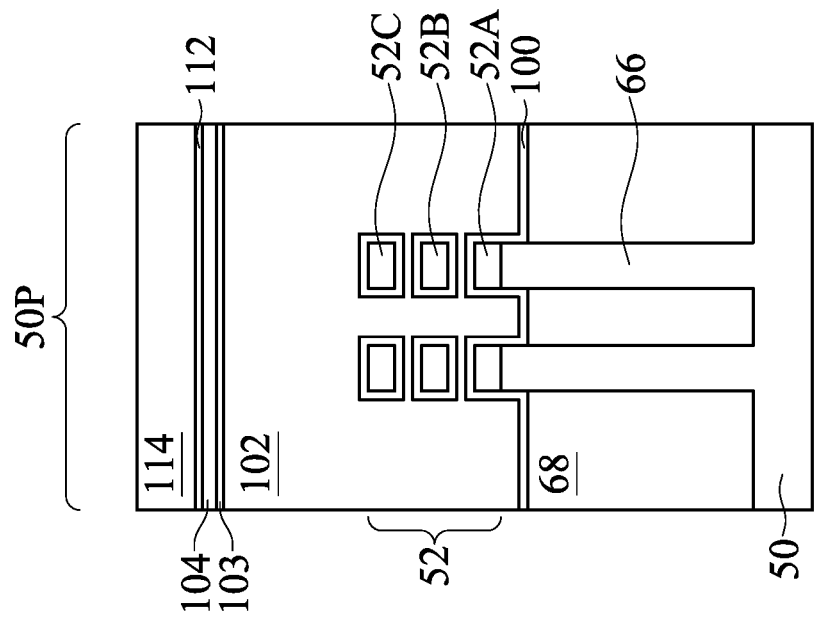
Figure 20A:
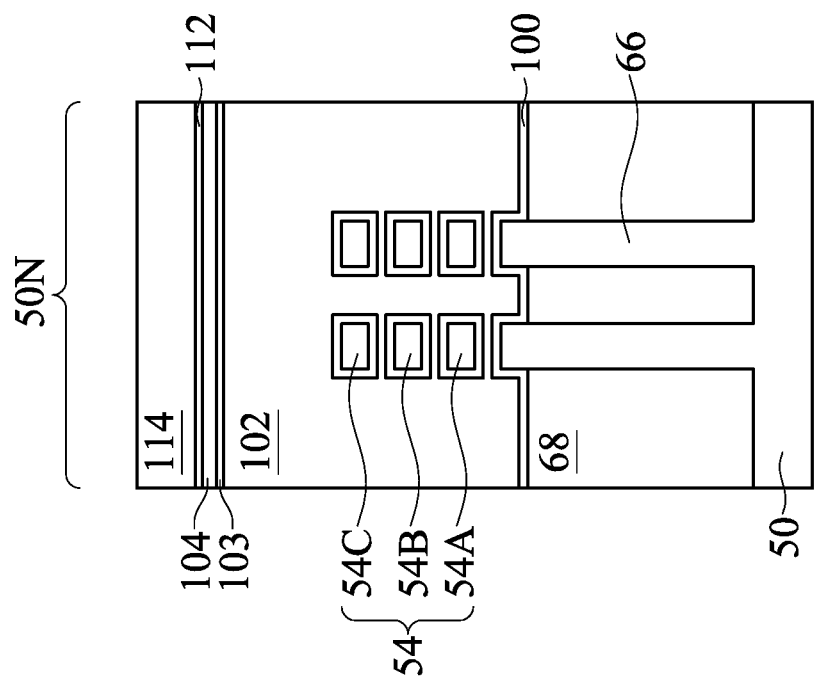
Figure 20B:
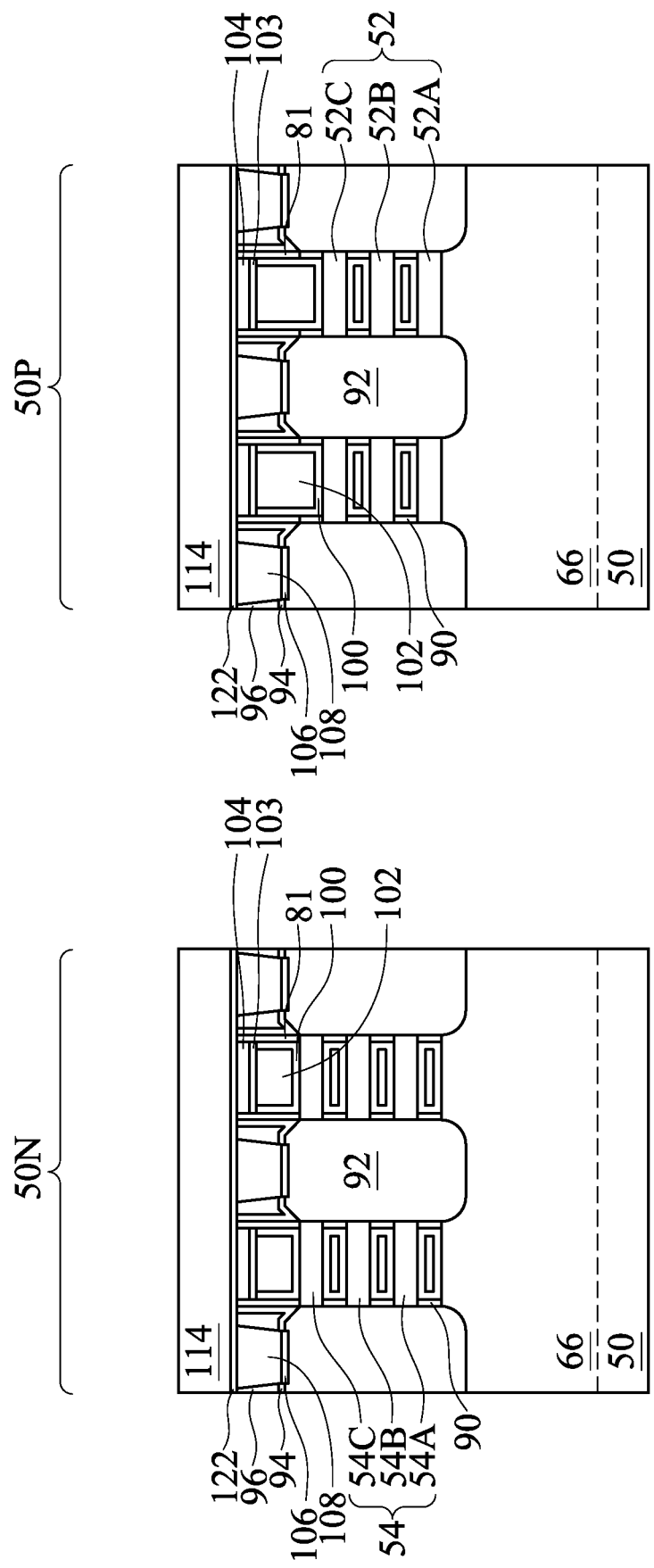
Figure 20C:
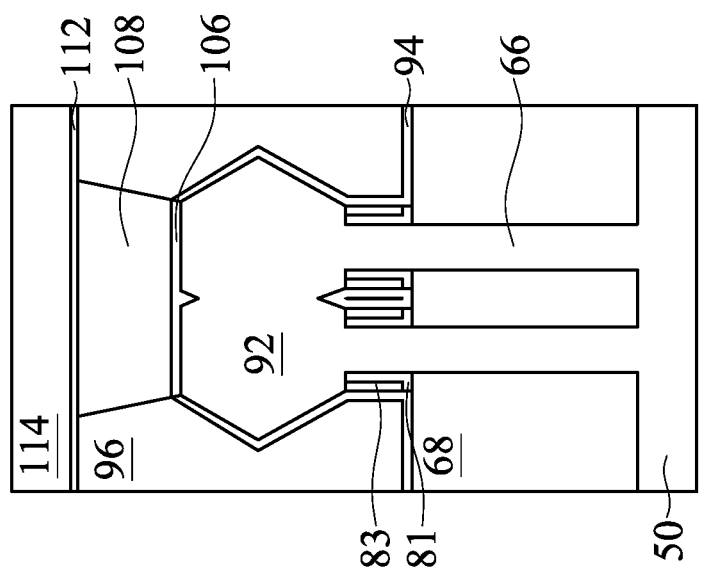

In FIGS. 20A through 20C, a second CESL 112 and a second ILD 114 are formed over the structures illustrated in FIGS. 19A through 19C, respectively. The second CESL 112 may comprise a dielectric material, such as, silicon nitride, silicon oxide, silicon oxynitride, or the like, having a different etch rate than the material of the overlying second ILD 114. The second CESL 112 may be deposited by a conformal deposition process, such as ALD, CVD, or the like. The second ILD 114 may be formed of a dielectric material, and may be deposited by any suitable method, such as CVD, PECVD, or FCVD. Suitable dielectric materials may include PSG, BSG, BPSG, USG, or the like. Other insulation materials formed by any acceptable process may be used.

Figure 21A:
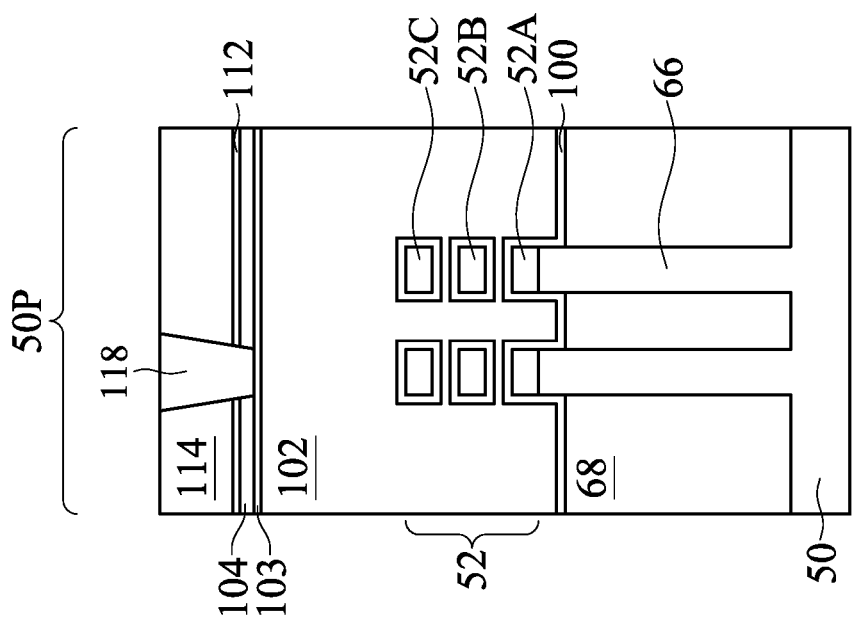
Figure 21A:
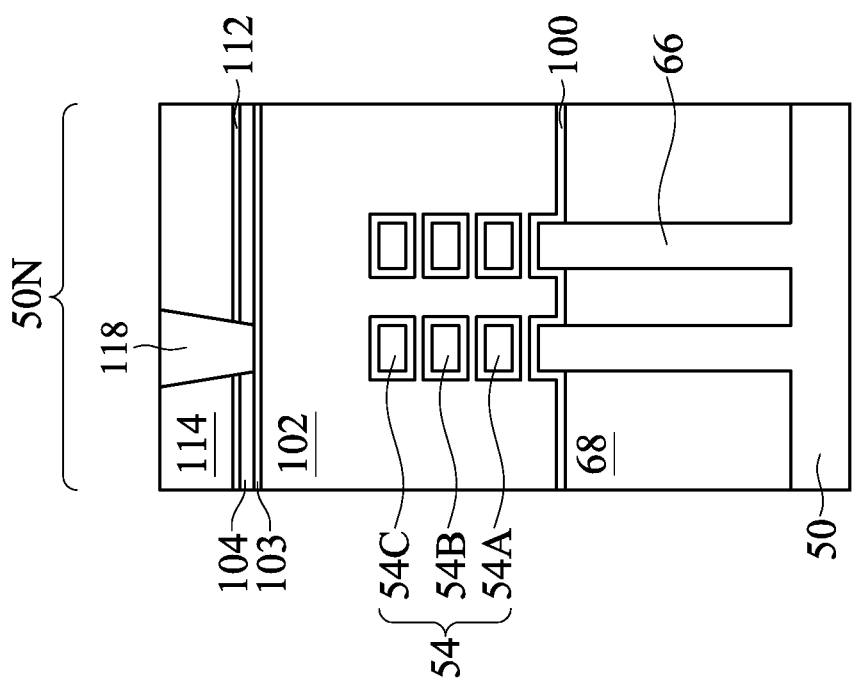
Figure 21B:
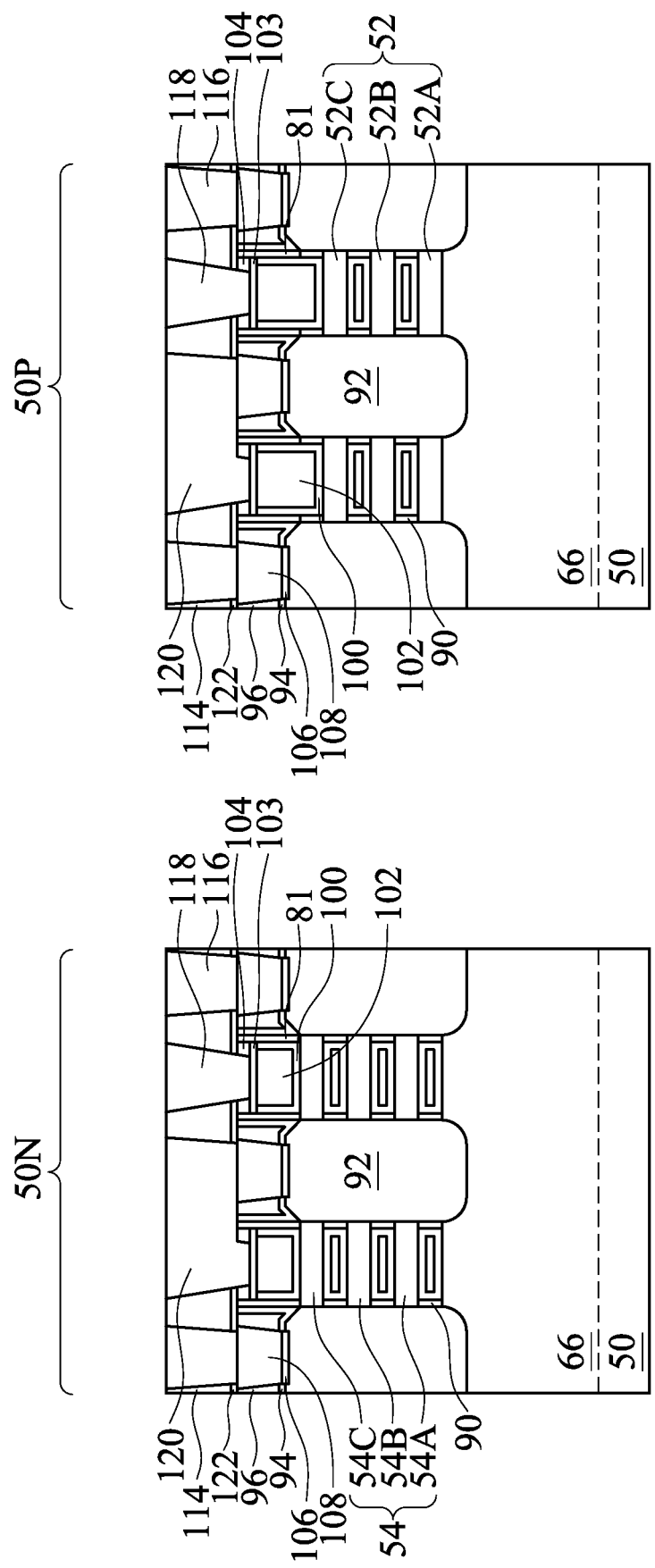
Figure 21C:
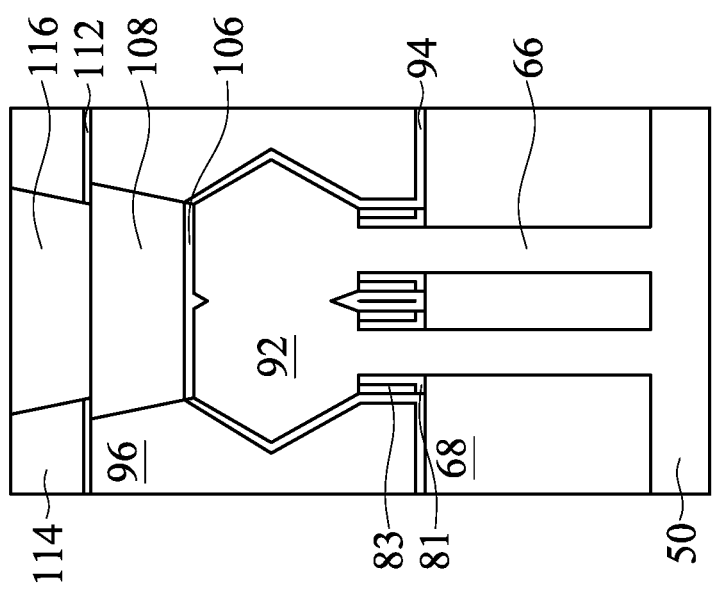

In FIGS. 21A through 21C, second source/drain contacts 116, gate contacts 118, and/or butted contacts 120 (each of which may also be referred to as contact plugs) are formed extending through the second ILD 114 and the second CESL 112. Openings for the second source/drain contacts 116 are formed through the second ILD 114 and the second CESL 112. Openings for the gate contacts 118 are formed through the second ILD 114, the second CESL 112, and the gate mask 104. Openings for the butted contacts 120 are formed through the second ILD 114, the second CESL 112, and the gate mask 104. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 114. The remaining liner and conductive material form the second source/drain contacts 116, the gate contacts 118, and the butted contacts 120 in the openings. The butted contacts 120 may be useful for forming circuitry in the various regions, such as in an SRAM cell.

The second source/drain contacts 116 are electrically coupled to the epitaxial source/drain regions 92 through the first source/drain contacts 108 and the silicide regions 106. The gate contacts 118 are electrically coupled to the gate electrodes 102 through the etch stop layer 103. The butted contacts 120 are electrically coupled to the epitaxial source/drain regions 92 through the first source/drain contacts 108 and the silicide regions 106 and to the gate electrodes 102 through the etch stop layer 103. The second source/drain contacts 116, the gate contacts 118, and the butted contacts 120 may be formed in different processes, or may be formed in the same process. Although shown as being formed in the same cross-sections, it should be appreciated that each of the second source/drain contacts 116 and the gate contacts 118 may be formed in different cross-sections, which may avoid shorting of the contacts.

FIGS. 22A through 22C illustrate cross-sectional views of a device according to some alternative embodiments. FIG. 22A illustrates reference cross-section A-A' illustrated in FIG. 1. FIG. 22B illustrates reference cross-section B-B' illustrated in FIG. 1. FIG. 22C illustrates reference cross-section C-C' illustrated in FIG. 1. In FIGS. 22A through 22C, like reference numerals indicate like elements formed by like processes as the structure of FIGS. 21A through 21C. However, in FIGS. 22A through 22C, channel regions in the n-type region 50N and the p-type region 50P comprise a same material. For example, the second nanostructures 54, which comprise silicon, provide channel regions for p-type nanostructure FETs in the p-type region 50P and for n-type nanostructure FETs in the n-type region 50N. The structure of FIGS. 22A through 22C may be formed, for example, by removing the first nanostructures 52 from both the p-type region 50P and the n-type region 50N simultaneously; depositing the gate dielectric layers 100 over top surfaces and side surfaces of the fins 66 and over top surfaces, side surfaces, and bottom surfaces of the second nanostructures 54 in the p-type region 50P and the n-type region 50N; and depositing gate electrodes 102P (e.g., gate electrodes suitable for p-type nanostructure FETs) over the gate dielectric layers 100 in the p-type region 50P and depositing gate electrodes 102N (e.g., gate electrodes suitable for n-type nanostructure FETs) over the gate dielectric layers in the n-type region 50N. Materials of the epitaxial source/drain regions 92 in the n-type region 50N may be different from materials of the epitaxial source/drain regions 92 in the p-type region 50P, as explained above.

Figure 23A:
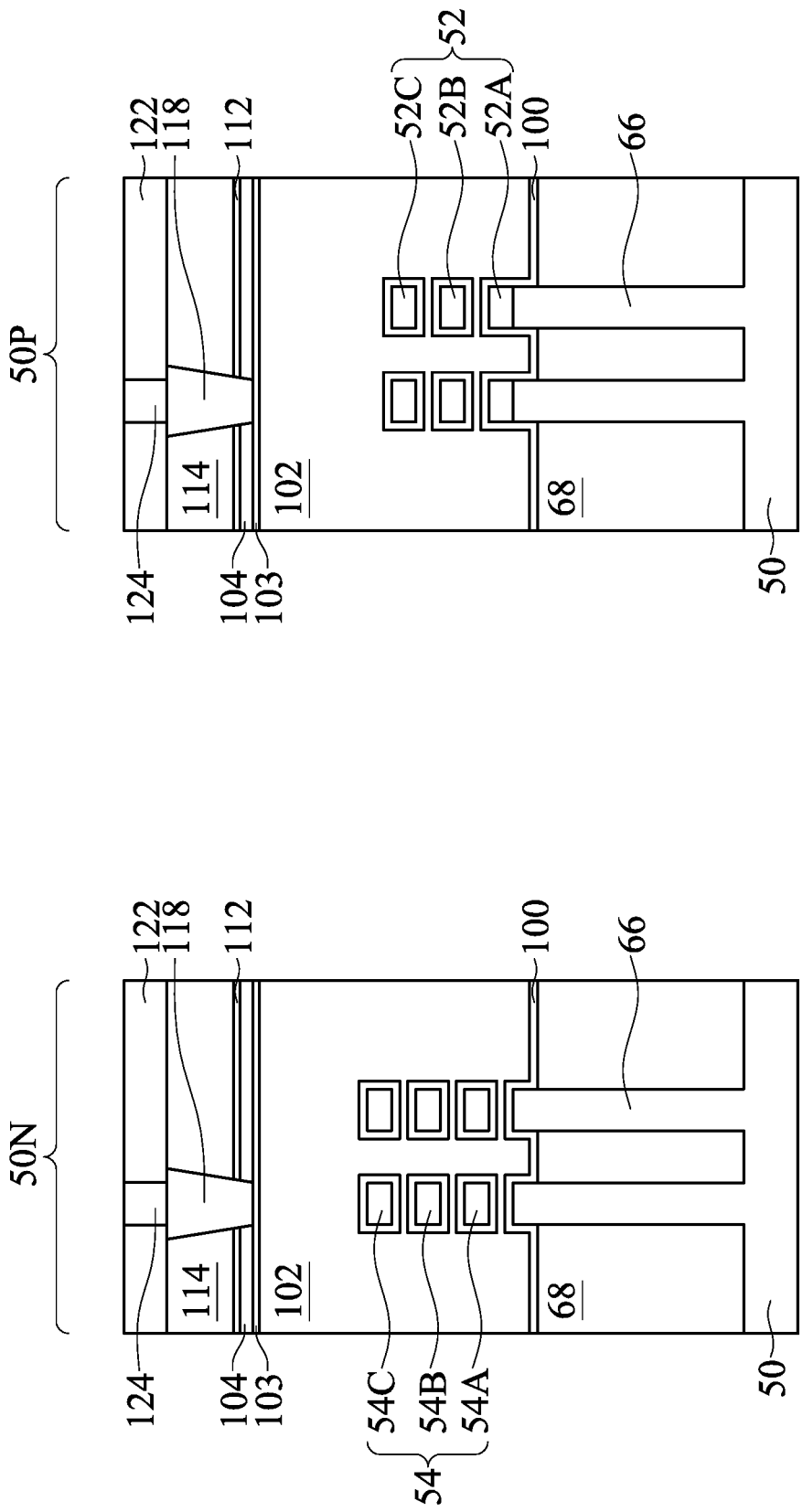
Figure 23B:
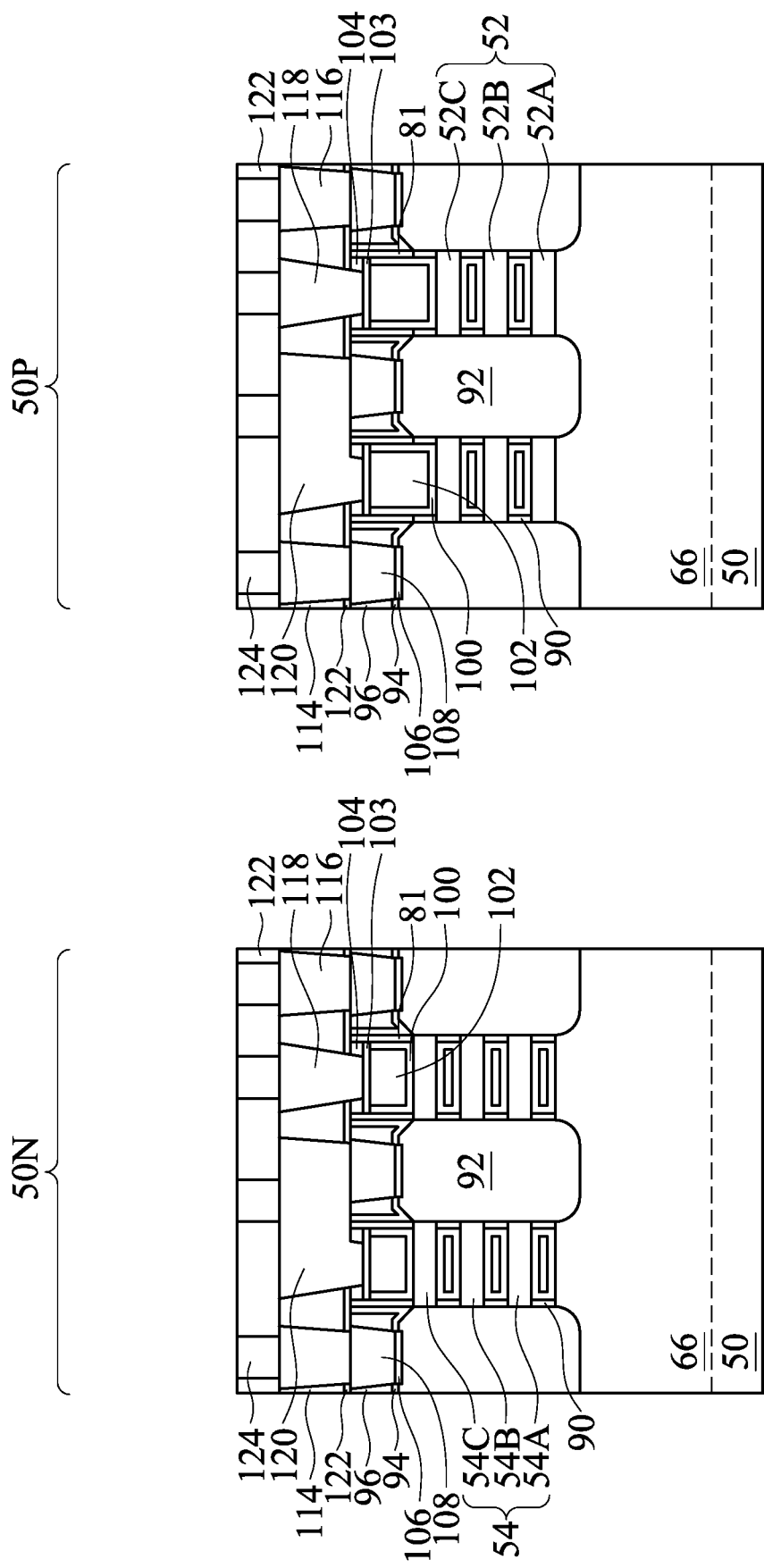

In FIGS. 23A and 23B, a first dielectric layer 122 and first conductive features 124 are formed over the second ILD 114, the second source/drain contacts 116, the gate contacts 118, and the butted contacts 120. The first dielectric layer 122 may comprise a dielectric material, such as a low-k dielectric material, an extra low-k (ELK) dielectric material, or the like. In some embodiments, the first dielectric layer 122 may include silicon carbon nitride (SiCN), silicon oxygen carbide (SiOC), silicon boron nitride (SiBN), silicon boron carbon nitride (SiBCN), boron nitride (BN), combinations or multiple layers thereof, or the like. The first dielectric layer 122 may be deposited using an appropriate process, such as, CVD, ALD, PVD, PECVD, or the like.

The first conductive features 124 may comprise conductive lines. The first conductive features 124 may be formed through any acceptable process, such as, a damascene process, a dual damascene process, or the like. In some embodiments, the first conductive features 124 may be formed using a damascene process in which the first dielectric layer 122 is patterned utilizing a combination of photolithography and etching techniques to form trenches corresponding to the desired pattern of the first conductive features 124. An optional diffusion barrier layer, an optional liner layer, and/or optional adhesion layer may be deposited and the trenches may then be filled with a conductive material. Suitable materials for the diffusion barrier layer include titanium, titanium nitride, titanium oxide, tantalum, tantalum nitride, tantalum oxide, combinations thereof, or the like; suitable materials for the liner layer include cobalt, ruthenium, combinations thereof, or the like; and suitable materials for the conductive material include copper, silver, gold, tungsten, aluminum, cobalt, ruthenium, molybdenum, combinations thereof, or the like. In an embodiment, the first conductive features 124 may be formed by depositing a seed layer of copper or a copper alloy, and filling the trenches by electroplating. A CMP process or the like may be used to remove excess conductive material from a surface of the first dielectric layer 122 and to planarize surfaces of the first dielectric layer 122 and the first conductive features 124 for subsequent processing. The first conductive features 124 may be electrically coupled to the gate structures and/or the epitaxial source/drain regions 92 through the second source/drain contacts 116, the gate contacts 118, and the butted contacts 120.

Figure 24A:
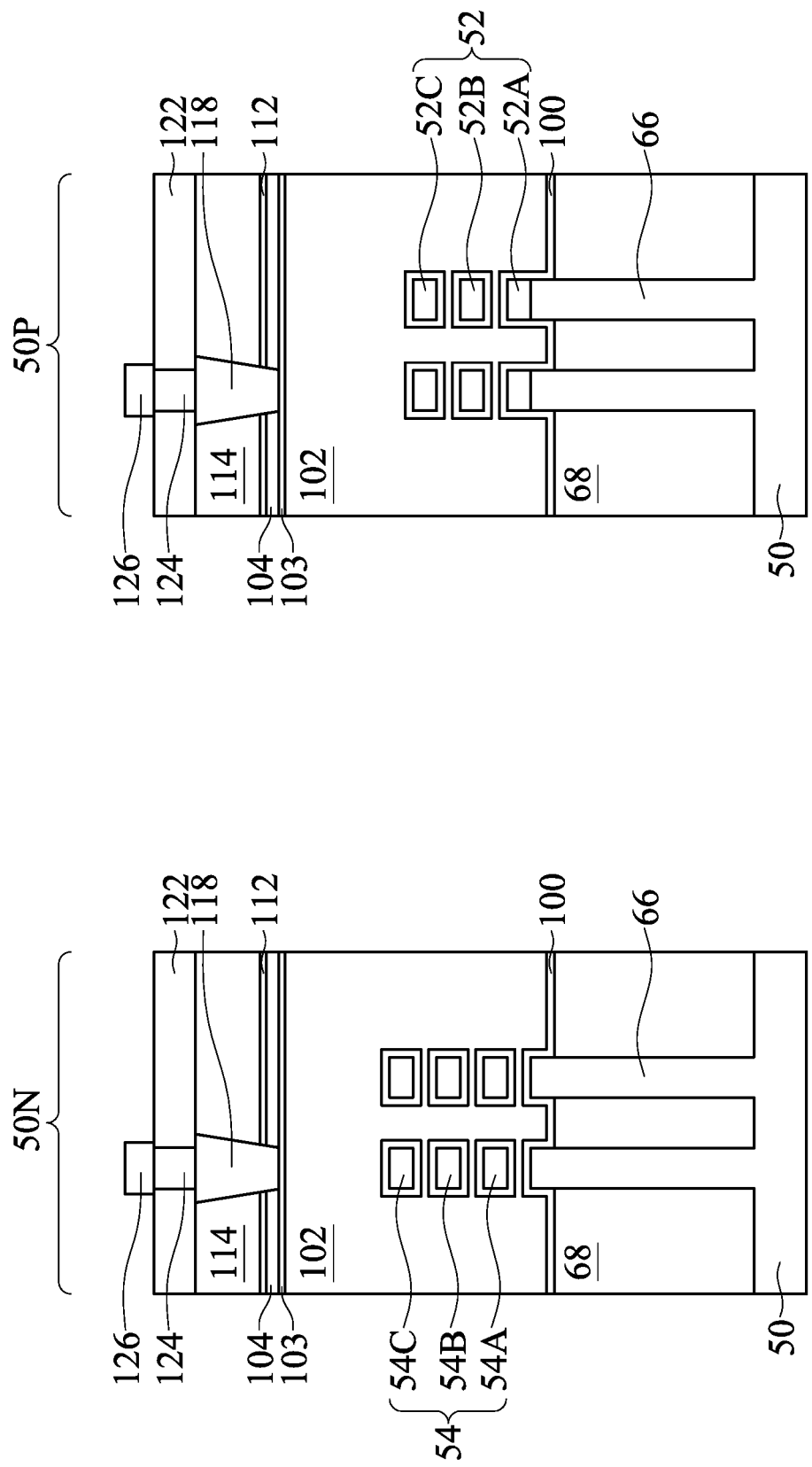
Figure 24B:
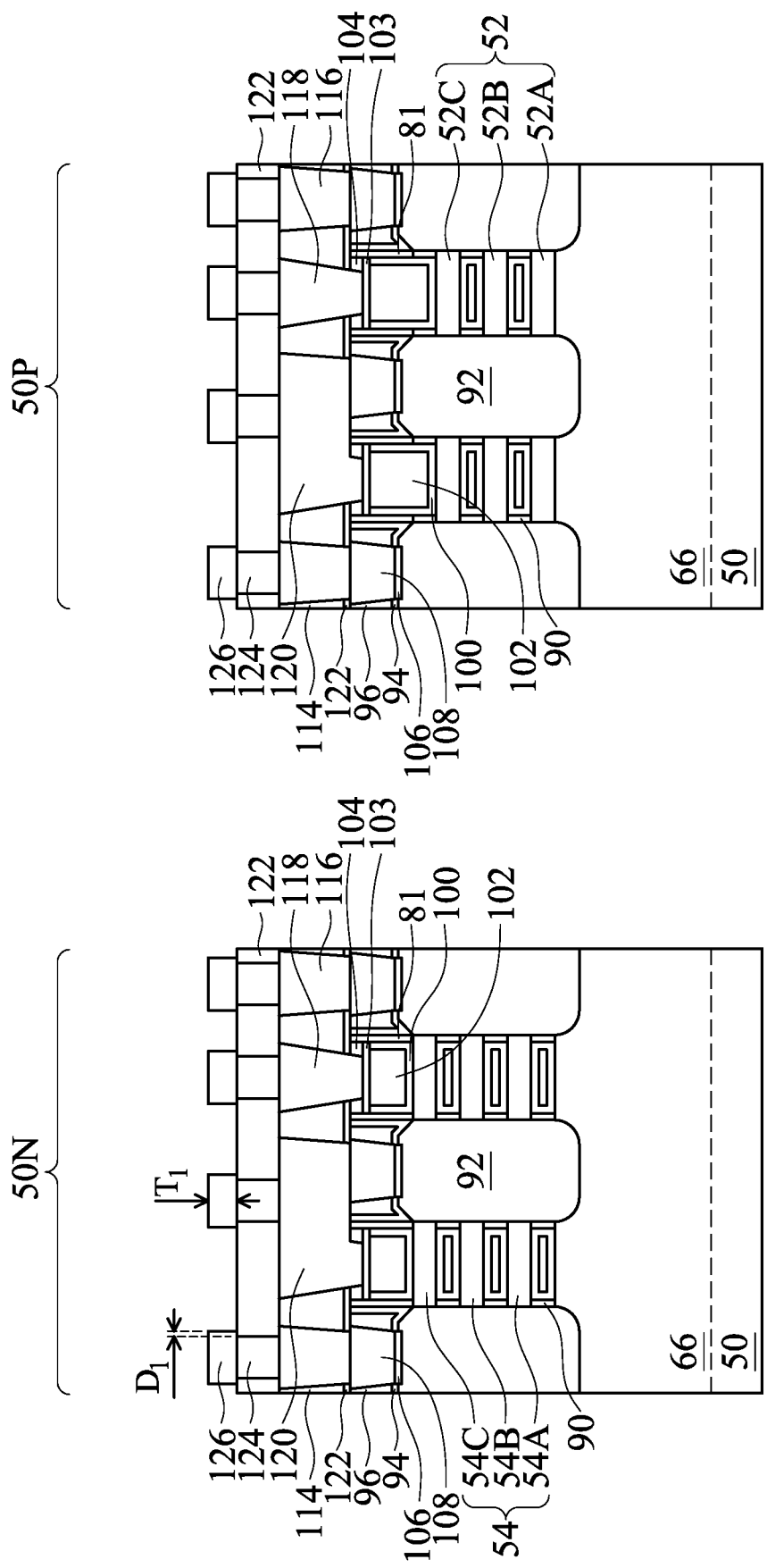

In FIGS. 24A and 24B, a sacrificial material 126 is deposited over the first conductive features 124. In some embodiments, the sacrificial material 126 may be an organic polymer, such as a polyimide (PI), a polyamide, an organosilane, an organophosphonate, or the like. In embodiments in which the sacrificial material 126 comprises a polyimide, the sacrificial material 126 may comprise pyromellitic dianhydride (PMDA, $C_{10}H_2O_6$), 1,6-diaminohexane (hexamethylenediamine, hexane-1,6-diamine, $C_6H_{16}N_2$), combinations thereof, or the like. In embodiments in which the sacrificial material 126 comprises a polyamide, the sacrificial material 126 may comprise ethylenediamine (ethane-1,2-diamine, $C_2H_8N_2$), adipoyl chloride (hexanedioyl dichloride, $C_6H_8Cl_2O_2$), combinations thereof, or the like. In some embodiments, the sacrificial material 126 may comprise dodecylsilane ($C_{12}H_{28}Si$), octadecylphosphonic acid (ODPA, $C_{18}H_{39}O_3P$), or the like. In some embodiments, the sacrificial material 126 may have from 8 carbon atoms to 20 carbon atoms.

The sacrificial material 126 may be deposited by a deposition process that selectively deposits the sacrificial material 126 on metal surfaces of the first conductive features 124, without the sacrificial material 126 being deposited on dielectric surfaces of the first dielectric layer 122. The sacrificial material 126 may be deposited by CVD, PECVD, ALD, plasma-enhanced ALD (PEALD), or the like. The sacrificial material 126 may be deposited to a thickness $T_1$ ranging from about 25 Å to about 45 Å. As illustrated in FIGS. 24A and 24B, the sacrificial material 126 may be selectively deposited on the first conductive features 124, but may expand laterally such that the sacrificial material 126 extends at least partially along surfaces of the first dielectric layer 122. The sacrificial material 126 may extend laterally past sidewalls of the first conductive features 124 a distance $D_1$ ranging from about 0 Å to about 25 Å. The sacrificial material 126 may be deposited in a wet deposition process or a dry deposition process. The sacrificial material 126 may be deposited at a temperature ranging from about 40° C. to about 300° C., for a time ranging from about 30 seconds to about 30 minutes, at a dry pressure ranging from about 1 Torr to about 10 Torr. Providing the sacrificial material 126 with a thickness less than the prescribed range may provide insufficient inhibition to prevent subsequently deposited dielectric materials (such as the second dielectric layer 128, discussed below with respect to FIGS. 25A and 25B, and the third dielectric layer 130, discussed below with respect to FIGS. 27A and 27B) from being deposited on the first conductive features 124. This may result in the subsequently deposited dielectric materials being deposited over the first conductive features 124 and may increase contact resistance between the first conductive features 124 and subsequently formed conductive features (such as the second conductive features 136, discussed below with respect to FIGS. 28A through 28D). Providing the sacrificial material 126 with a thickness greater than the prescribed range may result in the sacrificial material 126 extending too far over the first dielectric layer 122, which may result in damage to the first dielectric layer 122 after the sacrificial material 126 is subsequently removed.

Figure 25A:
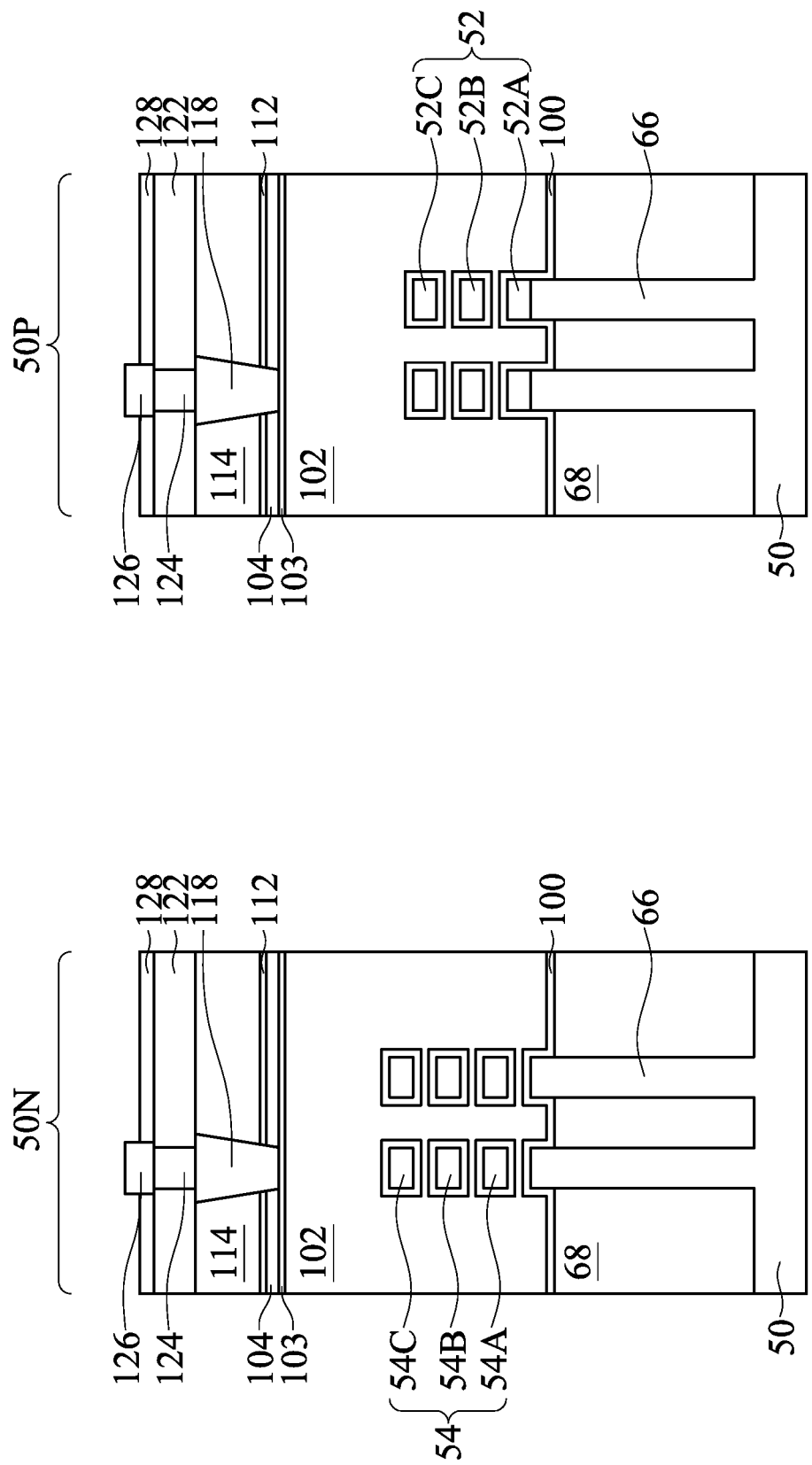
Figure 25B:
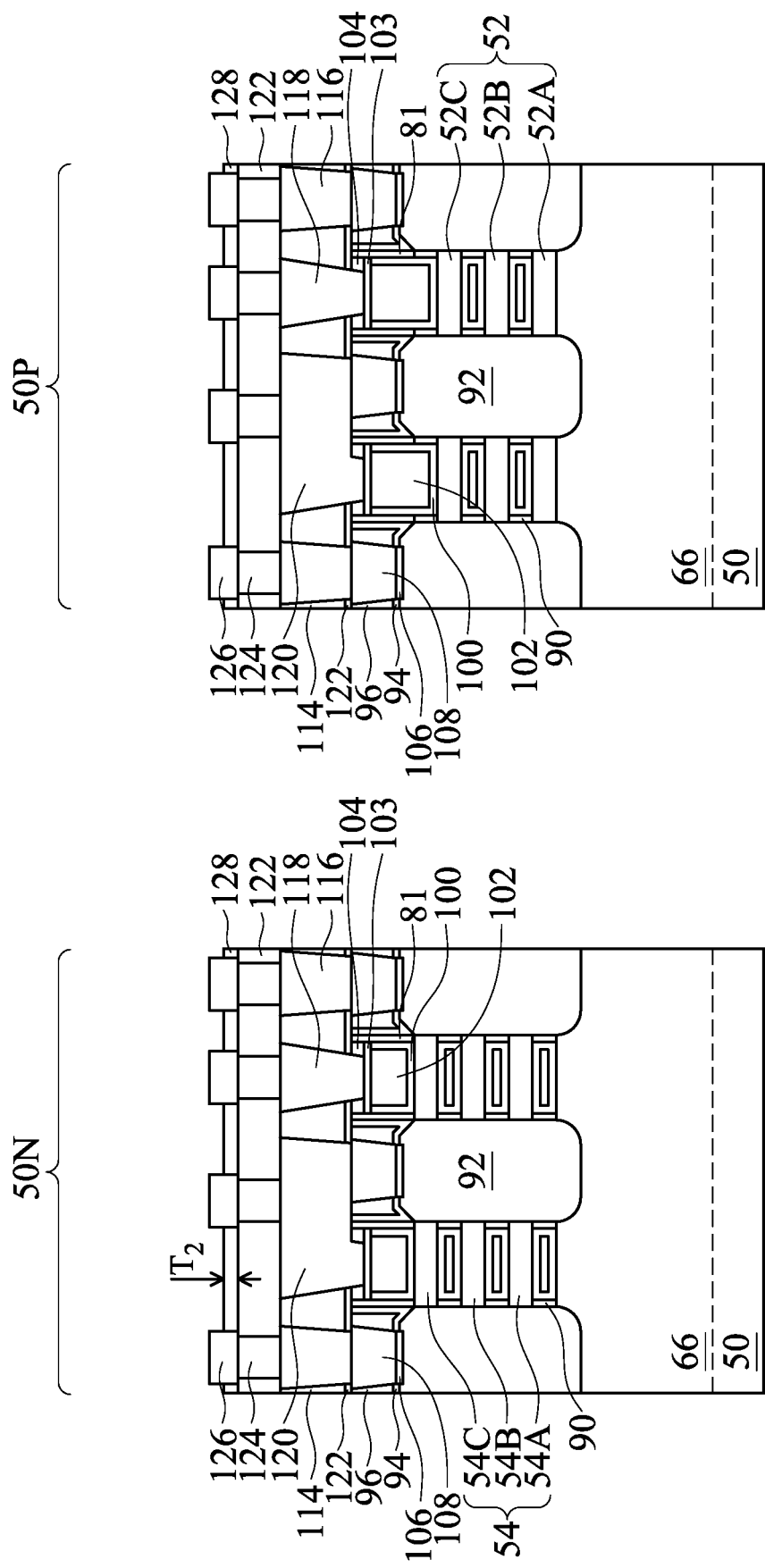

In FIGS. 25A and 25B, a second dielectric layer 128 is deposited over the first dielectric layer 122, adjacent the sacrificial material 126. In some embodiments, the second dielectric layer 128 may be a dielectric material, such as an oxide or a nitride. In embodiments in which the second dielectric layer 128 is an oxide, the second dielectric layer 128 may comprise aluminum oxide ($Al_2O_3$), silicon dioxide ($SiO_2$), silicon oxygen carbide (SiOC), yttrium oxide ($Y_2O_3$), zirconium oxide ($ZrO_2$), combinations thereof, or the like. In embodiments in which the second dielectric layer 128 is a nitride, the second dielectric layer 128 may comprise silicon nitride (SiN), silicon carbon nitride (SiCN), silicon boron nitride (SiBN), silicon boron carbon nitride (SiBCN), boron nitride (BN), combinations thereof, or the like.

The second dielectric layer 128 may be deposited by a deposition process that selectively deposits the second dielectric layer 128 on dielectric surfaces of the first dielectric layer 122, without the second dielectric layer 128 being deposited on metal surfaces of the first conductive features 124 or dielectric surfaces of the sacrificial material 126. As illustrated in FIGS. 25A and 25B, the second dielectric layer 128 may be selectively deposited on the first dielectric layer 122 adjacent the sacrificial material 126. The second dielectric layer 128 may be deposited by PECVD, ALD, PEALD, or the like. The second dielectric layer 128 may be deposited to a thickness $T_2$ ranging from about 20 Å to about 30 Å. Forming the second dielectric layer 128 with a thickness less than the prescribed range may result in a higher-k material formed over the second dielectric layer 128 (such as the third dielectric layer 130, discussed below with respect to FIGS. 27A and 27B) being formed to a greater thickness, which undesirably increases capacitance. Further, the higher-k material may be an etch stop layer, and forming the second dielectric layer 128 with a thickness greater than the prescribed range may result in the higher-k material being formed to a lesser thickness, which does not sufficiently perform as an etch stop layer. The second dielectric layer 128 may be deposited in a wet deposition process or a dry deposition process. The second dielectric layer 128 may be deposited at a temperature ranging from about 40° C. to about 300° C., for a time ranging from about 30 seconds to about 30 minutes, at a dry pressure ranging from about 1 Torr to about 10 Torr.

In FIGS. 26A through 26D, the sacrificial material 126 is trimmed. The sacrificial material 126 may be trimmed by a plasma process using, for example, an oxygen plasma. The oxygen plasma may include oxygen radicals (O·) and oxygen ions (O⁻). The oxygen plasma may be formed by flowing a gas, such as oxygen ($O_2$), a mixture of oxygen and nitrogen ($N_2$), nitrous oxide ($N_2O$), nitric oxide (NO), nitrogen oxygen ($N_2O_2$), combinations thereof, or the like, into a plasma generation chamber. The oxygen plasma may react with the sacrificial material 126 according to the following reaction in order to trim the sacrificial material 126:

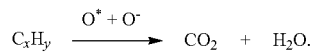

Figure 26A:
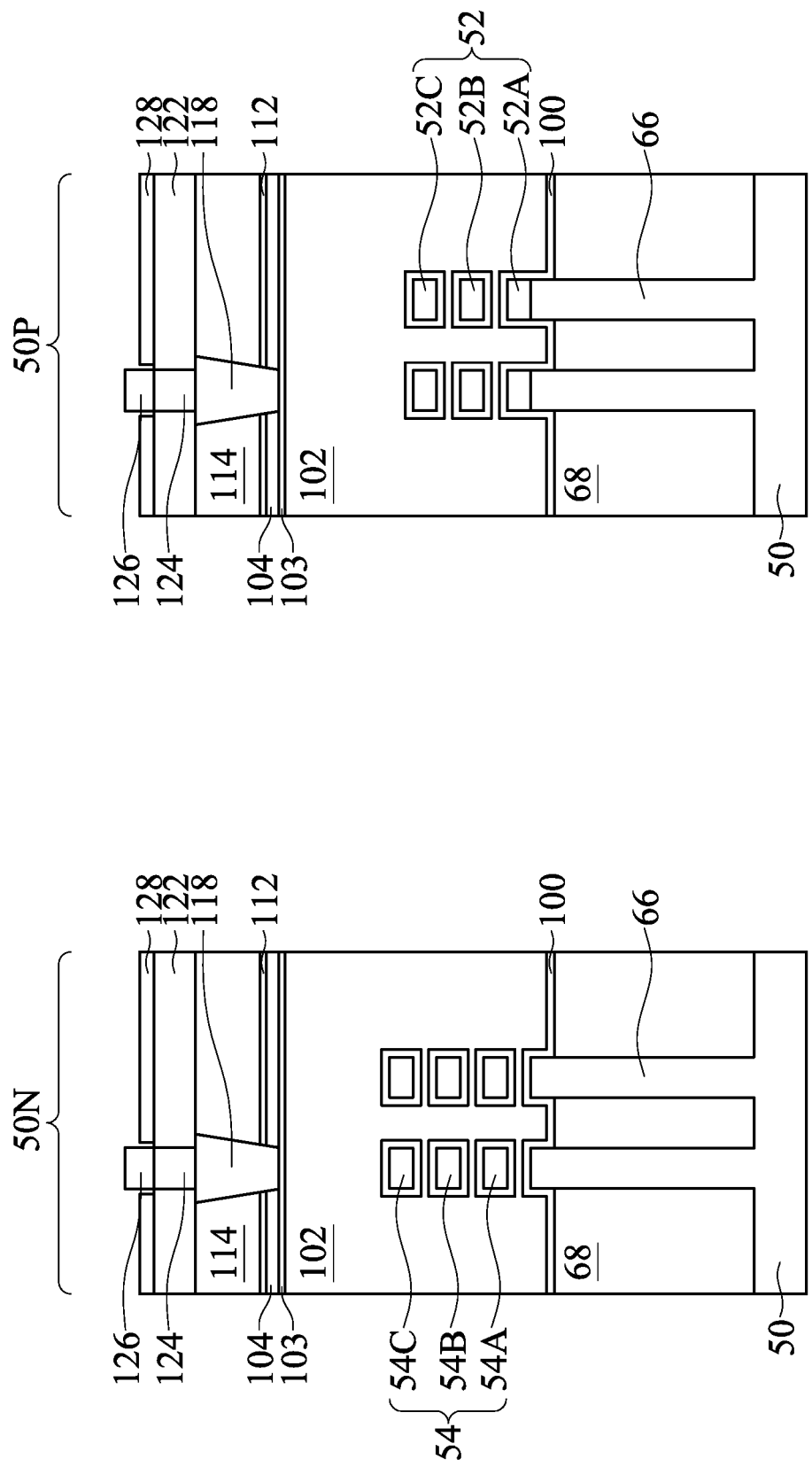
Figure 26B:
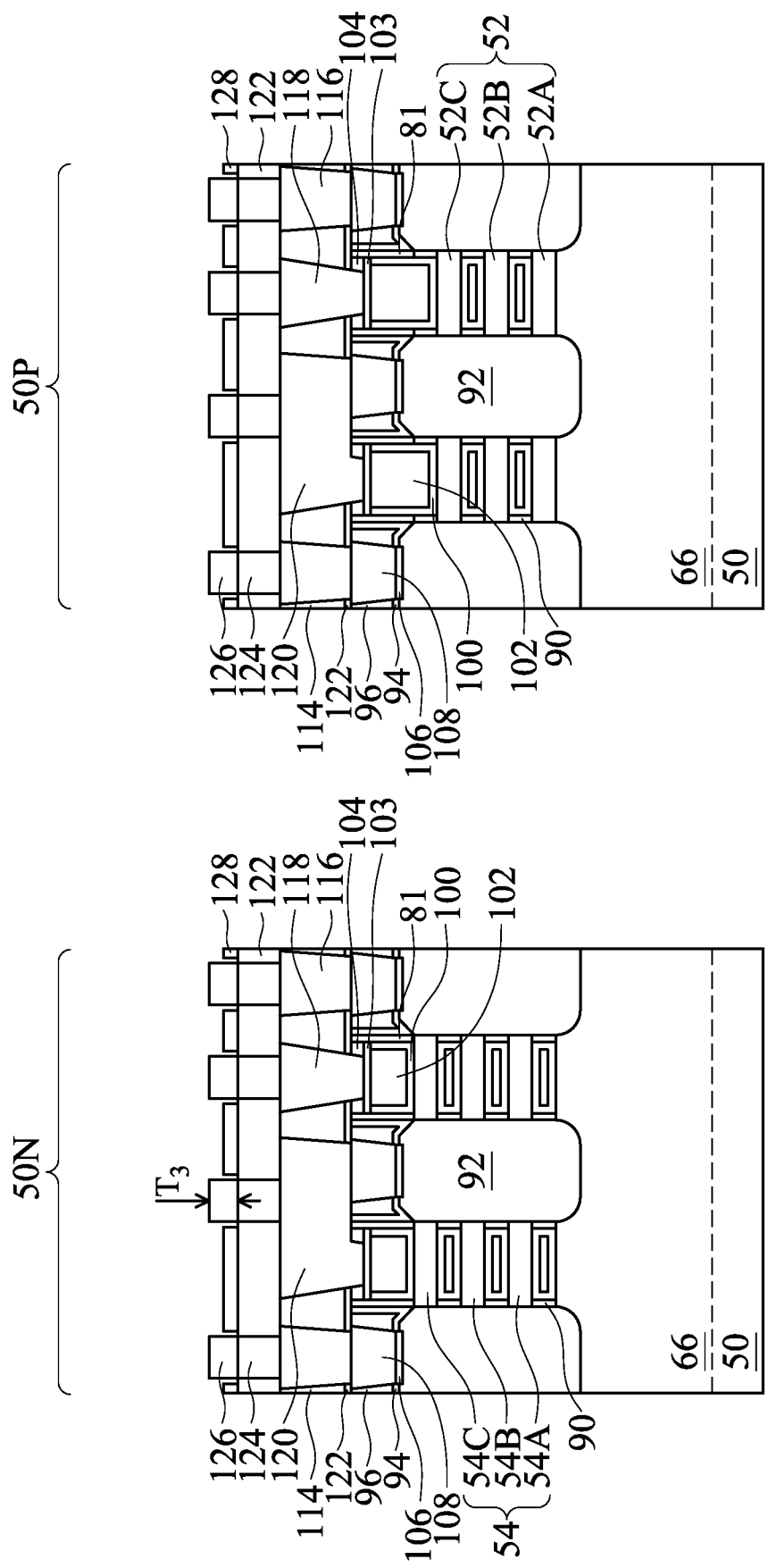

The oxygen plasma may penetrate the sacrificial material 126 to different extents based on the film type and density of the sacrificial material 126. The oxygen plasma thereby trims the sacrificial material 126 to different extents depending on the makeup of the sacrificial material 126. For example, in embodiments in which the sacrificial material 126 comprises polyethylene, the oxygen plasma may penetrate into the sacrificial material 126 a distance ranging from about 10 Å to about 40 Å. In embodiments in which the sacrificial material 126 comprises aluminum oxide, the oxygen plasma may penetrate into the sacrificial material 126 a distance ranging from about 10 Å to about 30 Å. The sacrificial material 126 may be trimmed a distance ranging from about 5 Å to about 30 Å depending on the composition of the sacrificial material 126 and the time to which the sacrificial material 126 is exposed to the oxygen plasma. As illustrated in FIGS. 26A and 26B, side surfaces and top surfaces of the sacrificial material 126 may be at least partially exposed to the oxygen plasma, such that the sacrificial material 126 is trimmed from both the side surfaces and the top surfaces. Following the plasma trimming, the sacrificial material 126 may have a thickness $T_3$ ranging from about 20 Å to about 40 Å. Sidewalls of the sacrificial material 126 may be aligned with sidewalls of the first conductive features 124, as illustrated in FIGS. 26A and 26B, may extend laterally past the sidewalls of the first conductive features 124, or may be etched back laterally from the sidewalls of the first conductive features 124. Further, portions of the first dielectric layer 122 may be exposed between the sacrificial material 126 and the second dielectric layer 128 after trimming the sacrificial material 126.

Figure 26C:
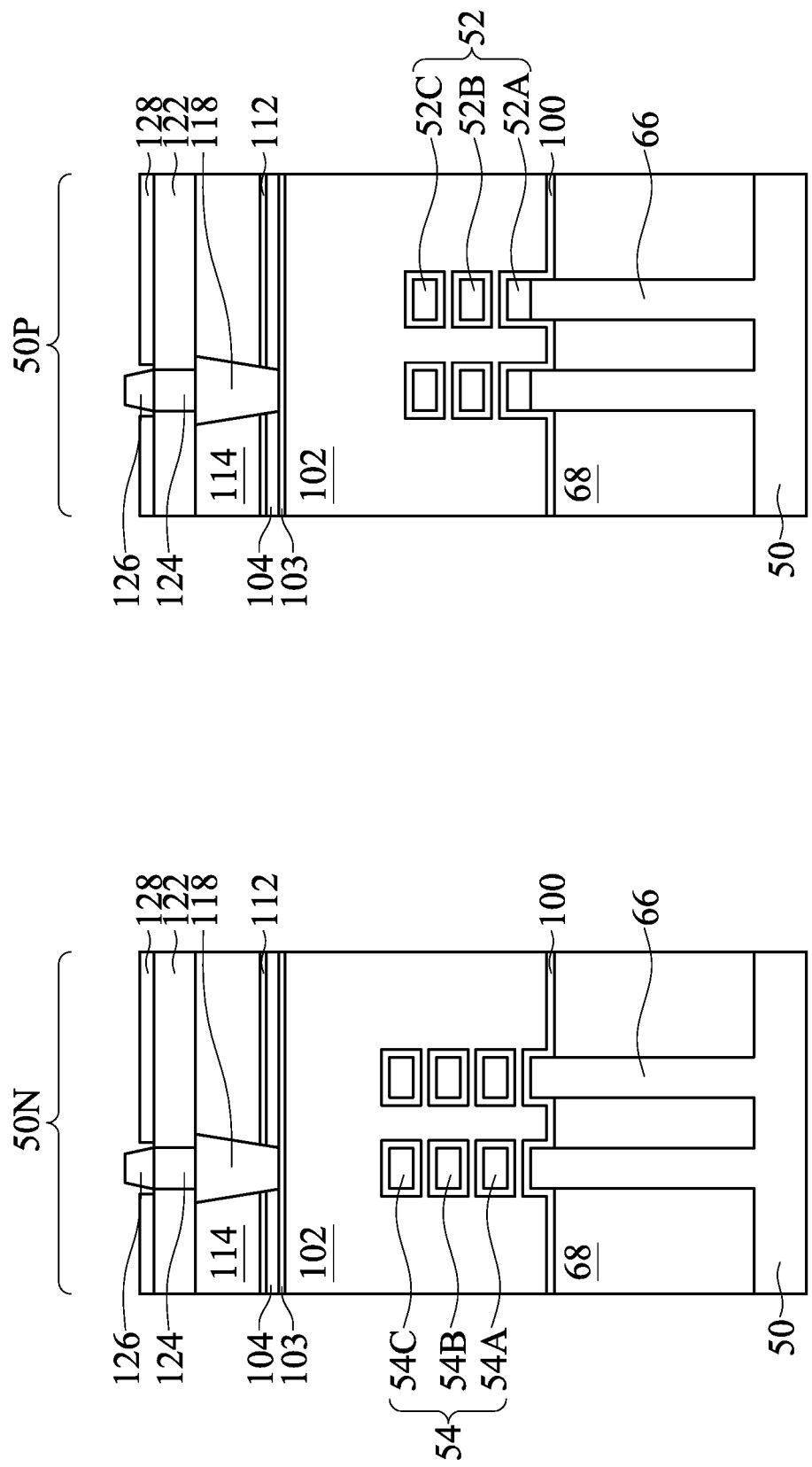
Figure 26D:
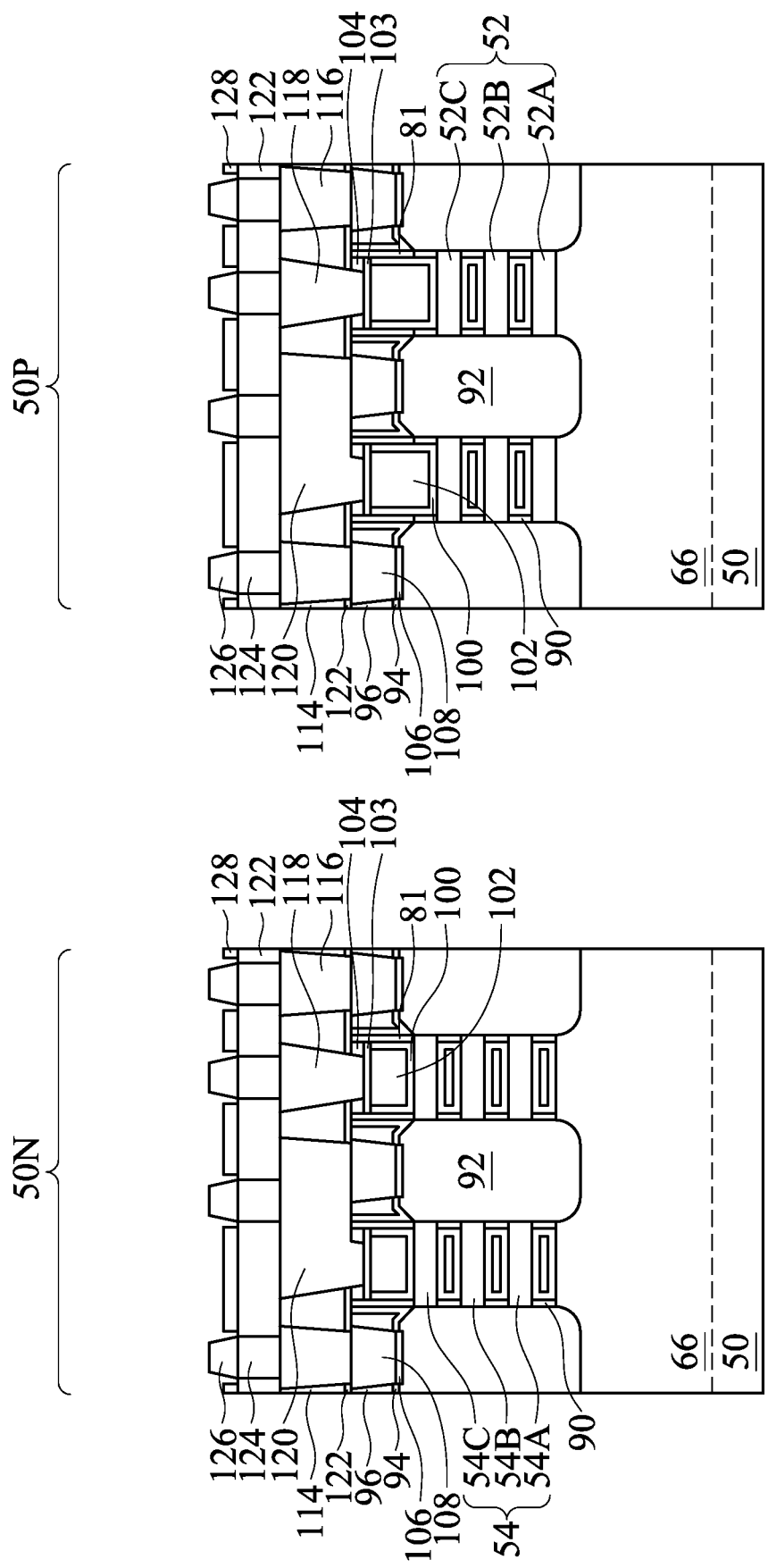

In some embodiments, performing the plasma trimming process on the sacrificial material 126 may cause the sacrificial material 126 to have a reverse tapered shape. For example, as illustrated in FIGS. 26C and 26D, widths of the sacrificial material 126 may narrow as distance from the substrate 50 increases. The reverse tapered shape may be caused by the plasma removing material from upper corner regions of the sacrificial material from multiple directions, in addition to the second dielectric layer 128 blocking access of the plasma to lower portions of the sacrificial material 126.

Figure 27A:
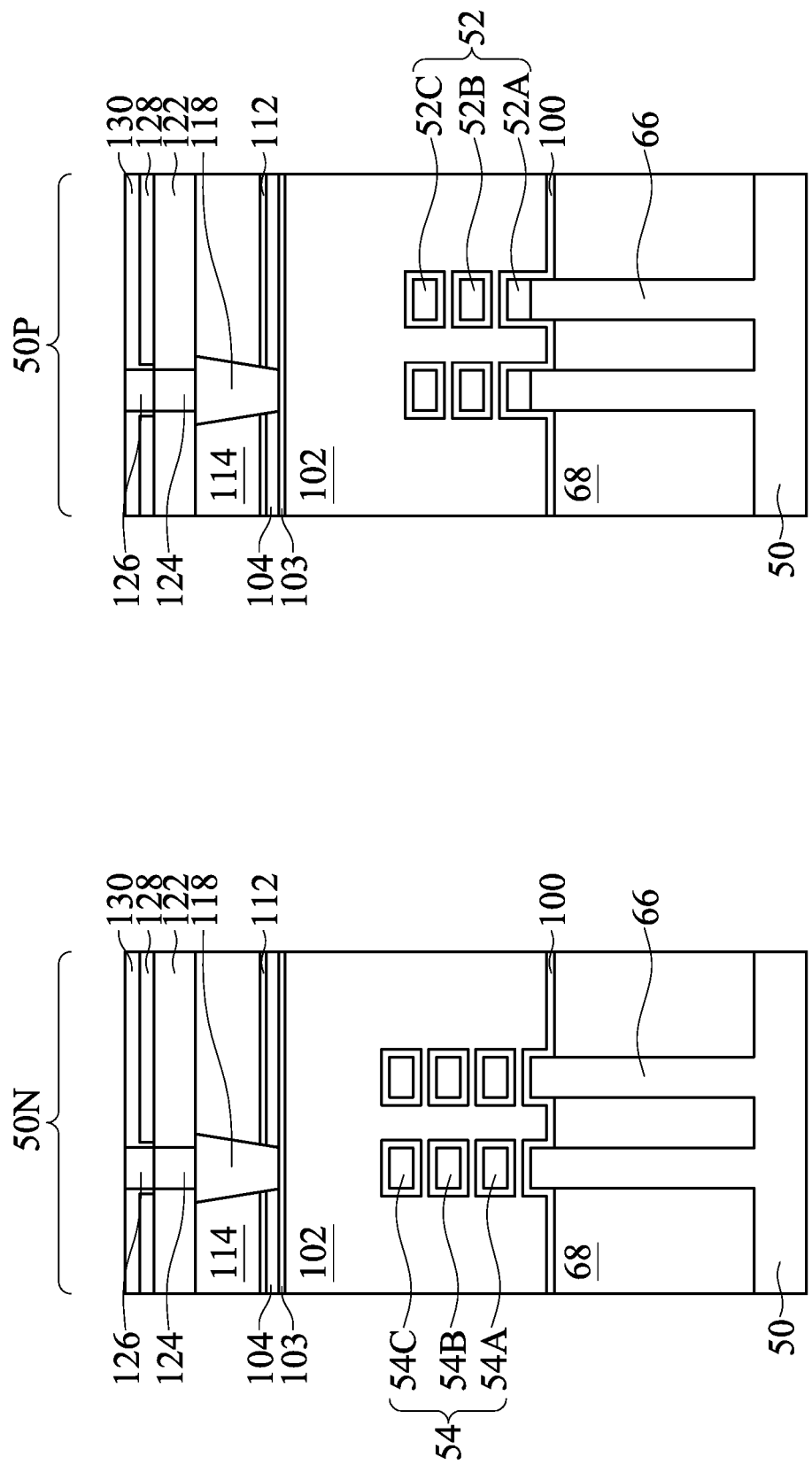
Figure 27B:
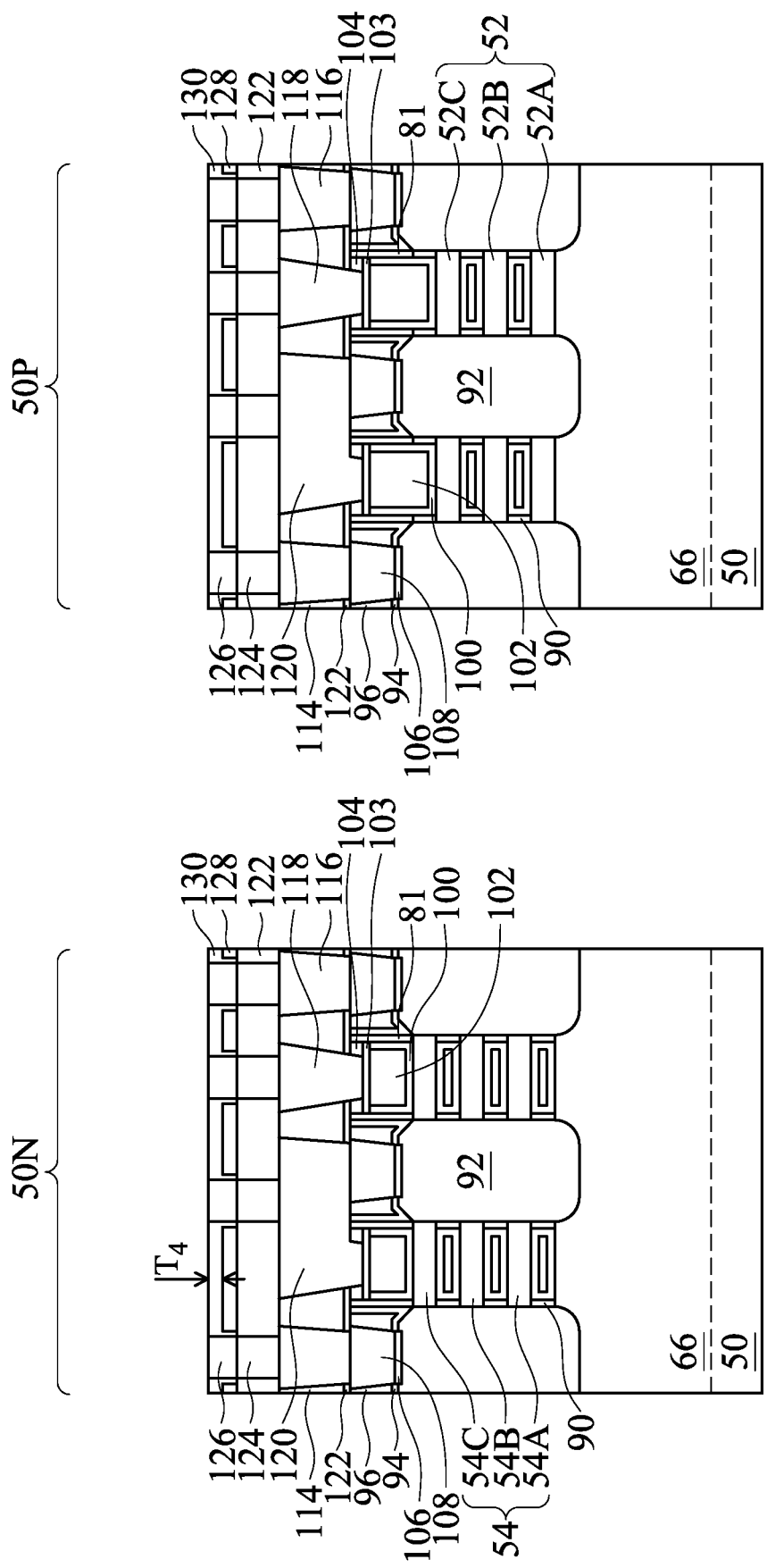

In FIGS. 27A and 27B, a third dielectric layer 130 is deposited over the first dielectric layer 122 and the second dielectric layer 128, adjacent the sacrificial material 126. In some embodiments, the third dielectric layer 130 may be a dielectric material, such as an oxide or a nitride. In embodiments in which the third dielectric layer 130 is an oxide, the third dielectric layer 130 may comprise aluminum oxide ($Al_2O_3$), silicon dioxide ($SiO_2$), silicon oxygen carbide (SiOC), yttrium oxide ($Y_2O_3$), zirconium oxide ($ZrO_2$), combinations thereof, or the like. In embodiments in which the third dielectric layer 130 is a nitride, the third dielectric layer 130 may comprise silicon nitride (SiN), silicon carbon nitride (SiCN), boron nitride (BN), silicon boron nitride (SiBN), combinations thereof, or the like. The third dielectric layer 130 may comprise a material having a higher k-value than the second dielectric layer 128. For example, the second dielectric layer 128 may have a k-value ranging from about 3 to about 7, while the third dielectric layer 130 may have a k-value ranging from about 3 to about 14.

The third dielectric layer 130 may be deposited by a deposition process that selectively deposits the third dielectric layer 130 on dielectric surfaces of the second dielectric layer 128, without the third dielectric layer 130 being deposited on dielectric surfaces of the sacrificial material 126. As illustrated in FIGS. 27A and 27B, the third dielectric layer 130 may be selectively deposited on the second dielectric layer 128 adjacent the sacrificial material 126. The third dielectric layer 130 may be deposited by PECVD, ALD, PEALD, or the like. The third dielectric layer 130 may be deposited to a thickness $T_4$ ranging from about 5 Å to about 15 Å. The third dielectric layer 130 acts as an etch stop layer in a subsequent etching process used to form openings for metal vias (such as the second conductive features 136, discussed below with respect to FIGS. 28A and 28B). Forming the third dielectric layer 130 to a thickness less than the prescribed range may result in the third dielectric layer 130 being unable to sufficiently perform as an etch stop layer. If the third dielectric layer 130 is formed to a thickness greater than the prescribed range, the third dielectric layer 130 may extend onto the sacrificial material 126, which may inhibit etching of the sacrificial material 126. Because the third dielectric layer 130 has relatively high k-value, forming the third dielectric layer to a thickness greater than the prescribed range may also undesirably increase capacitance, reducing device performance. The third dielectric layer 130 may be deposited in a wet deposition process or a dry deposition process. The third dielectric layer 130 may be deposited at a temperature ranging from about 40° C. to about 300° C., for a time ranging from about 30 seconds to about 30 minutes, at a dry pressure ranging from about 1 Torr to about 10 Torr.

In FIGS. 28A through 28D, a second etch stop layer 132 and a fourth dielectric layer 134 are formed over the third dielectric layer 130 and the sacrificial material 126. The second etch stop layer 132 may comprise a dielectric material, such as, silicon nitride (SiN), silicon oxide ($SiO_2$), silicon oxynitride (SiON), or the like, having a different etch rate than the material of the overlying fourth dielectric layer 134. In some embodiments, the second etch stop layer 132 may include aluminum oxide ($Al_2O_3$), silicon carbon nitride (SiCN), silicon oxygen carbide (SiOC), boron nitride (BN), silicon boron nitride (SiBN), yttrium oxide ($Y_2O_3$), zirconium oxide ($ZrO_2$), combinations or multiple layers thereof, or the like. The second etch stop layer 132 is optional and may be omitted in some embodiments. The fourth dielectric layer 134 may comprise a dielectric material, such as a low-k dielectric material, an extra low-k (ELK) dielectric material, or the like. The fourth dielectric layer 134 may be deposited using an appropriate process, such as, CVD, ALD, PVD, PECVD, or the like. In some embodiments, the fourth dielectric layer 134 may comprise silicon carbon nitride (SiCN), silicon oxygen carbide (SiOC), silicon boron nitride (SiBN), silicon boron carbon nitride (SiBCN), boron nitride (BN), combinations or multiple layers thereof, or the like.

Further in FIGS. 28A through 28D, the fourth dielectric layer 134 and the second etch stop layer 132 are etched through to expose portions of the sacrificial material 126, the exposed portions of the sacrificial material 126 are removed, and second conductive features 136 are formed extending to the first conductive features 124. Openings for the second conductive features 136 are formed through the fourth dielectric layer 134 and the second etch stop layer 132 and stop on the third dielectric layer 130 and the sacrificial material 126. The openings may be formed using acceptable photolithography and etching techniques. As illustrated in FIGS. 28A through 28D, the openings may be formed with widths greater than widths of the sacrificial material 126, and the openings may have tapered shaped which narrow in a direction toward the substrate 50.

Figure 28A:
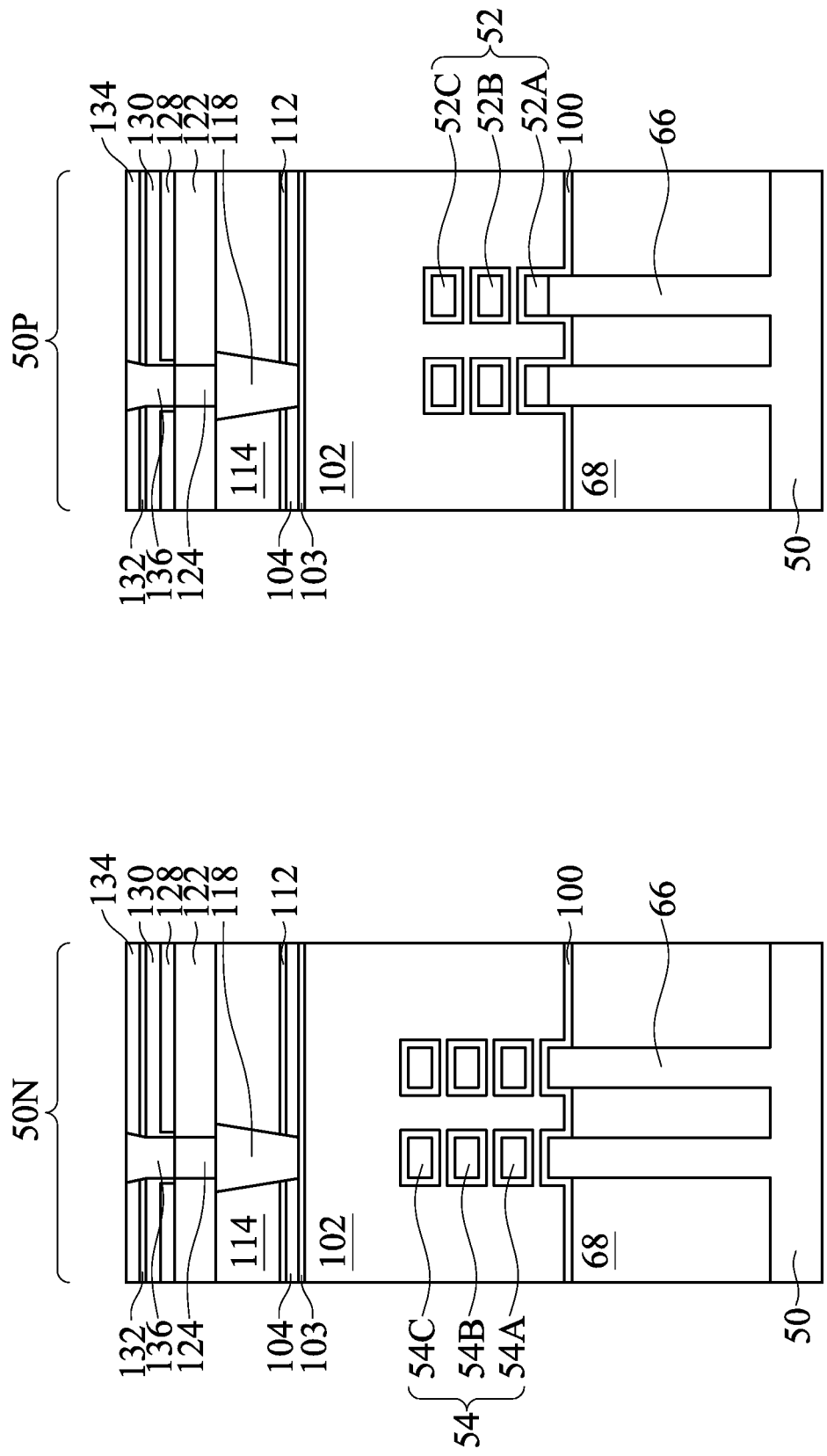
Figure 28B:
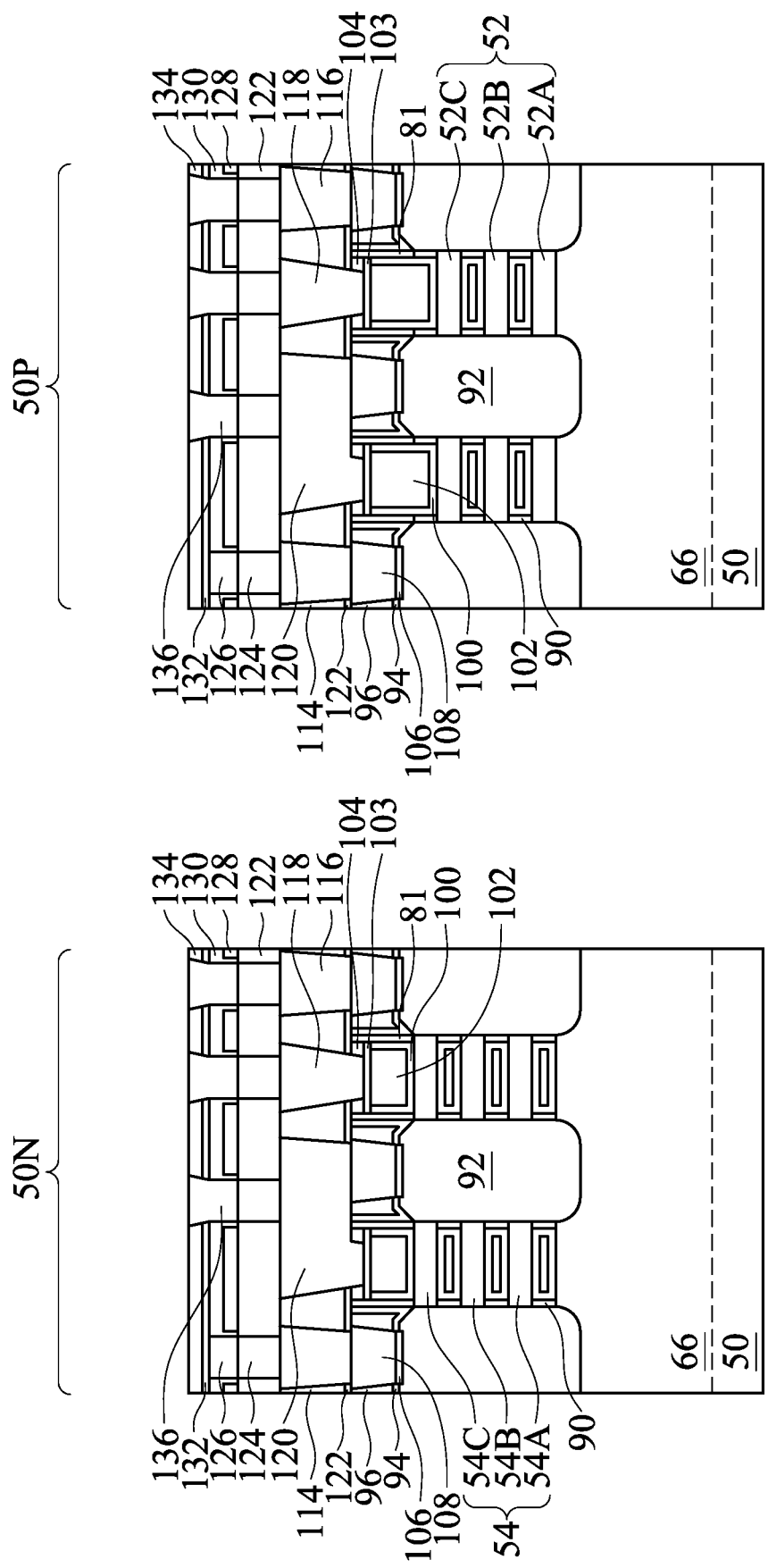

The sacrificial material 126 may then be removed. The sacrificial material 126 may be removed by an etching process, such as a wet etch or a dry etch. In some embodiments, the sacrificial material 126 may be removed by a plasma treatment process. The process used to remove the sacrificial material 126 may be selective to material of the sacrificial material 126, such that the fourth dielectric layer 134, the second etch stop layer 132, the third dielectric layer 130, and the first conductive features 124 are relatively un-etched. As illustrated in FIGS. 28B and 28D, only portions of the sacrificial material 126 may be exposed by the openings formed through the fourth dielectric layer 134 and the second etch stop layer 132, such that portions of the sacrificial material 126 remain. Further, the process used to remove the sacrificial material 126 may be anisotropic, such that only portions of the sacrificial material 126 exposed by the openings formed through the fourth dielectric layer 134 and the second etch stop layer 132 are removed.

In some embodiments, the sacrificial material 126 may be removed using processes the same as or similar to the processes used to trim the sacrificial material 126, discussed above with respect to FIGS. 26A through 26D. For example, the sacrificial material 126 may be removed by a plasma process using an oxygen plasma. The oxygen plasma may include oxygen radicals (O·) and oxygen ions (O⁻). The oxygen plasma may be formed by flowing a gas, such as oxygen ($O_2$), a mixture of oxygen and nitrogen ($N_2$), nitrous oxide ($N_2O$), nitric oxide (NO), nitrogen oxygen ($N_2O_2$), combinations thereof, or the like, into a plasma generation chamber. The oxygen plasma may react with the sacrificial material 126 according to the following reaction in order to remove the sacrificial material 126:

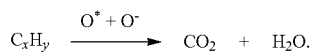

$$C_xH_y \xrightarrow{O^* + O^-} CO_2 + H_2O.$$

After the sacrificial material 126 is removed, the second conductive features 136 are formed in the openings formed by etching the fourth dielectric layer 134 and the second etch stop layer 132 and removing the sacrificial material 126. The second conductive features 136 may comprise conductive vias. The second conductive features 136 may include an optional diffusion barrier layer, an optional liner layer, and/or an optional adhesion layer, which may be deposited and the openings may then be filled with a conductive material. Suitable materials for the diffusion barrier layer include titanium, titanium nitride, titanium oxide, tantalum, tantalum nitride, tantalum oxide, combinations thereof, or the like; suitable materials for the liner layer include cobalt, ruthenium, combinations thereof, or the like; and suitable materials for the conductive material include copper, silver, gold, tungsten, aluminum, cobalt, ruthenium, molybdenum, combinations thereof, or the like. In an embodiment, the second conductive features 136 may be formed by depositing a seed layer of copper or a copper alloy, and filling the trenches by electroplating. A CMP process or the like may be used to remove excess conductive material from a surface of the fourth dielectric layer 134 and to planarize surfaces of the fourth dielectric layer 134 and the second conductive features 136 for subsequent processing. The second conductive features 136 may be electrically coupled to the gate structures and/or the epitaxial source/drain regions 92 through the first conductive features 124, the second source/drain contacts 116, the gate contacts 118, and the butted contacts 120.

Figure 28C:
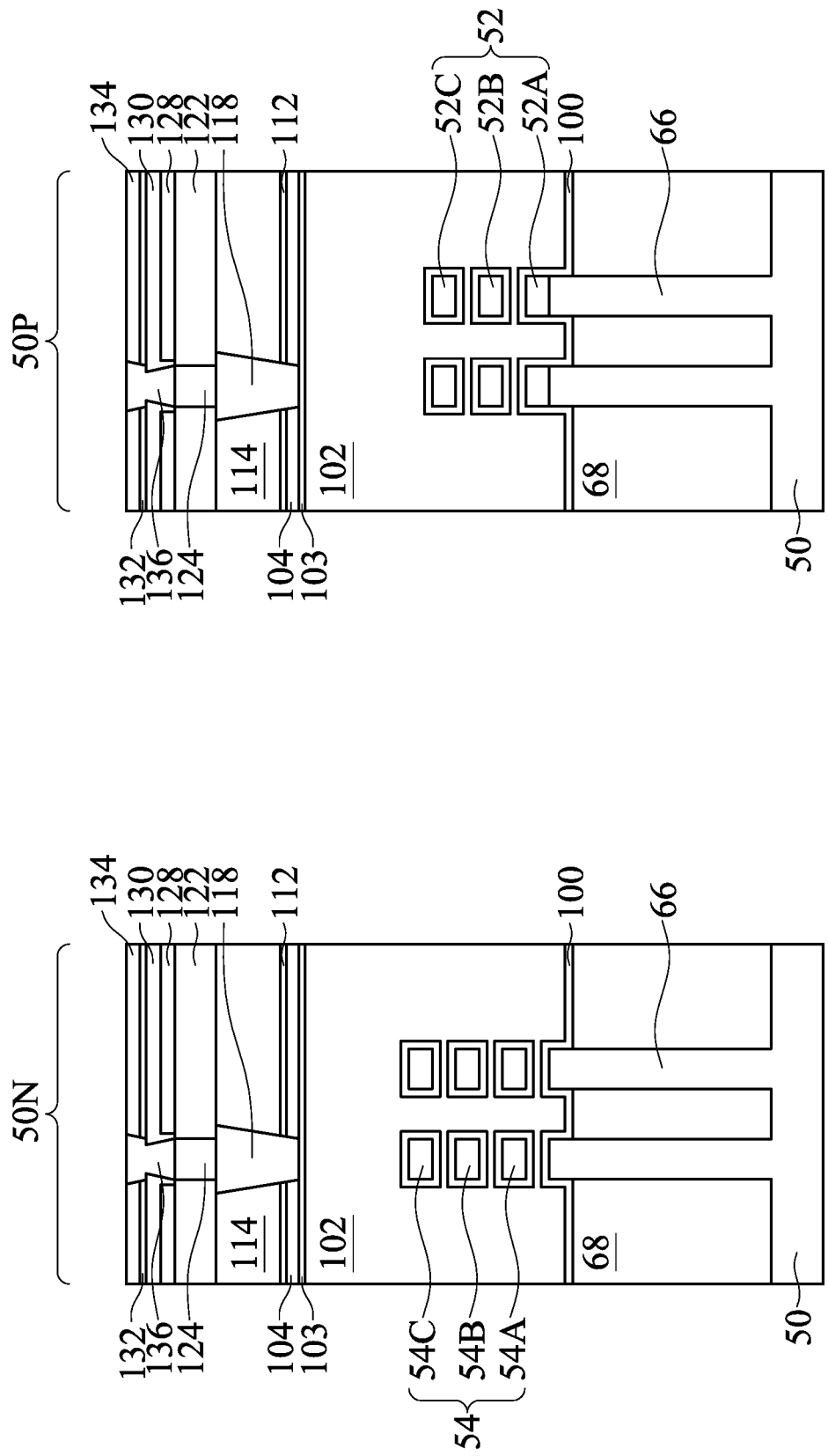
Figure 28D:
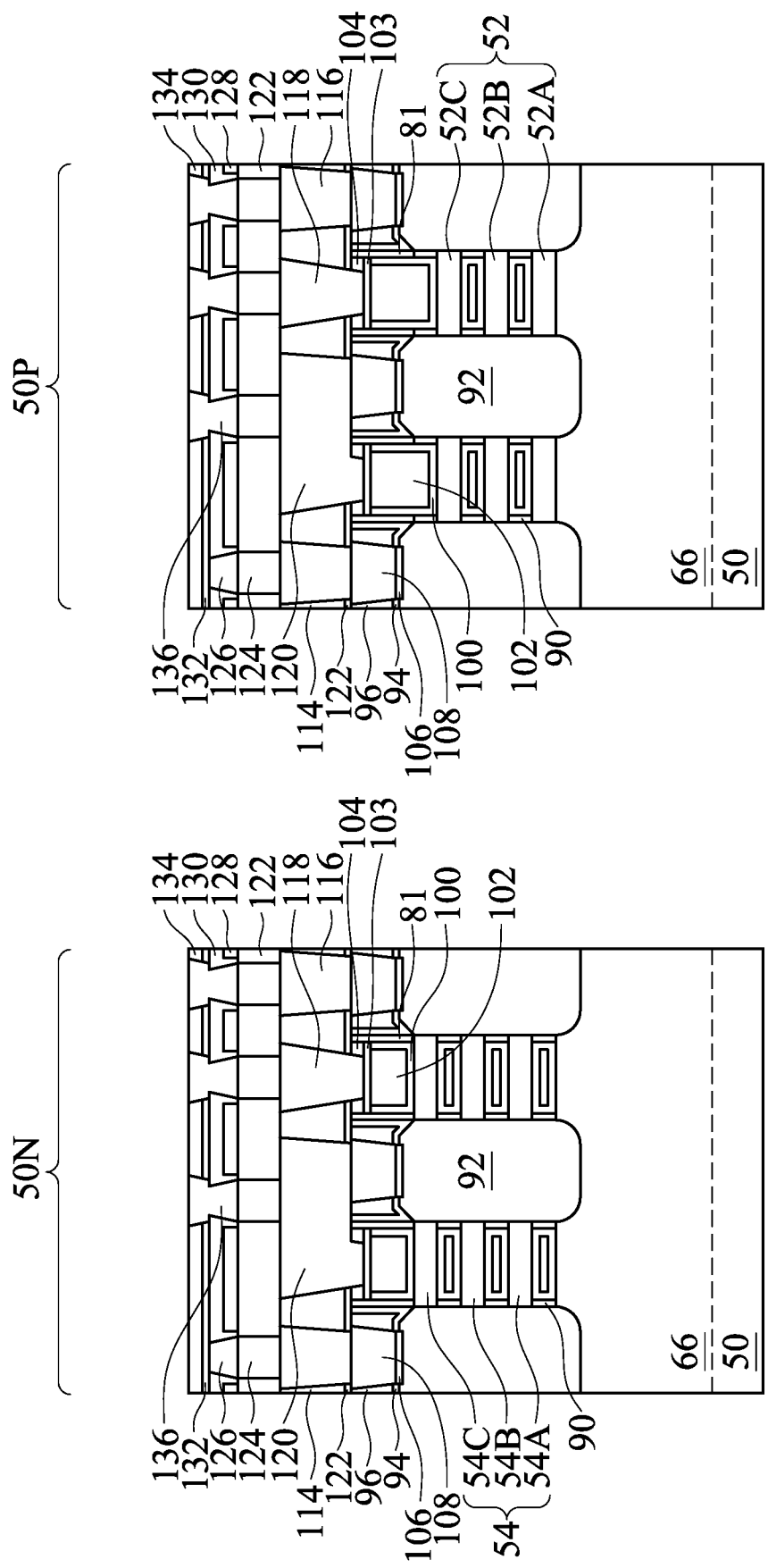

FIGS. 28C and 28D illustrate the embodiment of FIGS. 26C and 26D after forming the second etch stop layer 132, the fourth dielectric layer 134, and the second conductive features 136. As illustrated in FIGS. 28C and 28D, portions of the second conductive features 136 extending through the second etch stop layer 132 and the fourth dielectric layer 134 may have a tapered shape (wherein the width of the second conductive features 136 narrows in a direction toward the substrate 50), and portions of the second conductive features extending through the third dielectric layer 130 may have a reverse tapered shape (wherein the width of the second conductive features 136 expands in a direction toward the substrate 50).

Forming the sacrificial material 126, the second dielectric layer 128, and the third dielectric layer 130 in the self-aligned manner, as described above, and replacing the sacrificial material 126 with the second conductive features 136 improves the alignment of the second conductive features 136 with respect to the first conductive features 124. This helps to reduce RC delay and reduce electromigration (EM) issues in completed devices. Further, removing the sacrificial material 126 using the high selectivity processes described above prevents damage to the third dielectric layer 130, the second dielectric layer 128, and the first dielectric layer 122, which reduces time-dependent dielectric breakdown (TDDB) and stress migration (SM). Forming the second dielectric layer 128 of a lower-k material and the third dielectric layer 130 of a material having good etch stop properties lowers parasitic capacitance of the structure including both the second dielectric layer 128 and the third dielectric layer 130, while the third dielectric layer 130 still functions as an effective etch stop layer. As such, the above-described methods may be used to improve device performance and reduce device defects.

Figure 29A:
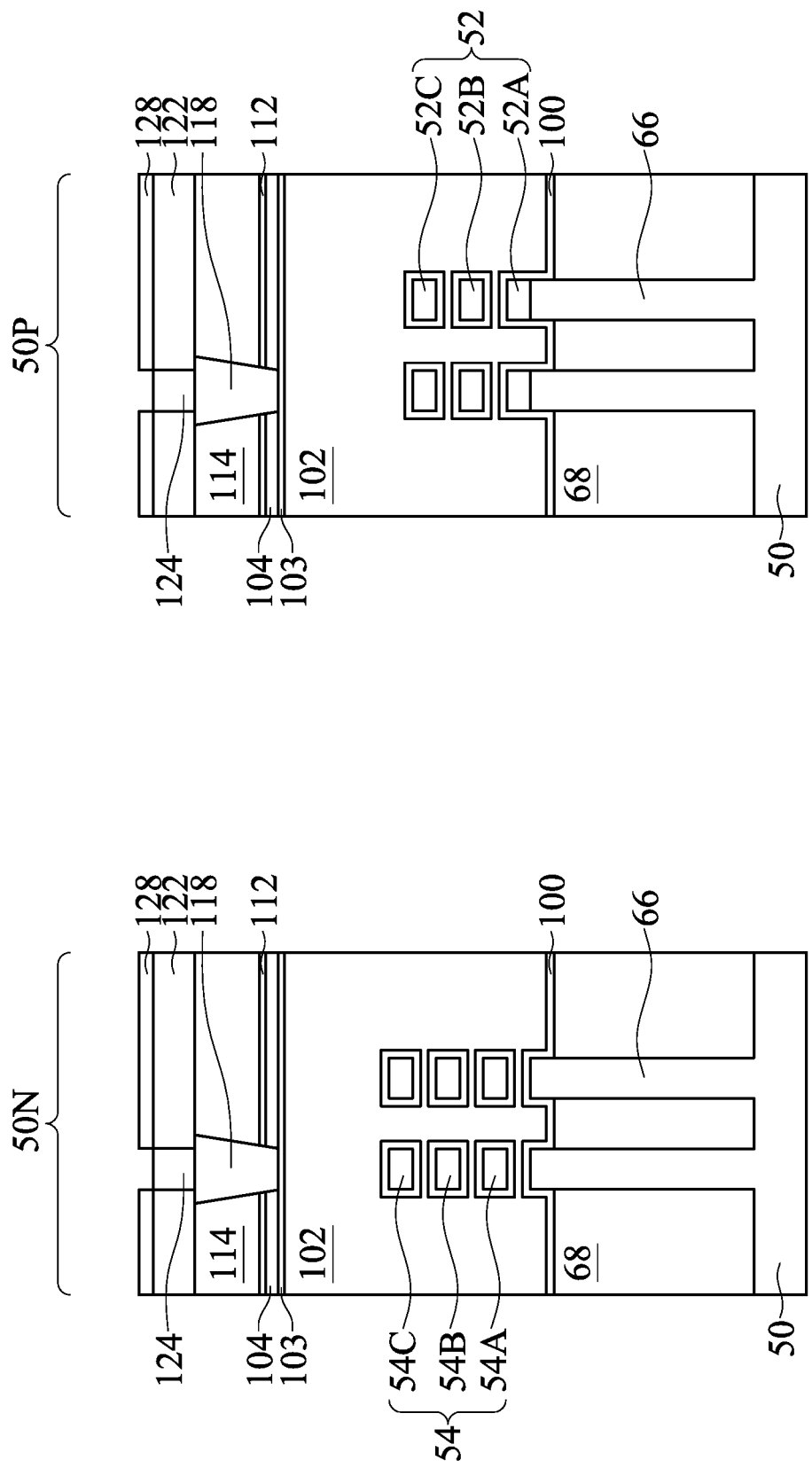

FIGS. 29A through 33B illustrate an embodiment in which the second dielectric layer 128 is formed before the sacrificial material 126. In FIGS. 29A and 29B, the second dielectric layer 128 is deposited over the first dielectric layer 122. In some embodiments, the second dielectric layer 128 may be a dielectric material, such as an oxide or a nitride. In embodiments in which the second dielectric layer 128 is an oxide, the second dielectric layer 128 may comprise aluminum oxide ($Al_2O_3$), silicon dioxide ($SiO_2$), silicon oxycarbide (SiOC), yttrium oxide ($Y_2O_3$), zirconium oxide ($ZrO_2$), combinations thereof, or the like. In embodiments in which the second dielectric layer 128 is a nitride, the second dielectric layer 128 may comprise silicon nitride (SiN), silicon carbon nitride (SiCN), silicon boron nitride (SiBN), silicon boron carbon nitride (SiBCN), boron nitride (BN), combinations thereof, or the like.

Figure 29B:
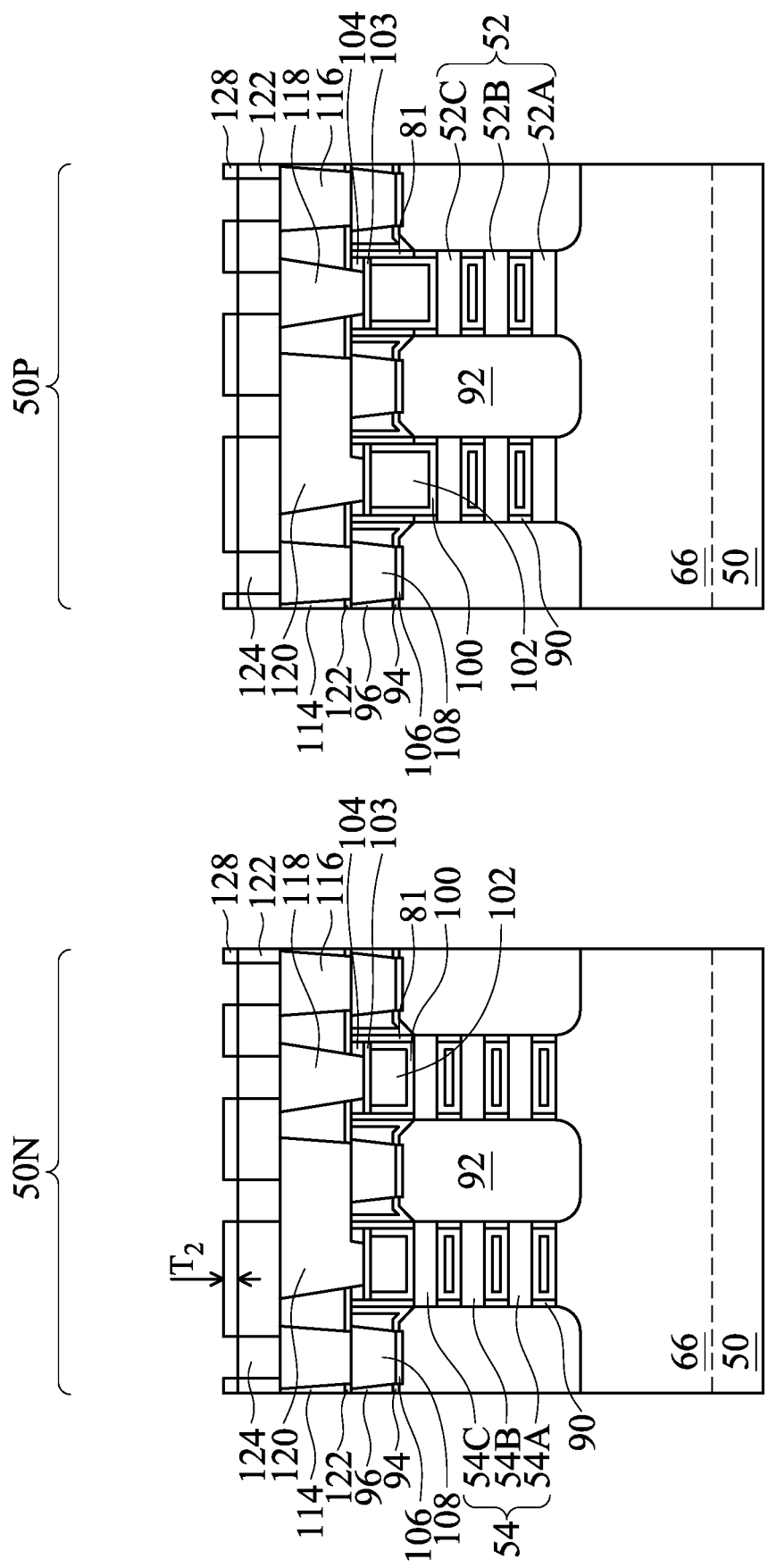

The second dielectric layer 128 may be deposited by a deposition process that selectively deposits the second dielectric layer 128 on dielectric surfaces of the first dielectric layer 122, without the second dielectric layer 128 being deposited on metal surfaces of the first conductive features 124. As illustrated in FIGS. 29A and 29B, the second dielectric layer 128 may be selectively deposited on the first dielectric layer 122, without being deposited on the first conductive features 124. The second dielectric layer 128 may be deposited to the thickness $T_2$ ranging from about 20 Å to about 30 Å. Forming the second dielectric layer 128 with a thickness less than the prescribed range may result in a higher-k material formed over the second dielectric layer 128 (such as the third dielectric layer 130, discussed below with respect to FIGS. 32A and 32B) being formed to a greater thickness, which undesirably increases capacitance. Further, the higher-k material may be an etch stop layer, and forming the second dielectric layer 128 with a thickness greater than the prescribed range may result in the higher-k material being formed to a lesser thickness, which does not sufficiently perform as an etch stop layer. The second dielectric layer 128 may be deposited in a wet deposition process or a dry deposition process. The second dielectric layer 128 may be deposited at a temperature ranging from about 40° C. to about 300° C., for a time ranging from about 30 seconds to about 30 minutes, at a dry pressure ranging from about 1 Torr to about 10 Torr.

Figure 30A:
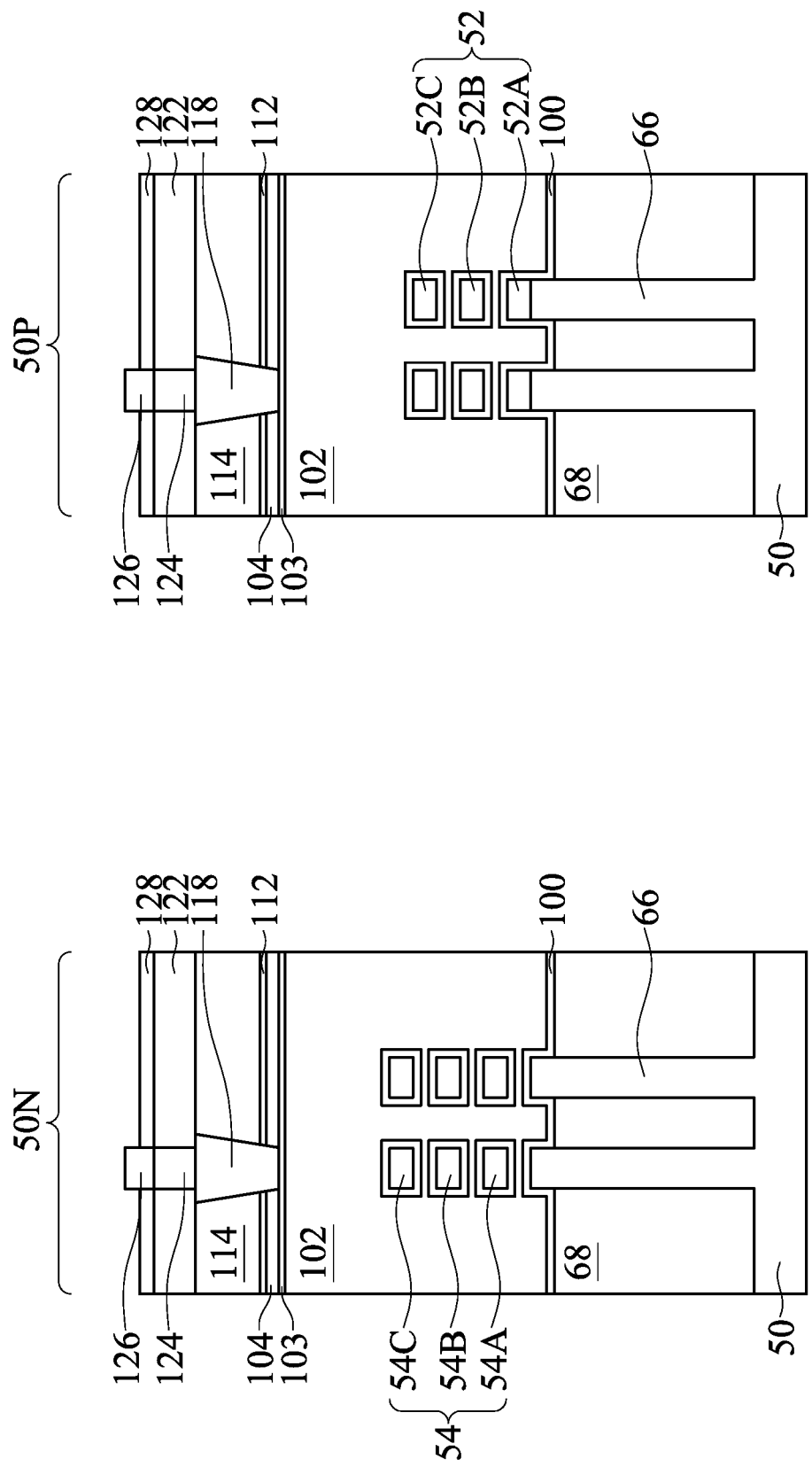
Figure 30B:
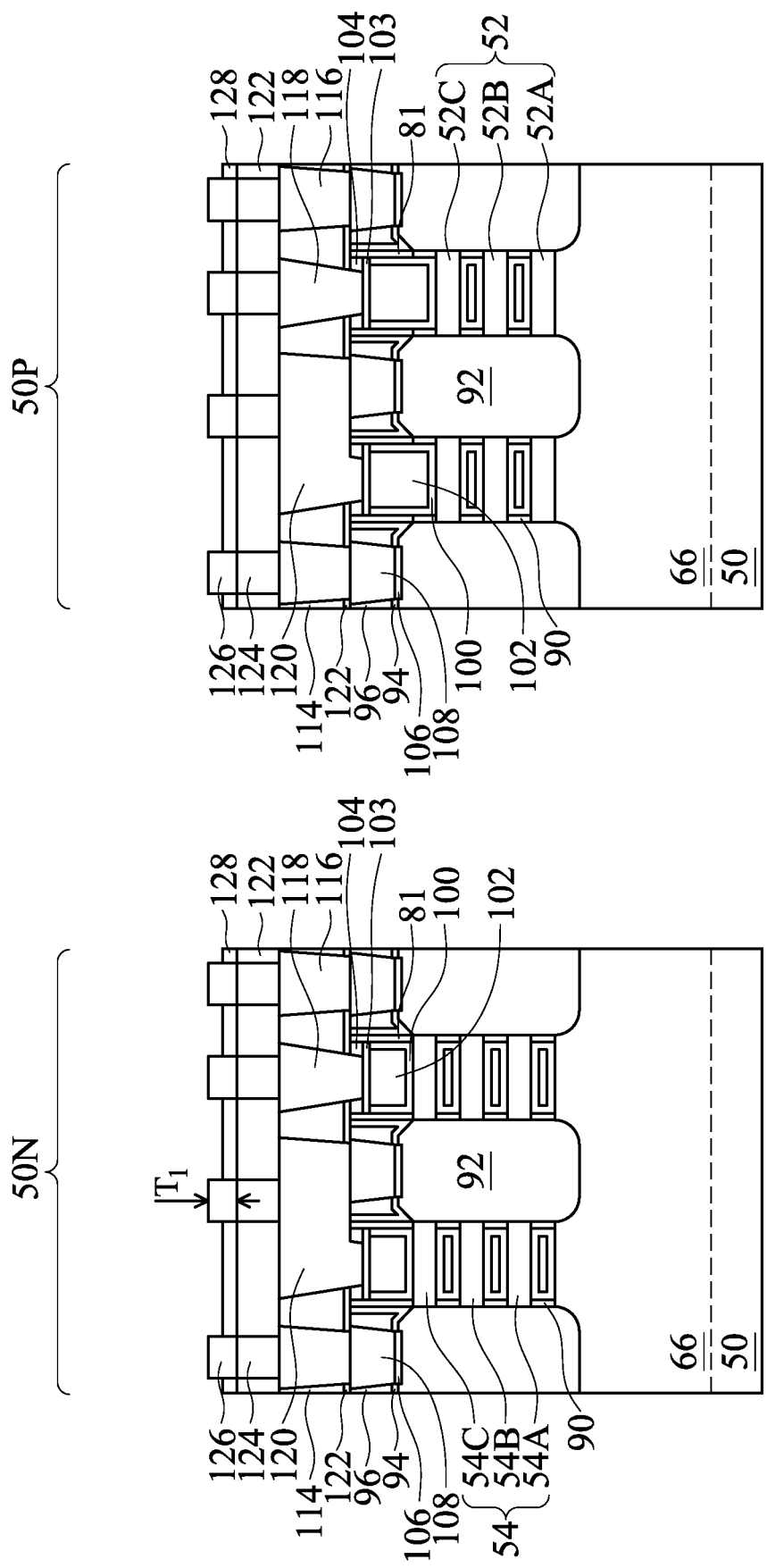

In FIGS. 30A and 30B, the sacrificial material 126 is deposited over the first conductive features 124, adjacent the second dielectric layer 128. In some embodiments, the sacrificial material 126 may be an organic polymer, such as a polyimide (PI), a polyamide, an organosilane, an organophosphonate, or the like. In embodiments in which the sacrificial material 126 comprises a polyimide, the sacrificial material 126 may comprise pyromellitic dianhydride (PMDA, $C_{10}H_2O_6$), 1,6-diaminohexane (hexamethylenediamine, hexane-1,6-diamine, $C_6H_{16}N_2$), combinations thereof, or the like. In embodiments in which the sacrificial material 126 comprises a polyamide, the sacrificial material 126 may comprise ethylenediamine (ethane-1,2-diamine, $C_2H_8N_2$), adipoyl chloride (hexanedioyl dichloride, $C_6H_8Cl_2O_2$), combinations thereof, or the like. In some embodiments, the sacrificial material 126 may comprise dodecylsilane ($C_{12}H_{28}Si$), octadecylphosphonic acid (ODPA, $C_{18}H_{39}O_3P$), or the like. In some embodiments, the sacrificial material 126 may have from 8 carbon atoms to 20 carbon atoms.

The sacrificial material 126 may be deposited by a deposition process that selectively deposits the sacrificial material 126 on metal surfaces of the first conductive features 124, without the sacrificial material 126 being deposited on dielectric surfaces of the first dielectric layer 122 and the second dielectric layer 128. The sacrificial material 126 may be deposited to the thickness $T_1$ ranging from about 25 Å to about 45 Å. As illustrated in FIGS. 30A and 30B, the sacrificial material 126 may be selectively deposited on the first conductive features 124, without being formed on the first dielectric layer 122 or the second dielectric layer 128. Sidewalls of the sacrificial material 126 may be aligned with sidewalls of the first conductive features 124. In some embodiments, the second dielectric layer 128 may extend at least partial onto the first conductive features 124, such that sidewalls of the sacrificial material 126 are disposed laterally inside sidewalls of the first conductive features 124. The sacrificial material 126 may be deposited in a wet deposition process or a dry deposition process. The sacrificial material 126 may be deposited at a temperature ranging from about 40° C. to about 300° C., for a time ranging from about 30 seconds to about 30 minutes, at a dry pressure ranging from about 1 Torr to about 10 Torr. Providing the sacrificial material 126 with a thickness less than the prescribed range may result in a subsequently deposited dielectric material (such as the third dielectric layer 130, discussed below with respect to FIGS. 32A and 32B) extending over the sacrificial material 126, and may lead to increased contact resistance between the first conductive features 124 and subsequently formed conductive features (such as the second conductive features 136, discussed below with respect to FIGS. 33A and 33B). Providing the sacrificial material 126 with a thickness greater than the prescribed range may result in the sacrificial material 126 extending over the second dielectric layer 128, which may result in damage to the second dielectric layer 128 after the sacrificial material 126 is subsequently removed.

Figure 31A:
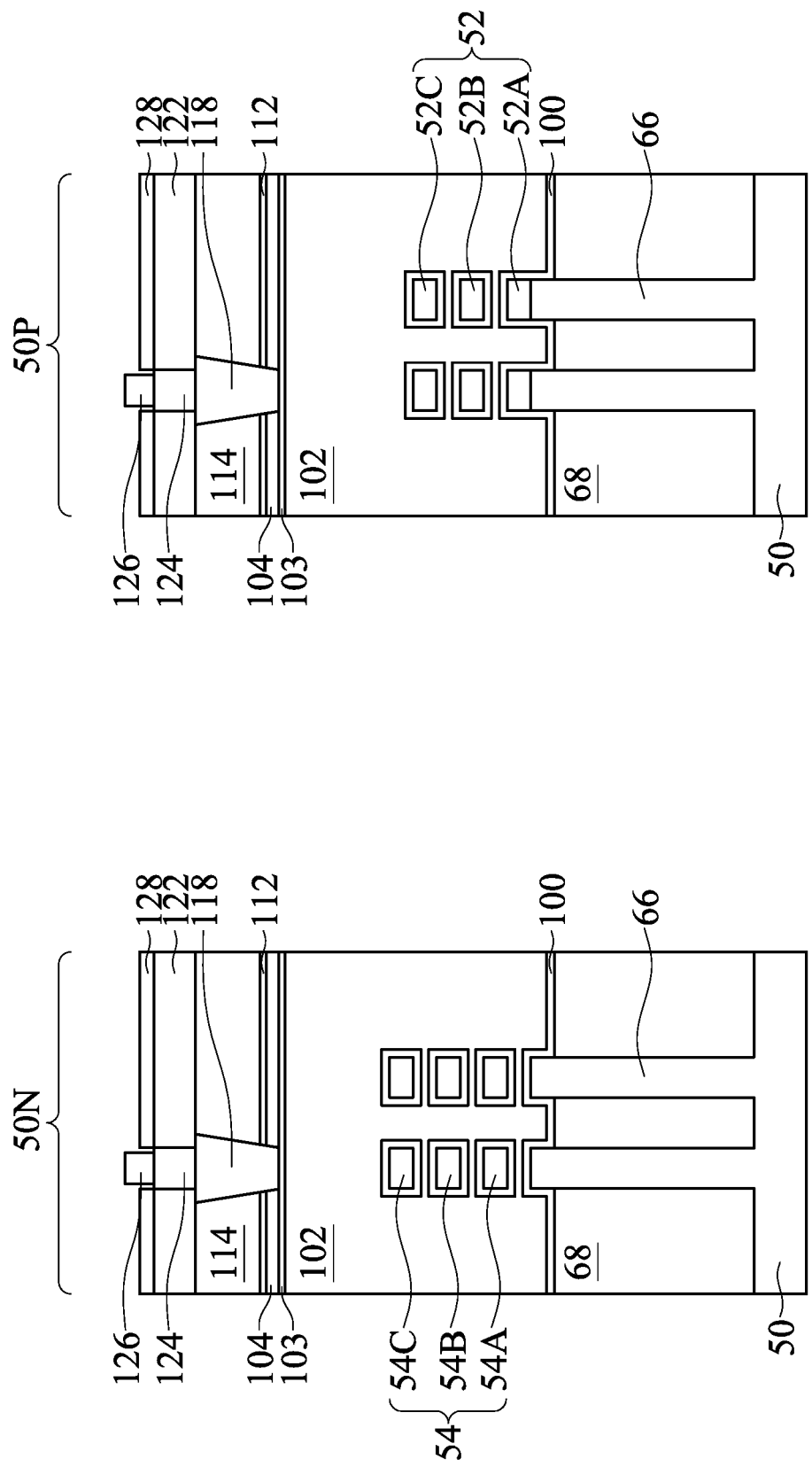
Figure 31B:
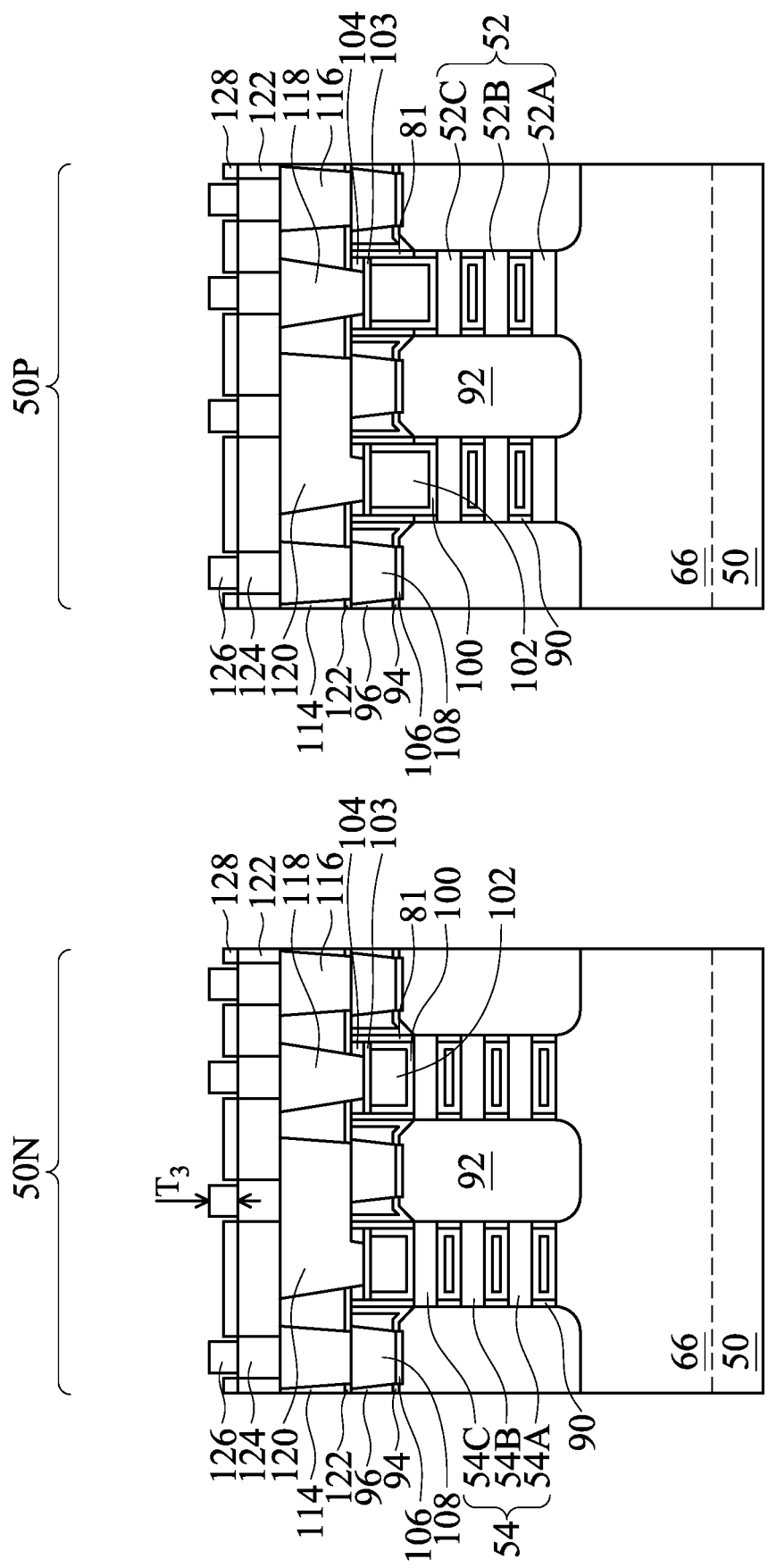

In FIGS. 31A and 31B, the sacrificial material 126 is trimmed. The sacrificial material 126 may be trimmed by a plasma process using, for example, an oxygen plasma. The oxygen plasma may include oxygen radicals (O·) and oxygen ions (O⁻). The oxygen plasma may be formed by flowing a gas, such as oxygen ($O_2$), a mixture of oxygen and nitrogen ($N_2$), nitrous oxide ($N_2O$), nitric oxide (NO), nitrogen oxygen ($N_2O_2$), combinations thereof, or the like, into a plasma generation chamber. The oxygen plasma may react with the sacrificial material 126 according to the following reaction in order to trim the sacrificial material 126:

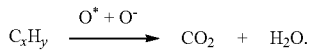

$$C_xH_y \xrightarrow{O^* + O^-} CO_2 + H_2O.$$

The oxygen plasma may penetrate the sacrificial material 126 to different extents based on the film type and density of the sacrificial material 126. The oxygen plasma thereby trims the sacrificial material 126 to different extents depending on the makeup of the sacrificial material 126. For example, in embodiments in which the sacrificial material 126 comprises polyethylene, the oxygen plasma may penetrate into the sacrificial material 126 a distance ranging from about 10 Å to about 40 Å. In embodiments in which the sacrificial material 126 comprises aluminum oxide, the oxygen plasma may penetrate into the sacrificial material 126 a distance ranging from about 10 Å to about 30 Å. The sacrificial material 126 may be trimmed a distance ranging from about 5 Å to about 30 Å depending on the composition of the sacrificial material 126 and the time to which the sacrificial material 126 is exposed to the oxygen plasma. As illustrated in FIGS. 31A and 31B, side surfaces and top surfaces of the sacrificial material 126 may be at least partially exposed to the oxygen plasma, such that the sacrificial material 126 is trimmed from both the side surfaces and the top surfaces. Following the plasma trimming, the sacrificial material 126 may have the thickness $T_3$ ranging from about 20 Å to about 40 Å. Sidewalls of the sacrificial material 126 may be separated from sidewalls of the second dielectric layer 128 and disposed laterally within the sidewalls of the first conductive features 124, as illustrated in FIGS. 31A and 31B. Further, portions of the first conductive features 124 may be exposed between the sacrificial material 126 and the second dielectric layer 128 after trimming the sacrificial material 126.

Figure 32A:
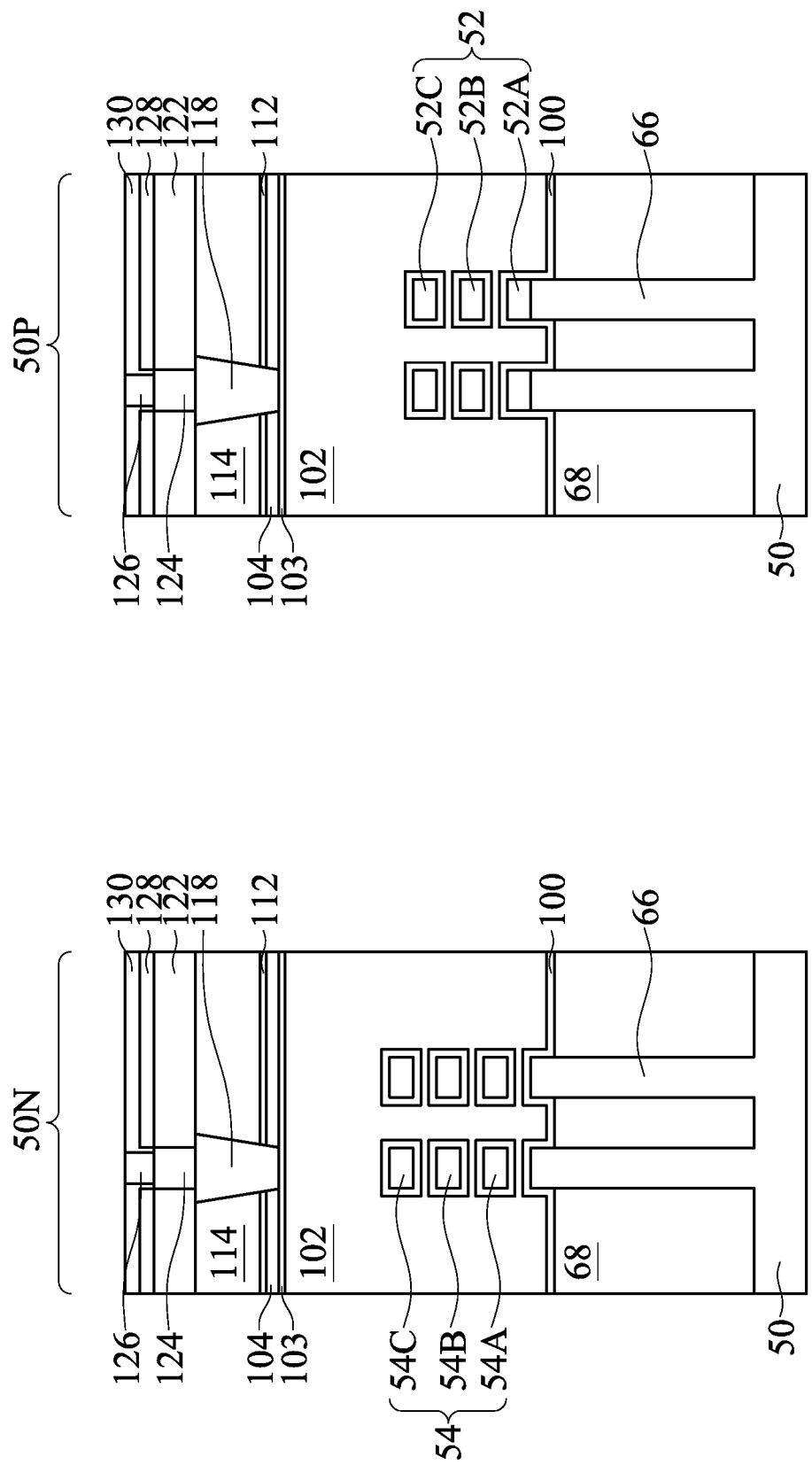
Figure 32B:
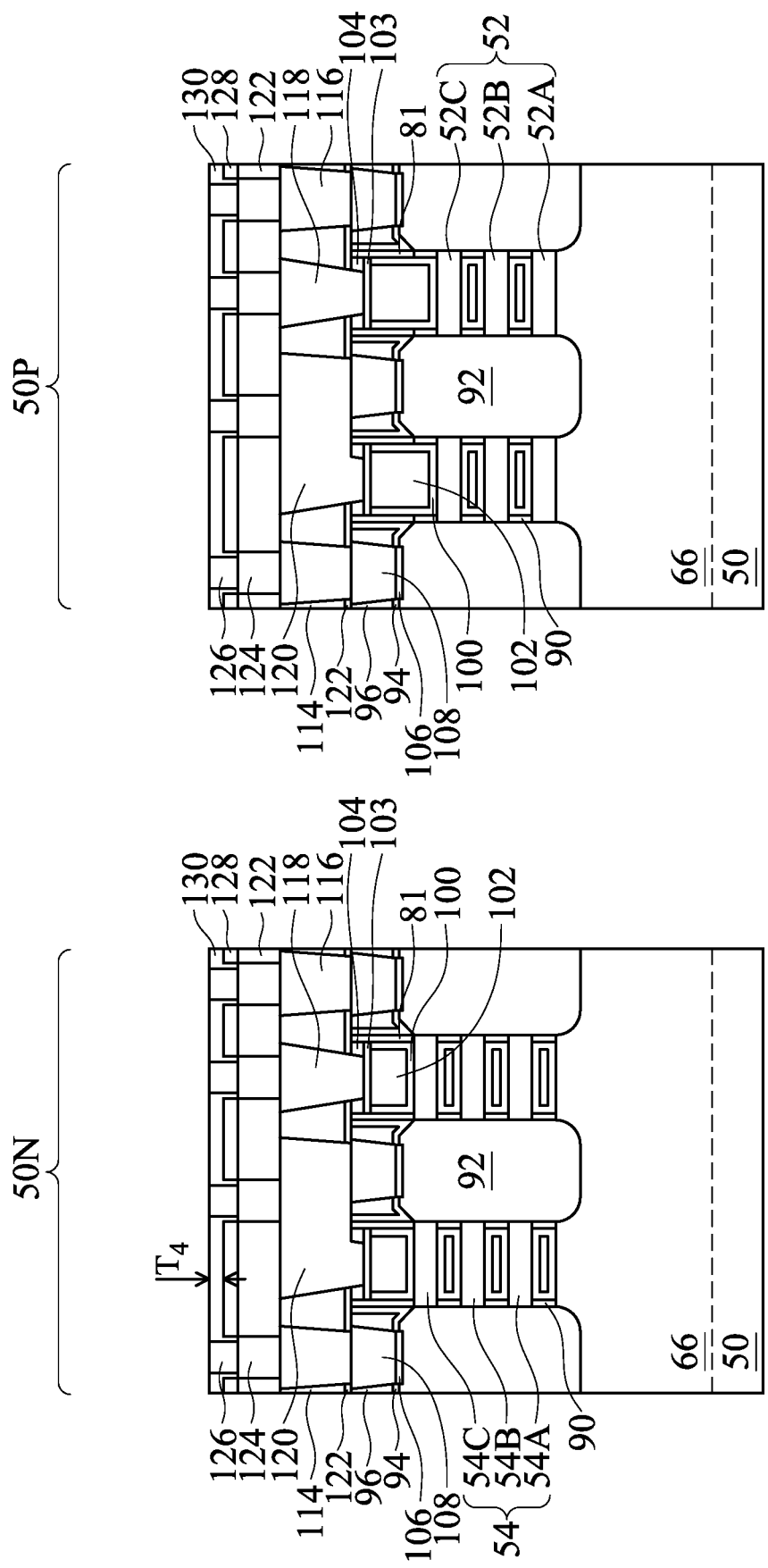

In FIGS. 32A and 32B, a third dielectric layer 130 is deposited over the first conductive features 124 and the second dielectric layer 128, adjacent the sacrificial material 126. In some embodiments, the third dielectric layer 130 may be a dielectric material, such as an oxide or a nitride. In embodiments in which the third dielectric layer 130 is an oxide, the third dielectric layer 130 may comprise aluminum oxide ($Al_2O_3$), silicon dioxide ($SiO_2$), silicon oxygen carbide (SiOC), yttrium oxide ($Y_2O_3$), zirconium oxide ($ZrO_2$), combinations thereof, or the like. In embodiments in which the third dielectric layer 130 is a nitride, the third dielectric layer 130 may comprise silicon nitride (SiN), silicon carbon nitride (SiCN), boron nitride (BN), silicon boron nitride (SiBN), combinations thereof, or the like. The third dielectric layer 130 may comprise a material having a higher k-value than the second dielectric layer 128. For example, the second dielectric layer 128 may have a k-value ranging from about 3 to about 7, while the third dielectric layer 130 may have a k-value ranging from about 3 to about 14.

The third dielectric layer 130 may be deposited by a deposition process that selectively deposits the third dielectric layer 130 on dielectric surfaces of the second dielectric layer 128 and metal surfaces of the first conductive features 124, without the third dielectric layer 130 being deposited on dielectric surfaces of the sacrificial material 126. As illustrated in FIGS. 31A and 31B, the third dielectric layer 130 may be selectively deposited on the second dielectric layer 128 adjacent the sacrificial material 126. The third dielectric layer 130 may be deposited to a thickness $T_4$ ranging from about 5 Å to about 15 Å. The third dielectric layer 130 acts as an etch stop layer in a subsequent etching process used to form openings for metal vias (such as the second conductive features 136, discussed below with respect to FIGS. 32A and 32B). Forming the third dielectric layer 130 to a thickness less than the prescribed range may result in the third dielectric layer 130 being unable to sufficiently perform as an etch stop layer. If the third dielectric layer 130 is formed to a thickness greater than the prescribed range, the third dielectric layer 130 may extend onto the sacrificial material 126, which may inhibit etching of the sacrificial material 126. Because the third dielectric layer 130 has relatively high k-value, forming the third dielectric layer to a thickness greater than the prescribed range may also undesirably increase capacitance, reducing device performance. The third dielectric layer 130 may be deposited in a wet deposition process or a dry deposition process. The third dielectric layer 130 may be deposited at a temperature ranging from about 40° C. to about 300° C., for a time ranging from about 30 seconds to about 30 minutes, at a dry pressure ranging from about 1 Torr to about 10 Torr.

Figure 33A:
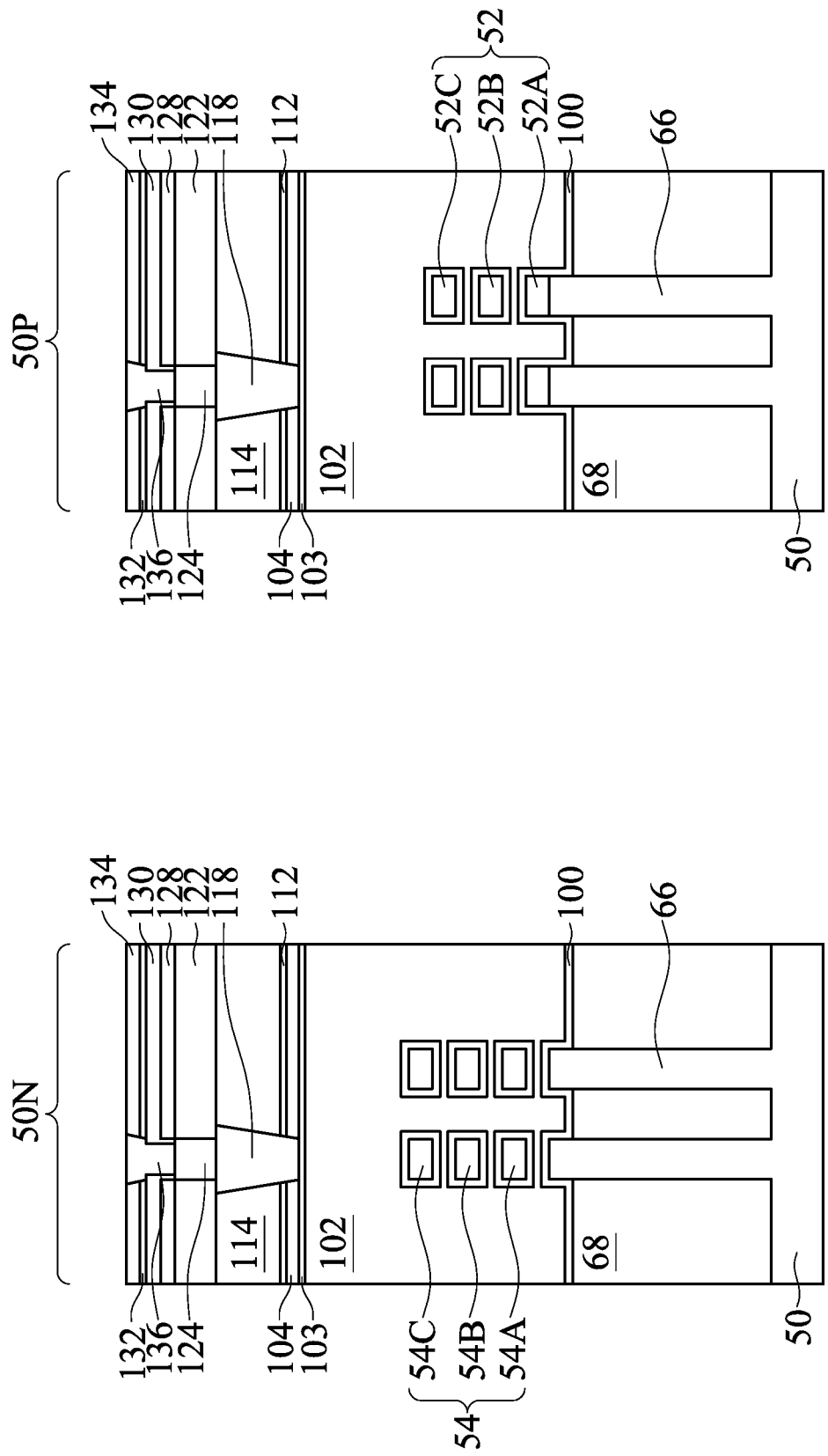
Figure 33B:
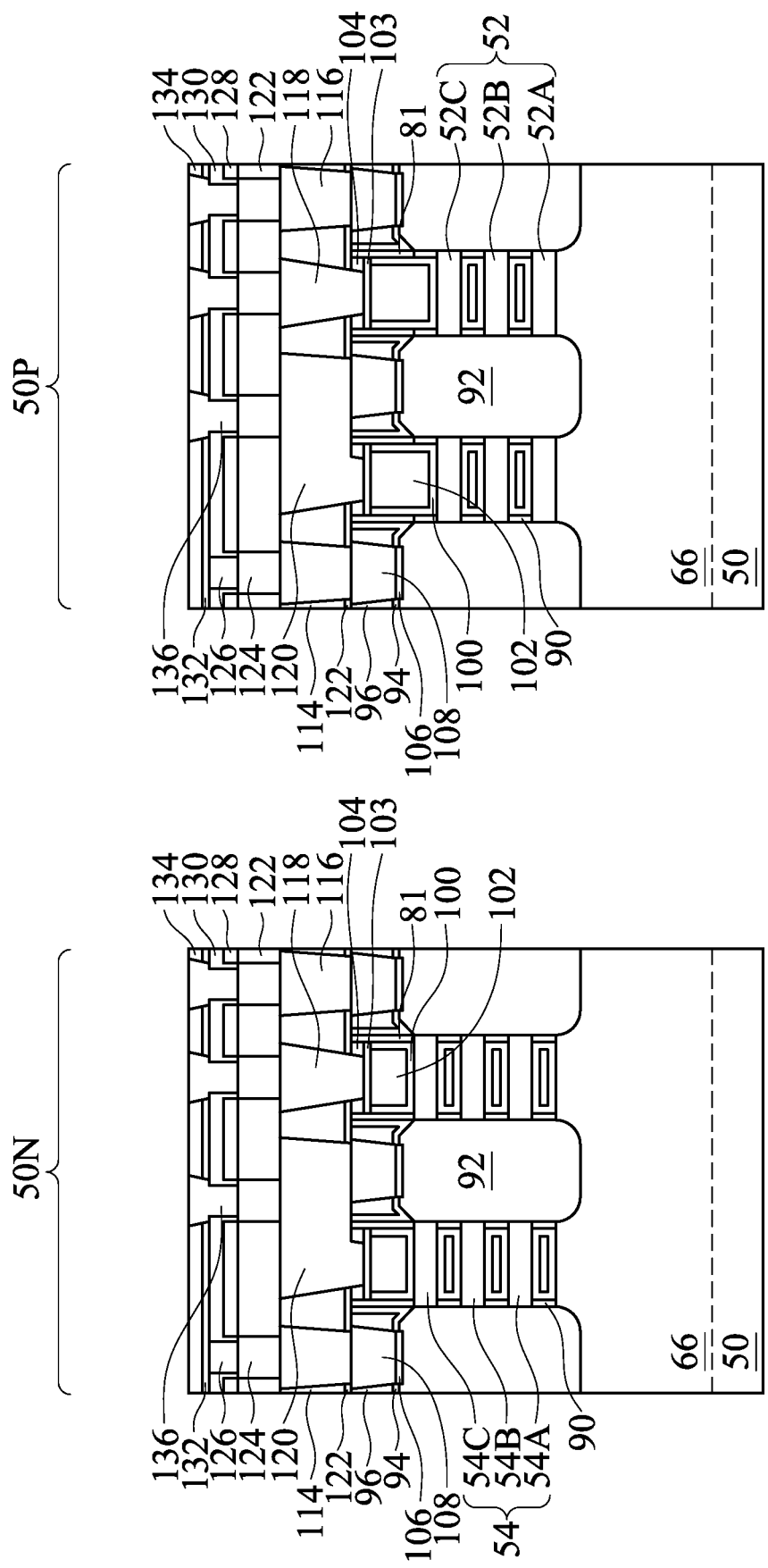

In FIGS. 33A and 33B, the second etch stop layer 132 and the fourth dielectric layer 134 are formed over the third dielectric layer 130 and the sacrificial material 126. The second etch stop layer 132 may comprise a dielectric material, such as, silicon nitride (SiN), silicon oxide ($SiO_2$), silicon oxynitride (SiON), or the like, having a different etch rate than the material of the overlying fourth dielectric layer 134. In some embodiments, the second etch stop layer 132 may include aluminum oxide ($Al_2O_3$), silicon carbon nitride (SiCN), silicon oxygen carbide (SiOC), boron nitride (BN), silicon boron nitride (SiBN), yttrium oxide ($Y_2O_3$), zirconium oxide ($ZrO_2$), combinations or multiple layers thereof, or the like. The second etch stop layer 132 is optional and may be omitted in some embodiments. The fourth dielectric layer 134 may comprise a dielectric material, such as a low-k dielectric material, an extra low-k (ELK) dielectric material, or the like. The fourth dielectric layer 134 may be deposited using an appropriate process, such as, CVD, ALD, PVD, PECVD, or the like. In some embodiments, the fourth dielectric layer 134 may comprise silicon carbon nitride (SiCN), silicon oxygen carbide (SiOC), silicon boron nitride (SiBN), silicon boron carbon nitride (SiBCN), boron nitride (BN), combinations or multiple layers thereof, or the like.

Further in FIGS. 33A and 33B, the fourth dielectric layer 134 and the second etch stop layer 132 are etched through to expose the sacrificial material 126, the sacrificial material 126 is removed, and the second conductive features 136 are formed extending to the first conductive features 124. Openings for the second conductive features 136 are formed through the fourth dielectric layer 134 and the second etch stop layer 132 and stop on the third dielectric layer 130 and the sacrificial material 126. The openings may be formed using acceptable photolithography and etching techniques. As illustrated in FIGS. 33A and 33B, the openings may be formed with widths greater than widths of the sacrificial material 126, and the openings may have tapered shaped which narrow in a direction toward the substrate 50.

The sacrificial material 126 may then be removed. The sacrificial material 126 may be removed by an etching process, such as a wet etch or a dry etch. In some embodiments, the sacrificial material 126 may be removed by a plasma treatment process. The process used to remove the sacrificial material 126 may be selective to material of the sacrificial material 126, such that the fourth dielectric layer 134, the second etch stop layer 132, the third dielectric layer 130, and the first conductive features 124 are relatively un-etched. As illustrated in FIG. 33B, only portions of the sacrificial material 126 may be exposed by the openings formed through the fourth dielectric layer 134 and the second etch stop layer 132, such that portions of the sacrificial material 126 remain. Further, the process used to remove the sacrificial material 126 may be anisotropic, such that only portions of the sacrificial material 126 exposed by the openings formed through the fourth dielectric layer 134 and the second etch stop layer 132 are removed.

In some embodiments, the sacrificial material 126 may be removed using processes the same as or similar to the processes used to trim the sacrificial material 126, discussed above with respect to FIGS. 31A and 31B. For example, the sacrificial material 126 may be removed by a plasma process using an oxygen plasma. The oxygen plasma may include oxygen radicals (O·) and oxygen ions ($O^-$). The oxygen plasma may be formed by flowing a gas, such as oxygen ($O_2$), a mixture of oxygen and nitrogen ($N_2$), nitrous oxide ($N_2O$), nitric oxide (NO), nitrogen oxygen ($N_2O_2$), combinations thereof, or the like, into a plasma generation chamber. The oxygen plasma may react with the sacrificial material 126 according to the following reaction in order to remove the sacrificial material 126:

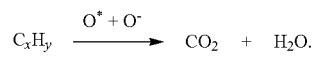

After the sacrificial material 126 is removed, the second conductive features 136 are formed in the openings formed by etching the fourth dielectric layer 134 and the second etch stop layer 132 and removing the sacrificial material 126. The second conductive features 136 may comprise conductive vias. The second conductive features 136 may include an optional diffusion barrier layer, an optional liner layer, and/or an optional adhesion layer, which may be deposited and the openings may then be filled with a conductive material. Suitable materials for the diffusion barrier layer include titanium, titanium nitride, titanium oxide, tantalum, tantalum nitride, tantalum oxide, combinations thereof, or the like; suitable materials for the liner layer include cobalt, ruthenium, combinations thereof, or the like; and suitable materials for the conductive material include copper, silver, gold, tungsten, aluminum, cobalt, ruthenium, molybdenum, combinations thereof, or the like. In an embodiment, the second conductive features 136 may be formed by depositing a seed layer of copper or a copper alloy, and filling the trenches by electroplating. A CMP process or the like may be used to remove excess conductive material from a surface of the fourth dielectric layer 134 and to planarize surfaces of the fourth dielectric layer 134 and the second conductive features 136 for subsequent processing. The second conductive features 136 may be electrically coupled to the gate structures and/or the epitaxial source/drain regions 92 through the first conductive features 124, the second source/drain contacts 116, the gate contacts 118, and the butted contacts 120.

Forming the second dielectric layer 128, the sacrificial material 126, and the third dielectric layer 130 in the self-aligned manner, as described above, and replacing the sacrificial material 126 with the second conductive features 136 improves the alignment of the second conductive features 136 with respect to the first conductive features 124. This helps to reduce RC delay and reduce electromigration issues in completed devices. Further, removing the sacrificial material 126 using the high selectivity processes described above prevents damage to the third dielectric layer 130, the second dielectric layer 128, and the first dielectric layer 122, which reduces time-dependent dielectric breakdown and stress migration. Forming the second dielectric layer 128 of a lower-k material and the third dielectric layer 130 of a material having good etch stop properties lowers parasitic capacitance of the structure including both the second dielectric layer 128 and the third dielectric layer 130, while the third dielectric layer 130 still functions as an effective etch stop layer. As such, the above-described methods may be used to improve device performance and reduce device defects.

Figure 34A:
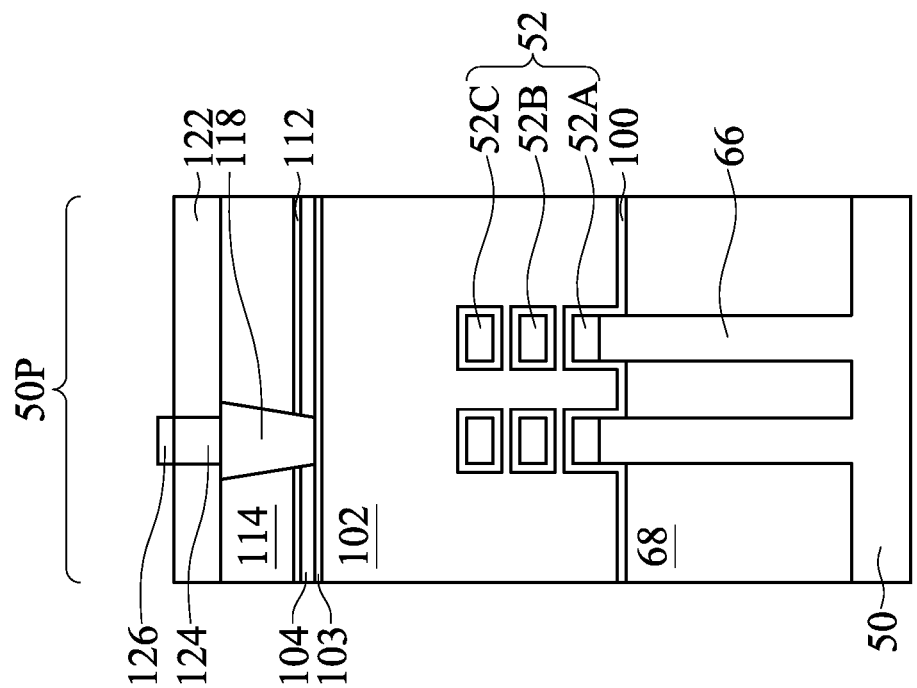
Figure 34A:
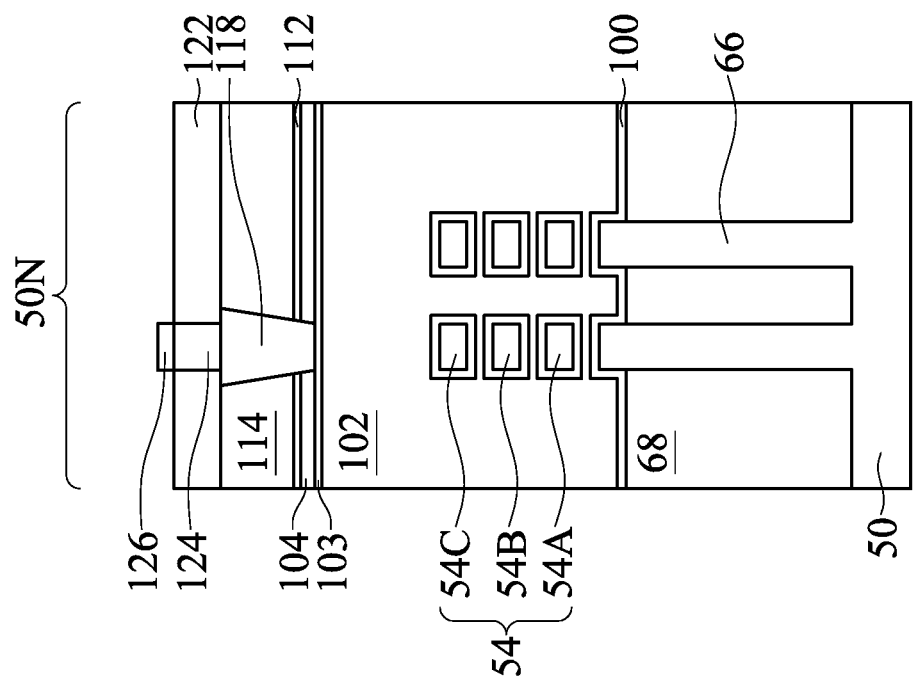

FIGS. 34A through 41B illustrate embodiments in which the sacrificial material 126 and the second dielectric layer 128 are formed before selectively depositing the third dielectric layer 130. In FIGS. 34A and 34B, the sacrificial material 126 is deposited over the first conductive features 124. In some embodiments, the sacrificial material 126 may be an organic polymer, such as a polyimide (PI), a polyamide, an organosilane, an organophosphonate, or the like. In embodiments in which the sacrificial material 126 comprises a polyimide, the sacrificial material 126 may comprise pyromellitic dianhydride (PMDA, $C_{10}H_2O_6$), 1,6-diaminohexane (hexamethylenediamine, hexane-1,6-diamine, $C_6H_{16}N_2$), combinations thereof, or the like. In embodiments in which the sacrificial material 126 comprises a polyamide, the sacrificial material 126 may comprise ethylenediamine (ethane-1,2-diamine, $C_2H_8N_2$), adipoyl chloride (hexanedioyl dichloride, $C_6H_8Cl_2O_2$), combinations thereof, or the like. In some embodiments, the sacrificial material 126 may comprise dodecylsilane ($C_{12}H_{28}Si$), octadecylphosphonic acid (ODPA, $C_{18}H_{39}O_3P$), or the like. In some embodiments, the sacrificial material 126 may have from 8 carbon atoms to 20 carbon atoms.

Figure 34B:
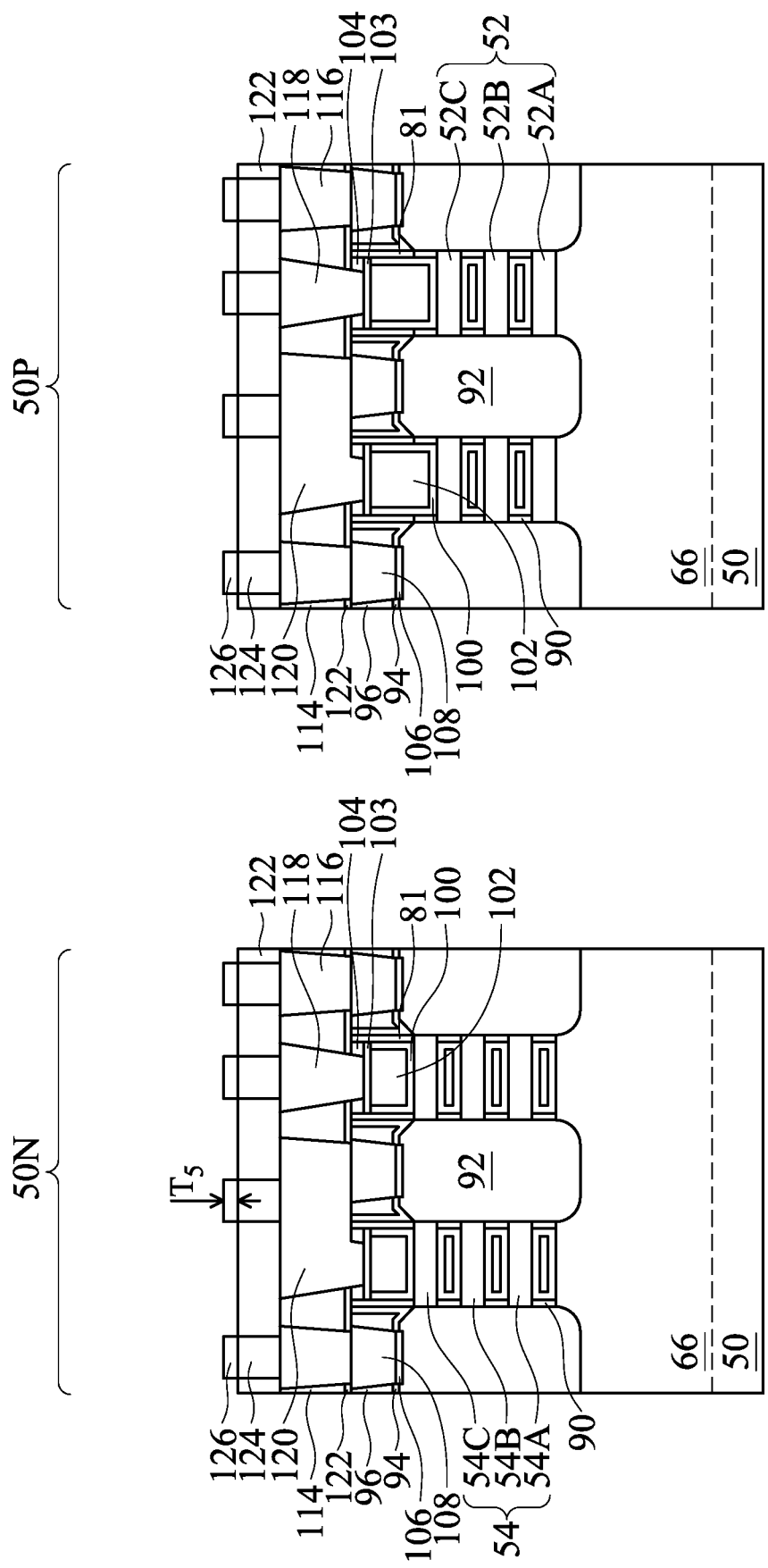

The sacrificial material 126 may be deposited by a deposition process that selectively deposits the sacrificial material 126 on metal surfaces of the first conductive features 124, without the sacrificial material 126 being deposited on dielectric surfaces of the first dielectric layer 122. The sacrificial material 126 may be deposited to a thickness $T_5$ ranging from about 25 Å to about 45 Å. As illustrated in FIGS. 34A and 34B, the sacrificial material 126 may be selectively deposited on the first conductive features 124 such that side surfaces of the sacrificial material 126 are aligned with side surfaces of the first conductive features 124. The sacrificial material 126 may be deposited in a wet deposition process or a dry deposition process. The sacrificial material 126 may be deposited at a temperature ranging from about 40° C. to about 300° C., for a time ranging from about 30 seconds to about 30 minutes, at a dry pressure ranging from about 1 Torr to about 10 Torr. Providing the sacrificial material 126 with a thickness less than the prescribed range may provide insufficient inhibition to prevent subsequently deposited dielectric materials (such as the second dielectric layer 128, discussed below with respect to FIGS. 35A and 35B, and the third dielectric layer 130, discussed below with respect to FIGS. 36A and 36B) from being deposited on the first conductive features 124. This may result in the subsequently deposited dielectric materials being deposited over the first conductive features 124 and may increase contact resistance between the first conductive features 124 and subsequently formed conductive features (such as the second conductive features 136, discussed below with respect to FIGS. 39A and 39B). Providing the sacrificial material 126 with a thickness greater than the prescribed range may result in the sacrificial material 126 extending over the first dielectric layer 122, which may result in damage to the first dielectric layer 122 after the sacrificial material 126 is subsequently removed.

Figure 35A:
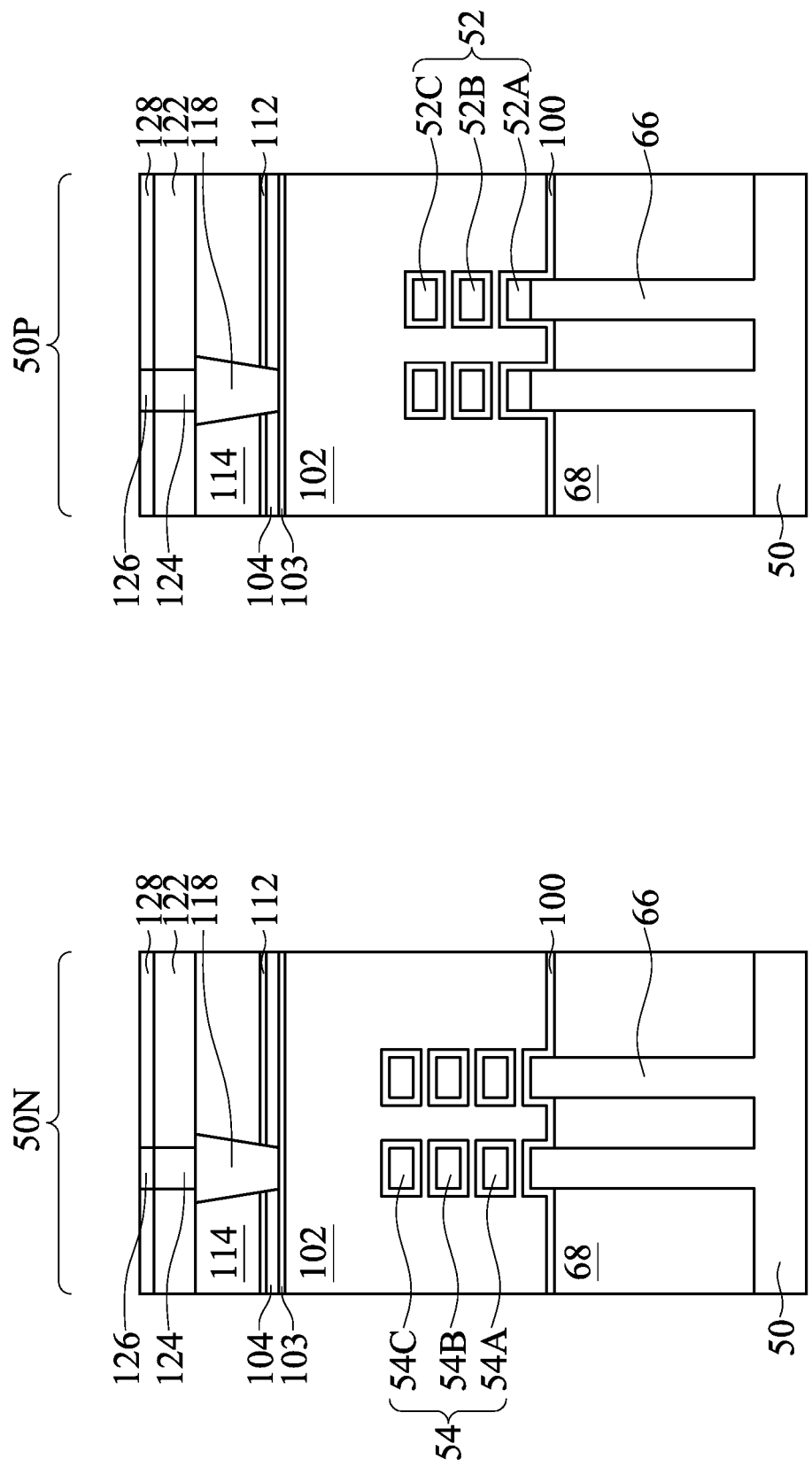
Figure 35B:
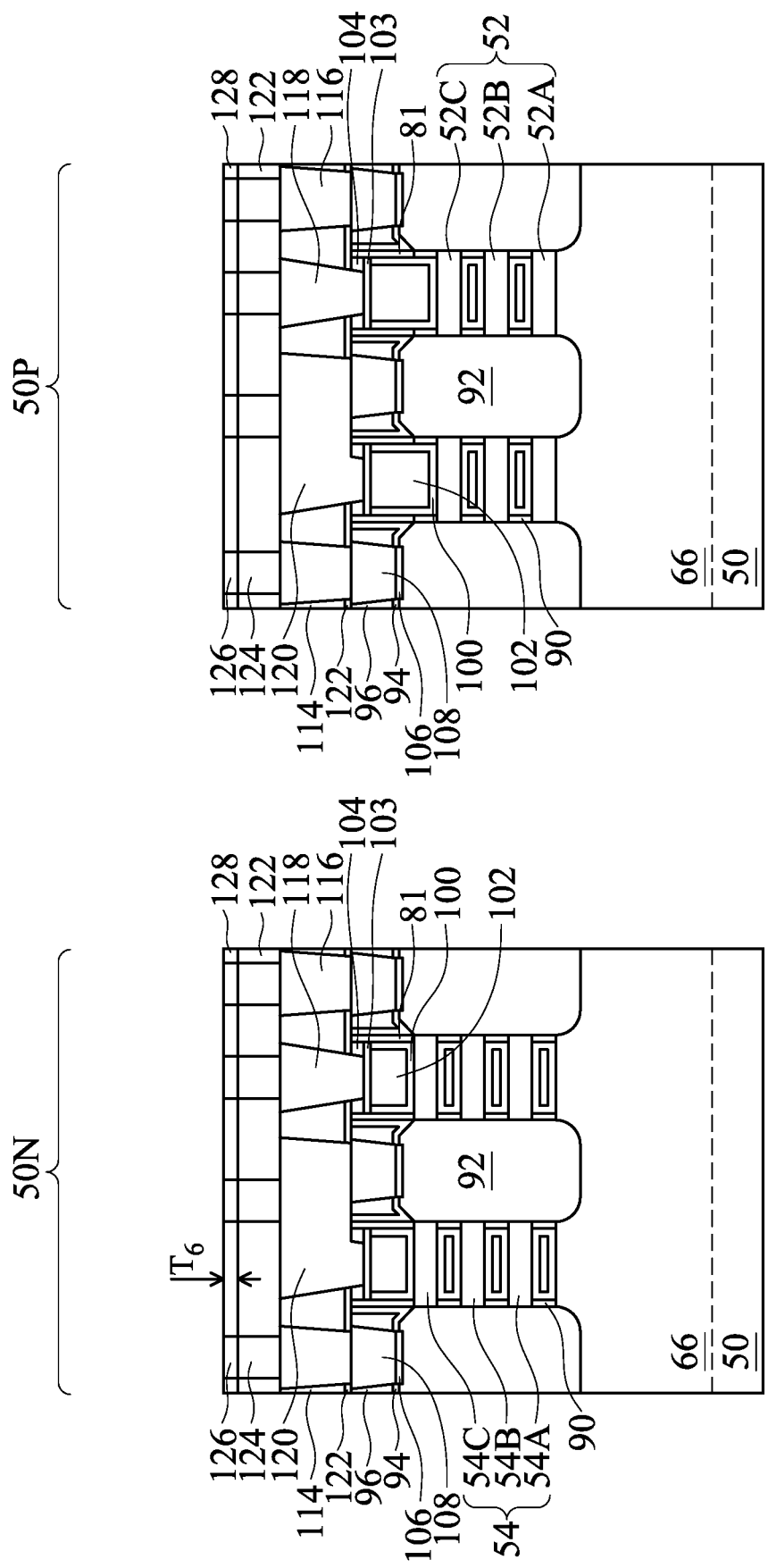

In FIGS. 35A and 35B, the second dielectric layer 128 is deposited over the first dielectric layer 122, adjacent the sacrificial material 126. In some embodiments, the second dielectric layer 128 may be a dielectric material, such as an oxide or a nitride. In embodiments in which the second dielectric layer 128 is an oxide, the second dielectric layer 128 may comprise aluminum oxide ($Al_2O_3$), silicon dioxide ($SiO_2$), silicon oxygen carbide (SiOC), yttrium oxide ($Y_2O_3$), zirconium oxide ($ZrO_2$), combinations thereof, or the like. In embodiments in which the second dielectric layer 128 is a nitride, the second dielectric layer 128 may comprise silicon nitride (SiN), silicon carbon nitride (SiCN), silicon boron nitride (SiBN), silicon boron carbon nitride (SiBCN), boron nitride (BN), combinations thereof, or the like.

The second dielectric layer 128 may be deposited by a deposition process that selectively deposits the second dielectric layer 128 on dielectric surfaces of the first dielectric layer 122, without the second dielectric layer 128 being deposited on metal surfaces of the first conductive features 124 or dielectric surfaces of the sacrificial material 126. As illustrated in FIGS. 35A and 35B, the second dielectric layer 128 may be selectively deposited on the first dielectric layer 122 adjacent the sacrificial material 126. The second dielectric layer 128 may be deposited to a thickness $T_6$ ranging from about 10 Å to about 30 Å. Although the second dielectric layer 128 is illustrated as having top surfaces level with top surfaces of the sacrificial material 126, top surfaces of the second dielectric layer 128 may be disposed above or below top surfaces of the sacrificial material 126. Forming the second dielectric layer 128 with a thickness less than the prescribed range may result in a higher-k material formed over the second dielectric layer 128 (such as the third dielectric layer 130, discussed below with respect to 36A and 36B) being formed to a greater thickness, which undesirably increases capacitance. Further, the higher-k material may be an etch stop layer, and forming the second dielectric layer 128 with a thickness greater than the prescribed range may result in the higher-k material being formed to a lesser thickness, which does not sufficiently perform as an etch stop layer. The second dielectric layer 128 may be deposited in a wet deposition process or a dry deposition process. The second dielectric layer 128 may be deposited at a temperature ranging from about 40° C. to about 300° C., for a time ranging from about 30 seconds to about 30 minutes, at a dry pressure ranging from about 1 Torr to about 10 Torr.

Figure 36A:
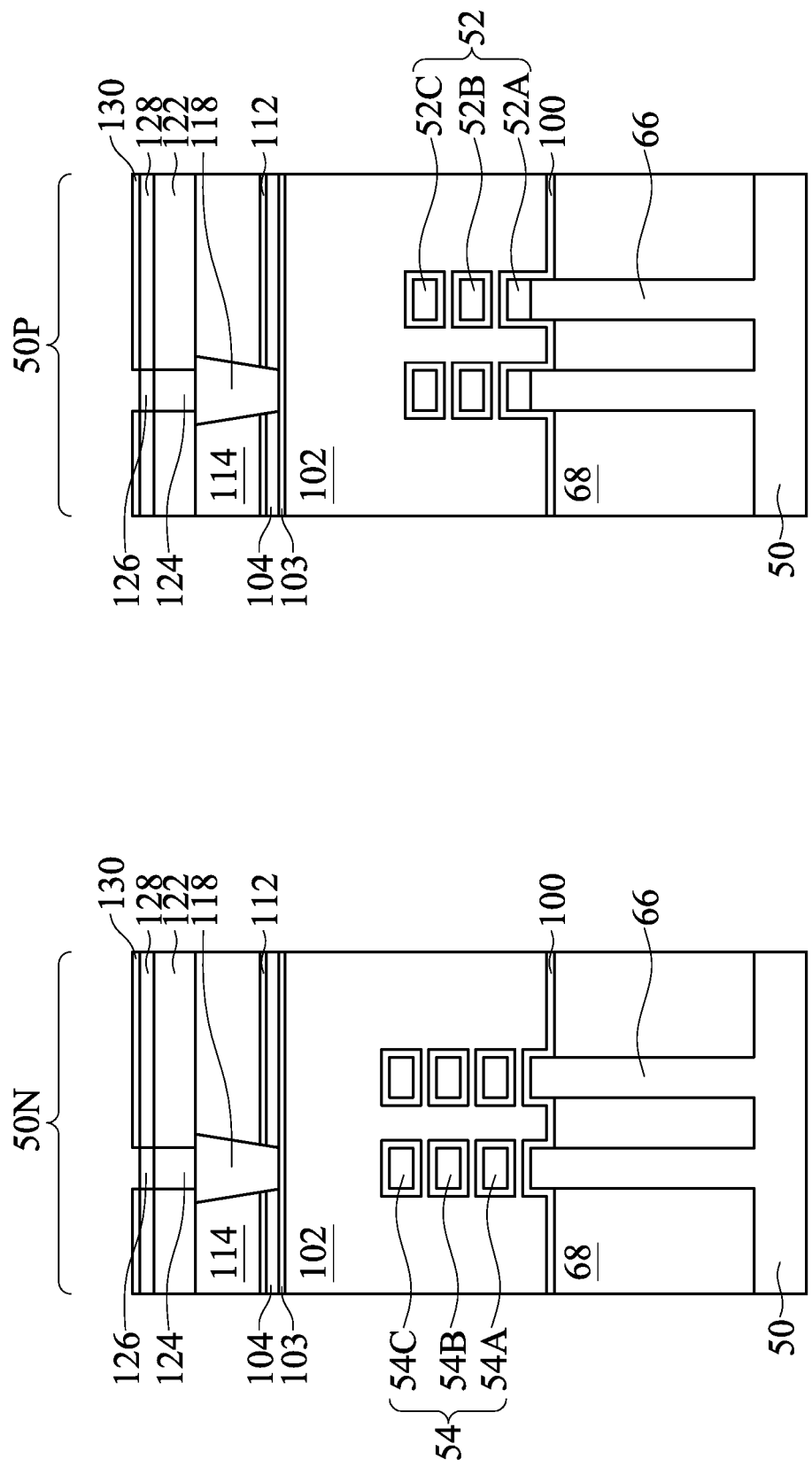
Figure 36B:
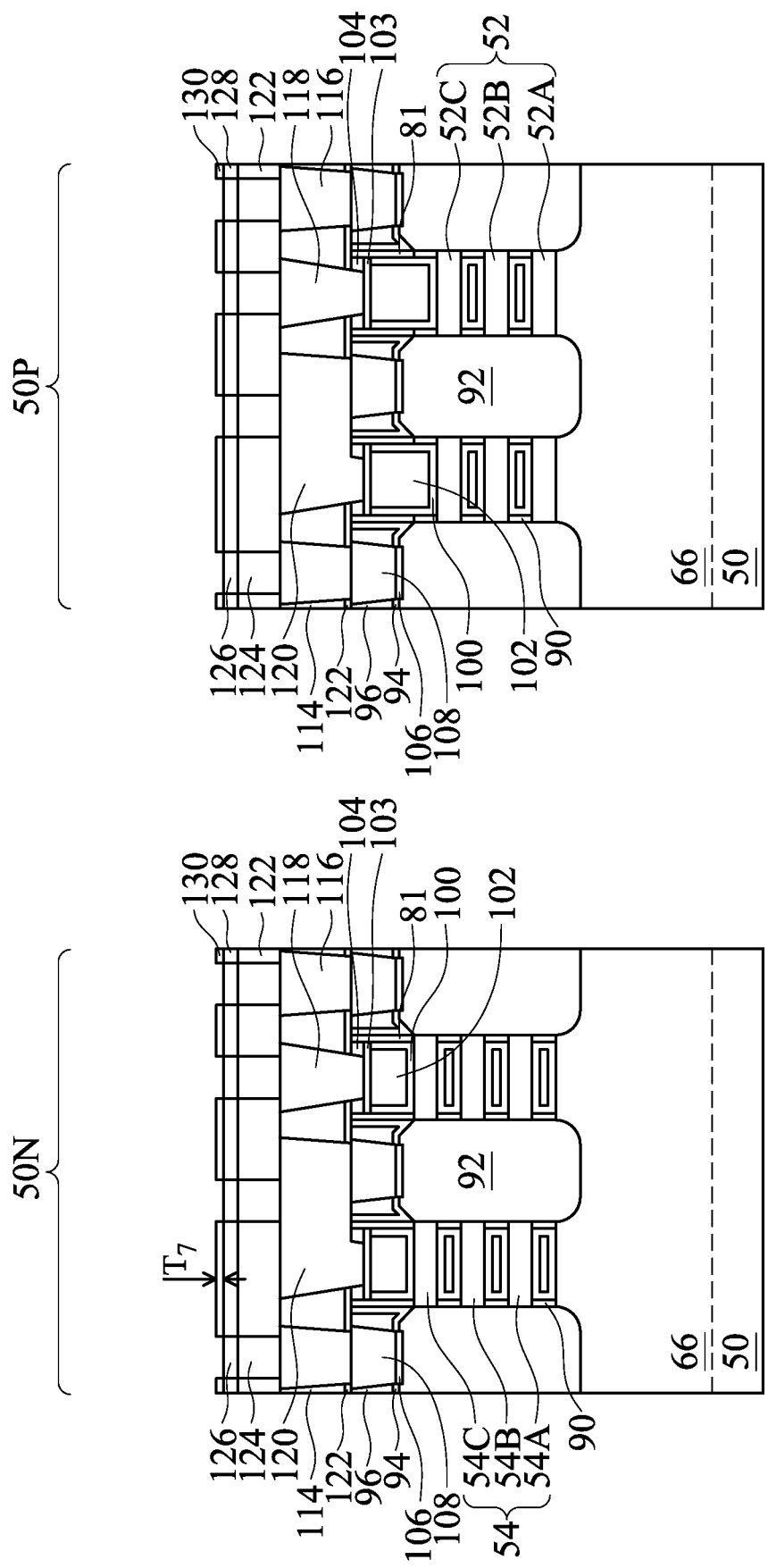

In FIGS. 36A and 36B, the third dielectric layer 130 is deposited over the second dielectric layer 128. In some embodiments, the third dielectric layer 130 may be a dielectric material, such as an oxide or a nitride. In embodiments in which the third dielectric layer 130 is an oxide, the third dielectric layer 130 may comprise aluminum oxide ($Al_2O_3$), silicon dioxide ($SiO_2$), silicon oxygen carbide (SiOC), yttrium oxide ($Y_2O_3$), zirconium oxide ($ZrO_2$), combinations thereof, or the like. In embodiments in which the third dielectric layer 130 is a nitride, the third dielectric layer 130 may comprise silicon nitride (SiN), silicon carbon nitride (SiCN), boron nitride (BN), silicon boron nitride (SiBN), combinations thereof, or the like. The third dielectric layer 130 may comprise a material having a higher k-value than the second dielectric layer 128. For example, the second dielectric layer 128 may have a k-value ranging from about 3 to about 7, while the third dielectric layer 130 may have a k-value ranging from about 3 to about 14.

The third dielectric layer 130 may be deposited by a deposition process that selectively deposits the third dielectric layer 130 on dielectric surfaces of the second dielectric layer 128, without the third dielectric layer 130 being deposited on dielectric surfaces of the sacrificial material 126. As illustrated in FIGS. 36A and 36B, the third dielectric layer 130 may be selectively deposited on the second dielectric layer 128 adjacent the sacrificial material 126, without being deposited on the sacrificial material 126. The third dielectric layer 130 may be deposited to a thickness $T_7$ ranging from about 10 Å to about 30 Å. The third dielectric layer 130 acts as an etch stop layer in a subsequent etching process used to form openings for metal vias (such as the second conductive features 136, discussed below with respect to FIGS. 39A and 39B). Forming the third dielectric layer 130 to a thickness less than the prescribed range may result in the third dielectric layer 130 being unable to sufficiently perform as an etch stop layer. If the third dielectric layer 130 is formed to a thickness greater than the prescribed range, the third dielectric layer 130 may extend onto the sacrificial material 126, which may inhibit etching of the sacrificial material 126. Because the third dielectric layer 130 has relatively high k-value, forming the third dielectric layer to a thickness greater than the prescribed range may also undesirably increase capacitance, reducing device performance. The third dielectric layer 130 may be deposited in a wet deposition process or a dry deposition process. The third dielectric layer 130 may be deposited at a temperature ranging from about 40° C. to about 300° C., for a time ranging from about 30 seconds to about 30 minutes, at a dry pressure ranging from about 1 Torr to about 10 Torr.

Figure 37A:
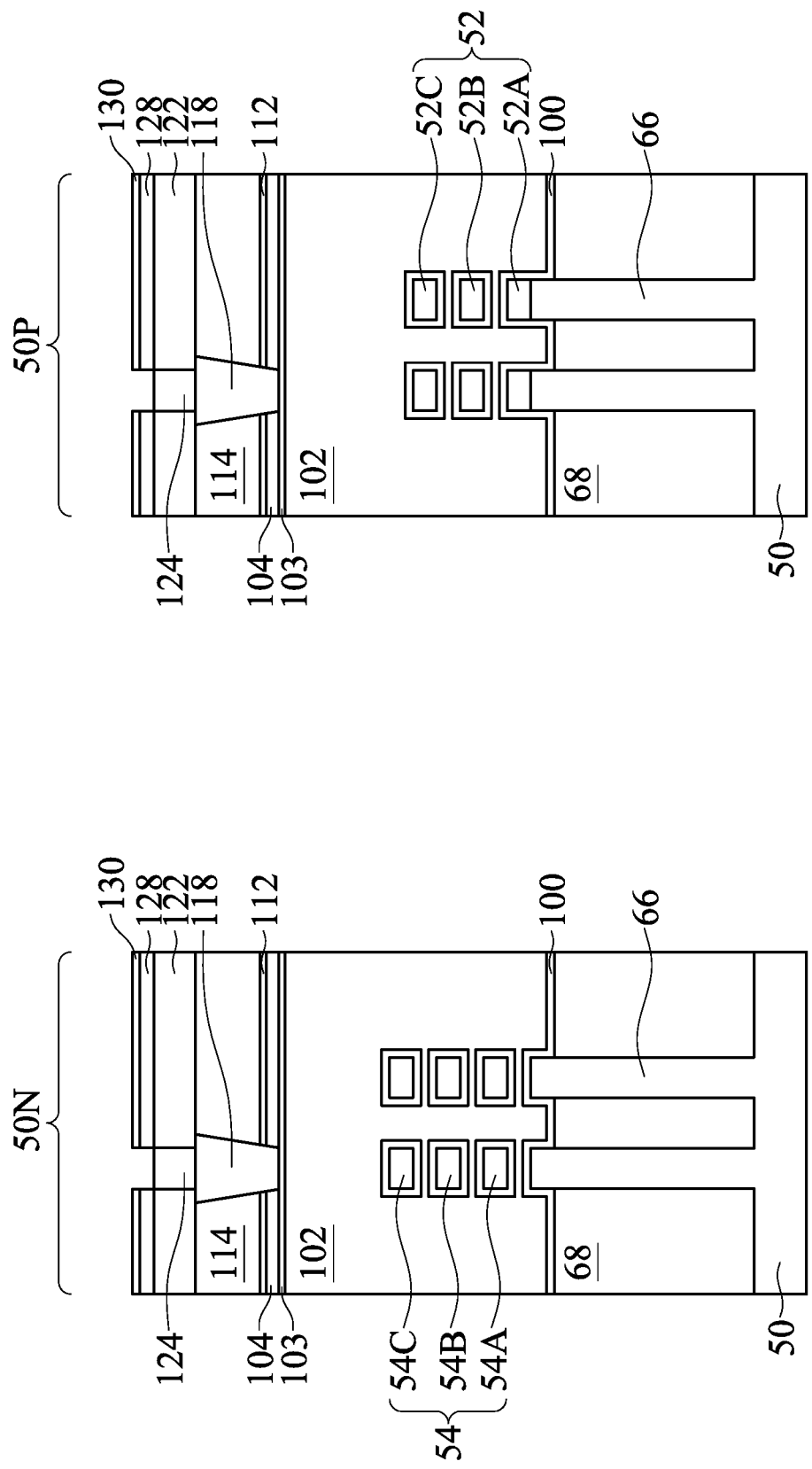
Figure 37B:
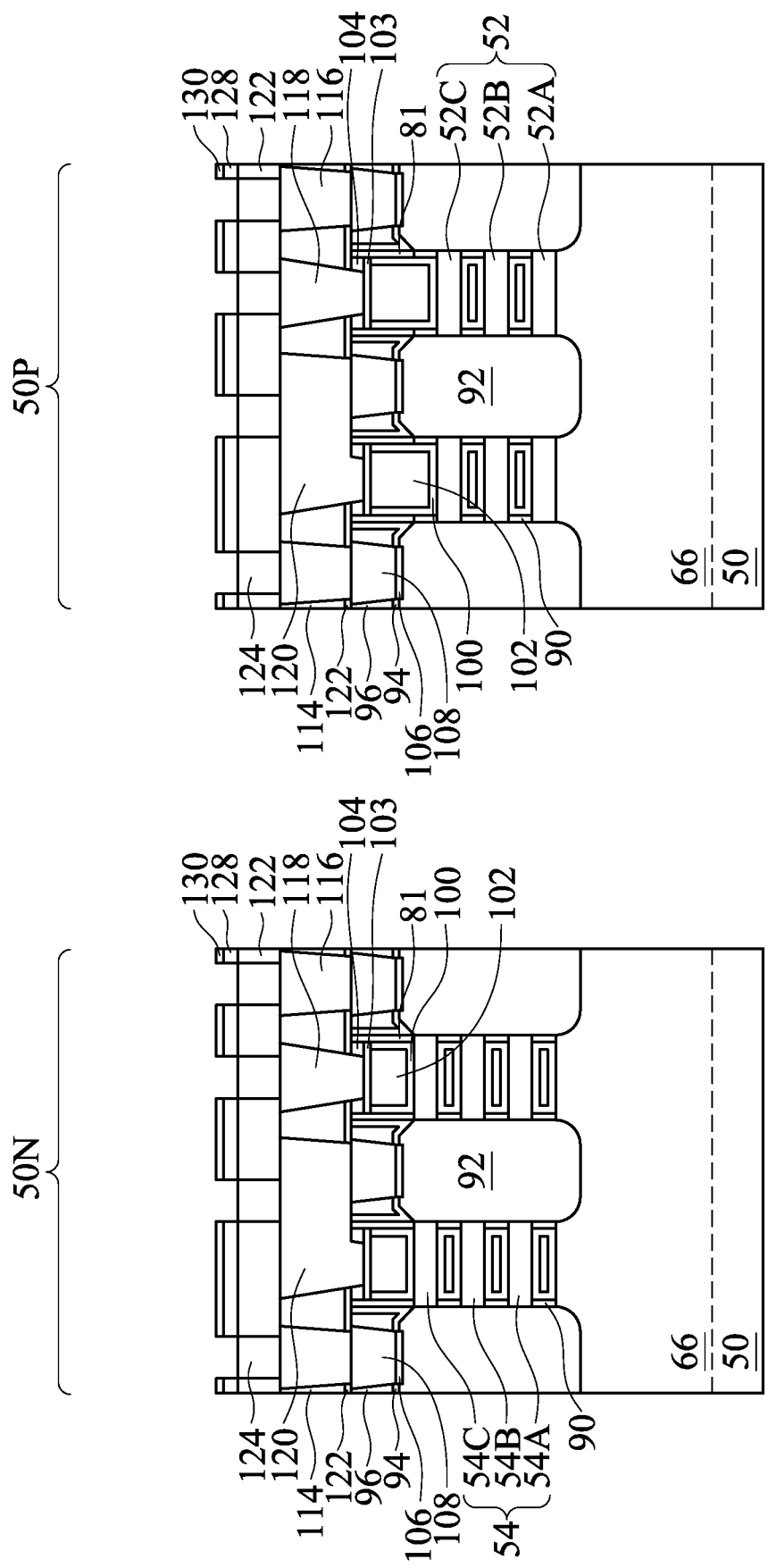

In FIGS. 37A and 37B, the sacrificial material 126 is removed exposing surfaces of the first conductive features 124. The sacrificial material 126 may be removed by an etching process, such as a wet etch or a dry etch. In some embodiments, the sacrificial material 126 may be removed by a plasma treatment process. The process used to remove the sacrificial material 126 may be selective to material of the sacrificial material 126, such that the third dielectric layer 130, the second dielectric layer 128, and the first conductive features 124 are relatively un-etched. In some embodiments, the sacrificial material 126 may be removed by a plasma process using an oxygen plasma. The oxygen plasma may include oxygen radicals (O·) and oxygen ions (O⁻). The oxygen plasma may be formed by flowing a gas, such as oxygen ($O_2$), a mixture of oxygen and nitrogen ($N_2$), nitrous oxide ($N_2O$), nitric oxide (NO), nitrogen oxygen ($N_2O_2$), combinations thereof, or the like, into a plasma generation chamber. The oxygen plasma may react with the sacrificial material 126 according to the following reaction in order to remove the sacrificial material 126:

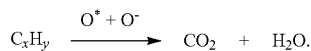

After the sacrificial material 126 is removed, side surfaces of the third dielectric layer 130 and the second dielectric layer 128 may be aligned with side surfaces of the first dielectric layer 122.

Figure 38A:
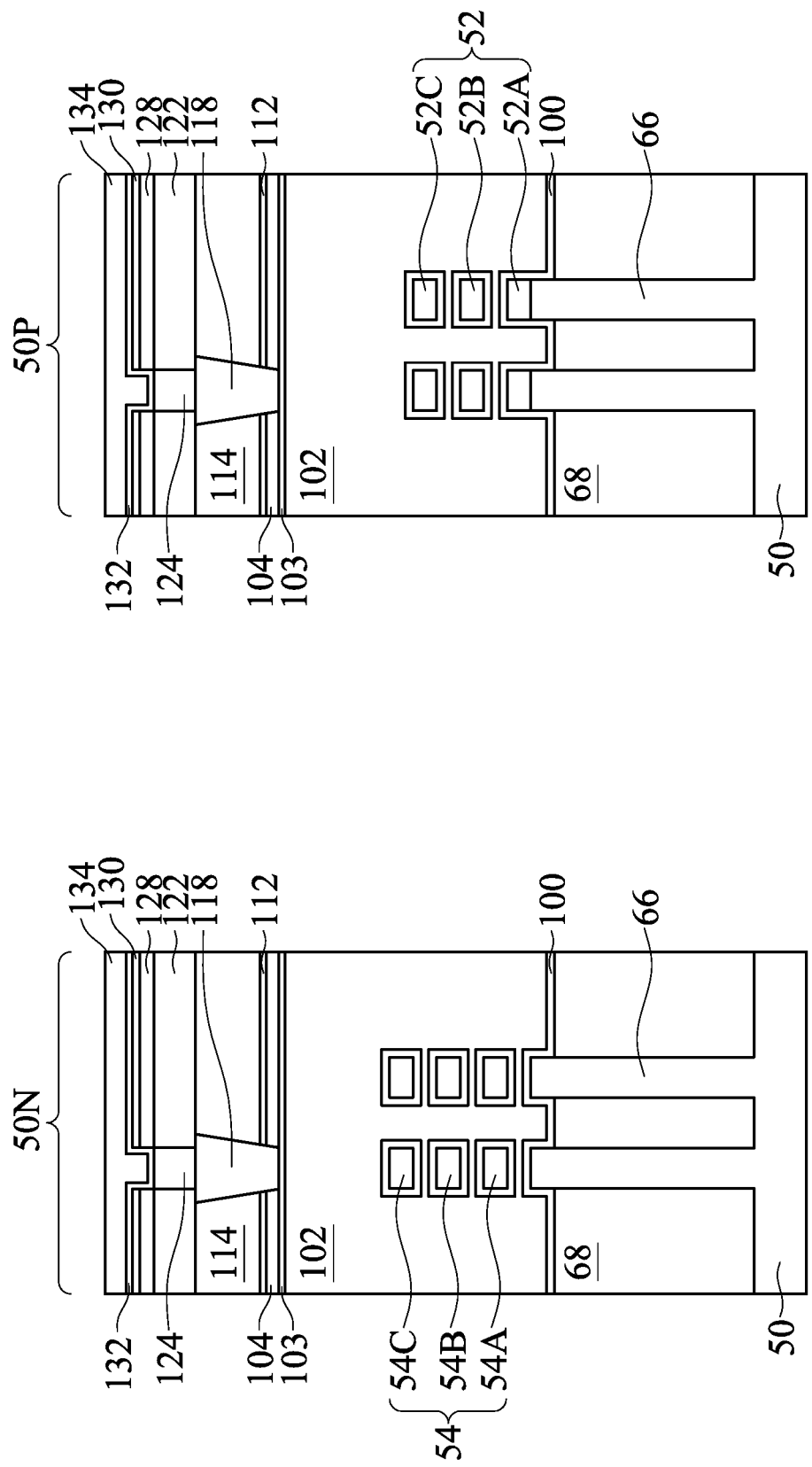
Figure 38B:
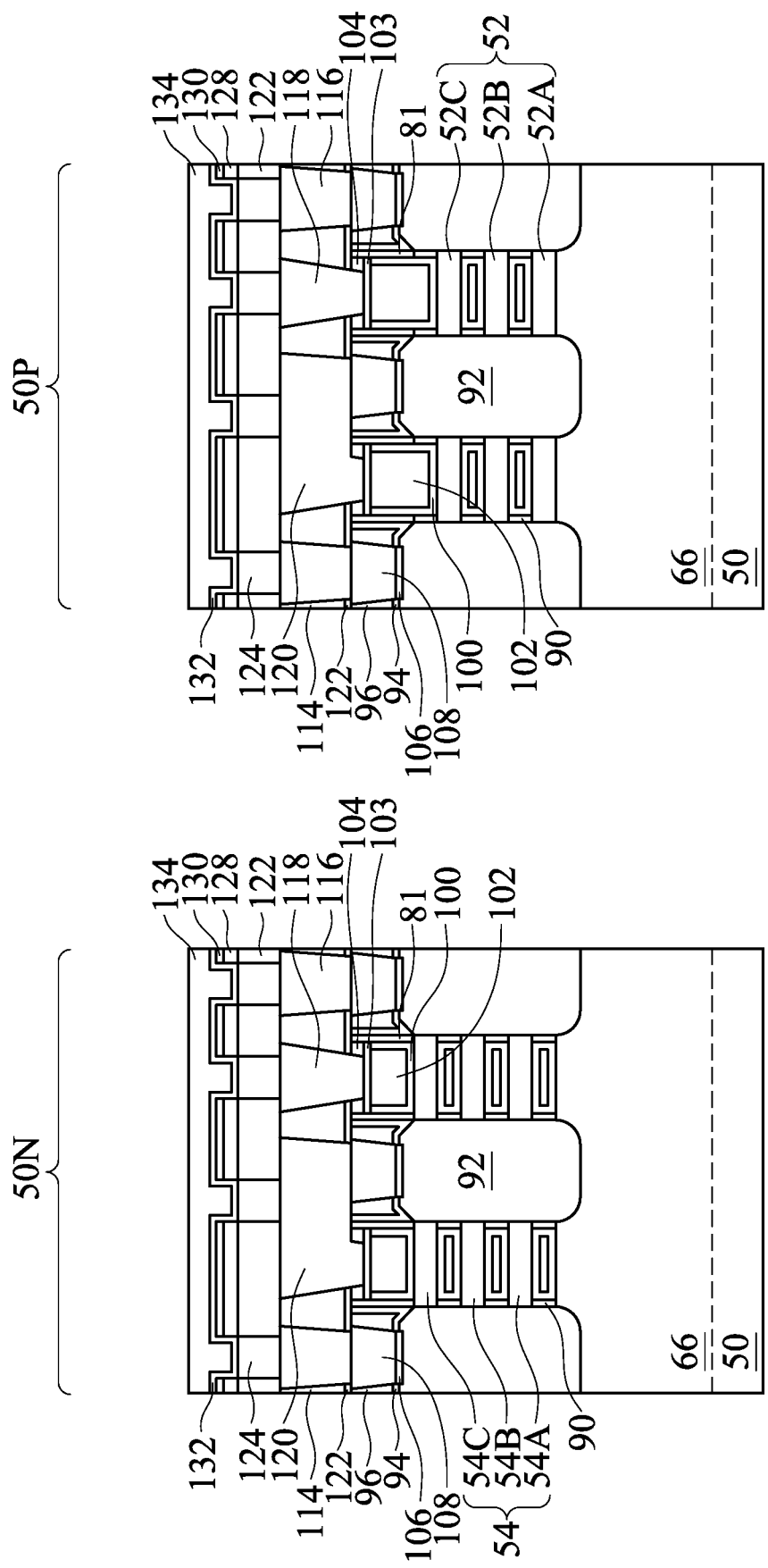

In FIGS. 38A and 38B, the second etch stop layer 132 and the fourth dielectric layer 134 are formed over the third dielectric layer 130, the second dielectric layer 128, and the first conductive features 124. The second etch stop layer 132 may comprise a dielectric material, such as, silicon nitride (SiN), silicon oxide ($SiO_2$), silicon oxynitride (SiON), or the like, having a different etch rate than the material of the overlying fourth dielectric layer 134. In some embodiments, the second etch stop layer 132 may include aluminum oxide ($Al_2O_3$), silicon carbon nitride (SiCN), silicon oxygen carbide (SiOC), boron nitride (BN), silicon boron nitride (SiBN), yttrium oxide ($Y_2O_3$), zirconium oxide ($ZrO_2$), combinations or multiple layers thereof, or the like. The fourth dielectric layer 134 may comprise a dielectric material, such as a low-k dielectric material, an extra low-k (ELK) dielectric material, or the like. The fourth dielectric layer 134 may be deposited using an appropriate process, such as, CVD, ALD, PVD, PECVD, or the like. In some embodiments, the fourth dielectric layer 134 may comprise silicon carbon nitride (SiCN), silicon oxygen carbide (SiOC), silicon boron nitride (SiBN), silicon boron carbon nitride (SiBCN), boron nitride (BN), combinations or multiple layers thereof, or the like.

Figure 39A:
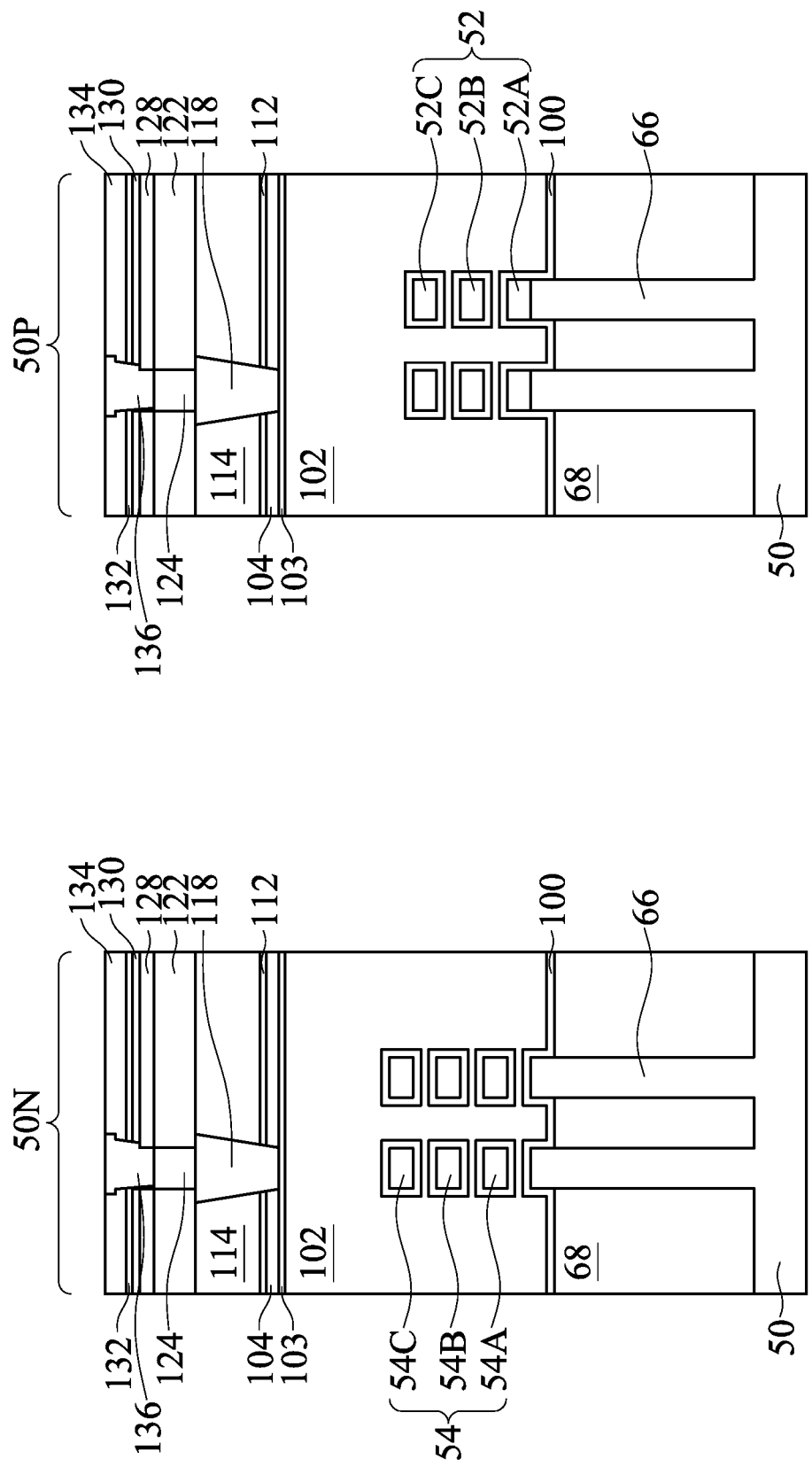
Figure 39B:
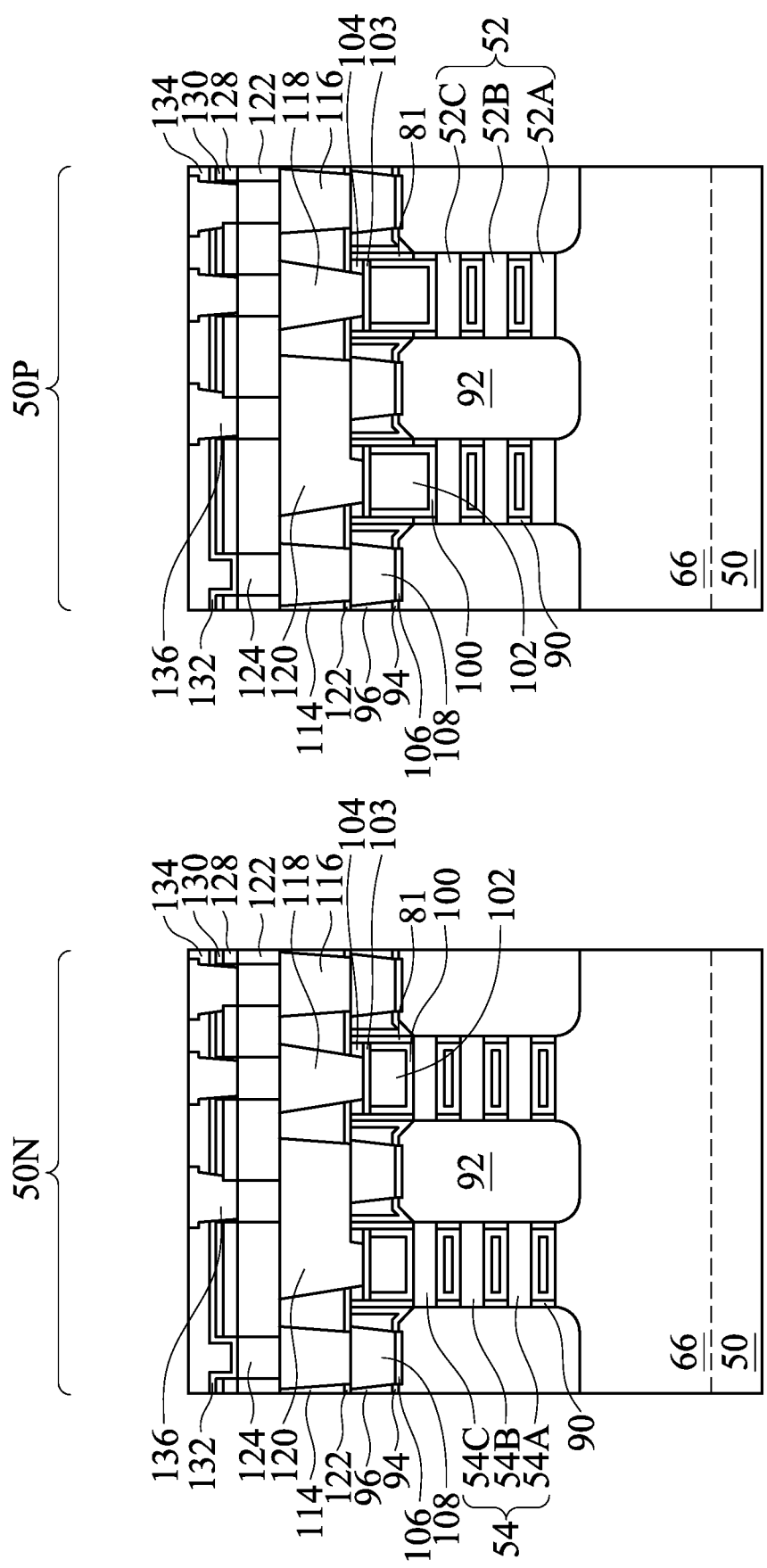

In FIGS. 39A and 39B, the second conductive features 136 are formed extending through the fourth dielectric layer 134 and the second etch stop layer 132 to the first conductive features 124. In some embodiments, the fourth dielectric layer 134 and the second etch stop layer 132 are etched through to expose the first conductive features 124. The fourth dielectric layer 134 and the second etch stop layer 132 may be etched through to form openings which stop on the first conductive features 124. In some embodiments, the third dielectric layer 130 may also be etched, such that the openings stop on the second dielectric layer 128. The openings may be formed using acceptable photolithography and etching techniques. The etching techniques used to form the openings may be selective to materials of the fourth dielectric layer 134, the second etch stop layer 132 and the third dielectric layer 130, such that the second dielectric layer 128 and the first conductive features 124 remain relatively un-etched after forming the openings. As illustrated in FIGS. 39A and 39B, the openings may be formed with widths greater than widths of the sacrificial material 126, and the openings may have tapered shaped which narrow in a direction toward the substrate 50. In some embodiments, portions of the openings, such as upper portions, may have straight vertical side surfaces, while other portions of the openings, such as lower portions, may have tapered side surfaces. The openings may extend along side surfaces of the fourth dielectric layer 134, the second etch stop layer 132, the third dielectric layer 130, and the second dielectric layer 128. Because the etching techniques used to form the openings are selective to the materials of the fourth dielectric layer 134, the second etch stop layer 132, and the third dielectric layer 130, damage to the second dielectric layer 128 and the first dielectric layer 122 from the etching techniques is avoided.

After the openings are formed, the second conductive features 136 are formed in the openings. The second conductive features 136 may comprise conductive vias. The second conductive features 136 may include an optional diffusion barrier layer, an optional liner layer, and/or an optional adhesion layer, which may be deposited and the openings may then be filled with a conductive material. Suitable materials for the diffusion barrier layer include titanium, titanium nitride, titanium oxide, tantalum, tantalum nitride, tantalum oxide, combinations thereof, or the like; suitable materials for the liner layer include cobalt, ruthenium, combinations thereof, or the like; and suitable materials for the conductive material include copper, silver, gold, tungsten, aluminum, cobalt, ruthenium, molybdenum, combinations thereof, or the like. In an embodiment, the second conductive features 136 may be formed by depositing a seed layer of copper or a copper alloy, and filling the trenches by electroplating. A CMP process or the like may be used to remove excess conductive material from a surface of the fourth dielectric layer 134 and to planarize surfaces of the fourth dielectric layer 134 and the second conductive features 136 for subsequent processing. The second conductive features 136 may be electrically coupled to the gate structures and/or the epitaxial source/drain regions 92 through the first conductive features 124, the second source/drain contacts 116, the gate contacts 118, and the butted contacts 120.

Forming the sacrificial material 126, the second dielectric layer 128, and the third dielectric layer 130 in the self-aligned manner, as described above, and replacing the sacrificial material 126 with the second conductive features 136 improves the alignment of the second conductive features 136 with respect to the first conductive features 124. This helps to reduce RC delay and reduce electromigration issues in completed devices. Further, removing the sacrificial material 126 using the high selectivity processes described above prevents damage to the second dielectric layer 128 and the first dielectric layer 122, which reduces time-dependent dielectric breakdown and stress migration. Forming the second dielectric layer 128 of a lower-k material and the third dielectric layer 130 of a material having good etch stop properties lowers parasitic capacitance of the structure including both the second dielectric layer 128 and the third dielectric layer 130, while the third dielectric layer 130 still functions as an effective etch stop layer. As such, the above-described methods may be used to improve device performance and reduce device defects.

Figure 40A:
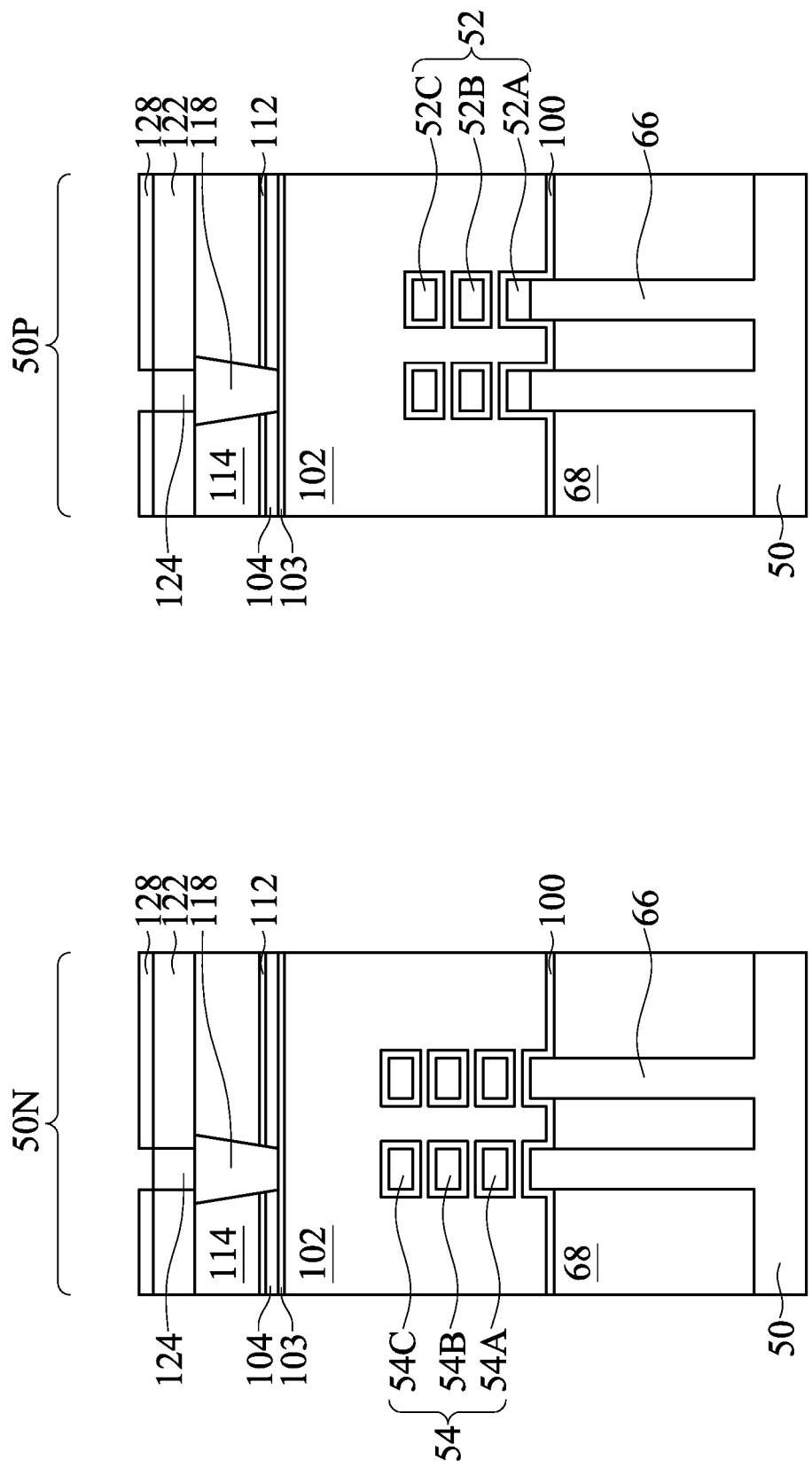

FIGS. 40A through 41B illustrate an embodiment in which the second dielectric layer 128 is formed before the sacrificial material 126. In FIGS. 40A and 40B, the second dielectric layer 128 is deposited over the first dielectric layer 122. In some embodiments, the second dielectric layer 128 may be a dielectric material, such as an oxide or a nitride. In embodiments in which the second dielectric layer 128 is an oxide, the second dielectric layer 128 may comprise aluminum oxide ($Al_2O_3$), silicon dioxide ($SiO_2$), silicon oxycarbide (SiOC), yttrium oxide ($Y_2O_3$), zirconium oxide ($ZrO_2$), combinations thereof, or the like. In embodiments in which the second dielectric layer 128 is a nitride, the second dielectric layer 128 may comprise silicon nitride (SiN), silicon carbon nitride (SiCN), silicon boron nitride (SiBN), silicon boron carbon nitride (SiBCN), boron nitride (BN), combinations thereof, or the like.

Figure 40B:
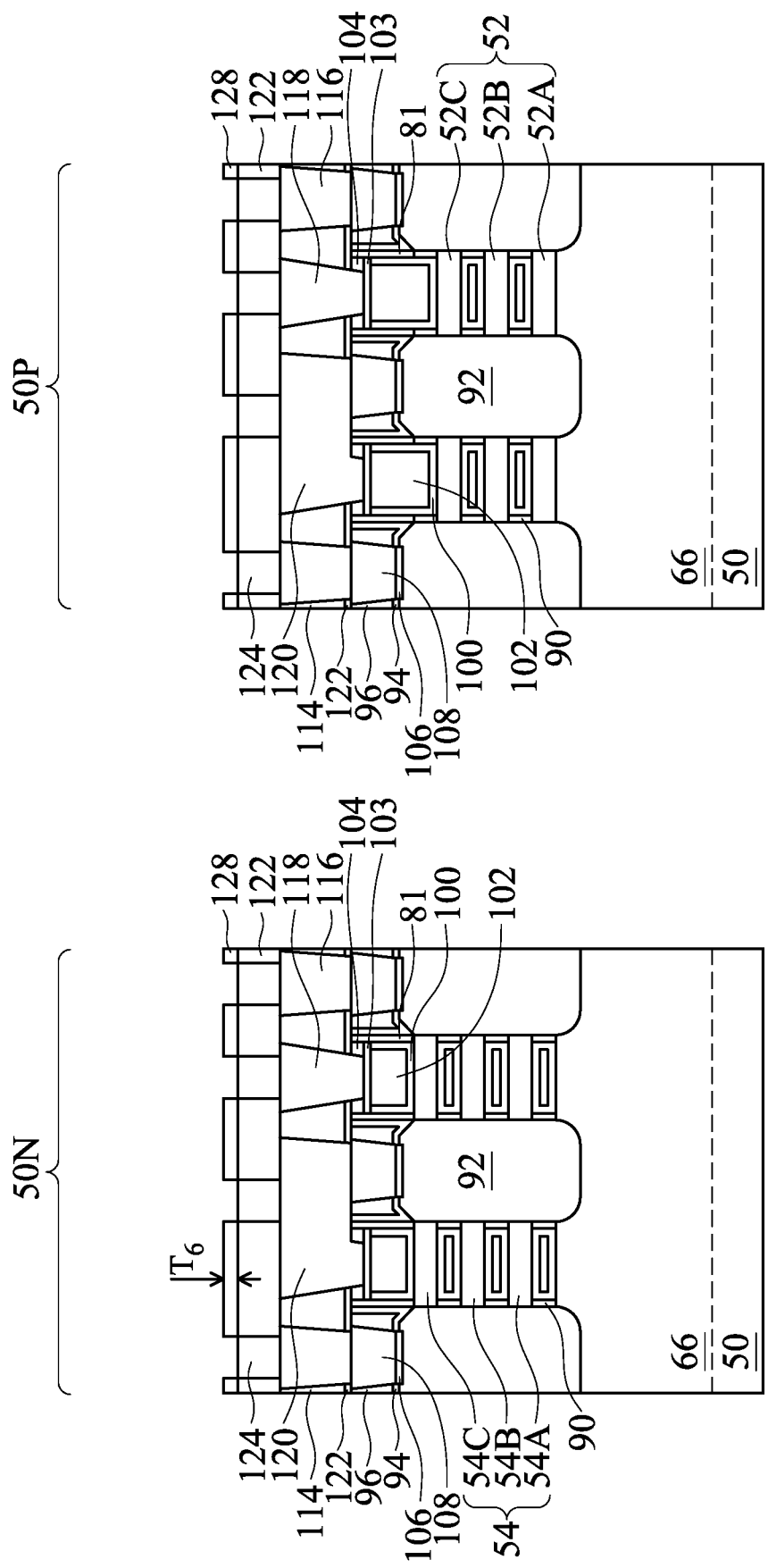

The second dielectric layer 128 may be deposited by a deposition process that selectively deposits the second dielectric layer 128 on dielectric surfaces of the first dielectric layer 122, without the second dielectric layer 128 being deposited on metal surfaces of the first conductive features 124. As illustrated in FIGS. 40A and 40B, the second dielectric layer 128 may be selectively deposited on the first dielectric layer 122, without being deposited on the first conductive features 124. The second dielectric layer 128 may be deposited to the thickness $T_6$ ranging from about 10 Å to about 30 Å. Forming the second dielectric layer 128 with a thickness less than the prescribed range may result in a higher-k material formed over the second dielectric layer 128 (such as the third dielectric layer 130, discussed above with respect to FIGS. 37A and 37B) being formed to a greater thickness, which undesirably increases capacitance. Further, the higher-k material may be an etch stop layer, and forming the second dielectric layer 128 with a thickness greater than the prescribed range may result in the higher-k material being formed to a lesser thickness, which does not sufficiently perform as an etch stop layer. The second dielectric layer 128 may be deposited in a wet deposition process or a dry deposition process. The second dielectric layer 128 may be deposited at a temperature ranging from about 40° C. to about 300° C., for a time ranging from about 30 seconds to about 30 minutes, at a dry pressure ranging from about 1 Torr to about 10 Torr. As illustrated in FIGS. 40A and 40B, side surfaces of the second dielectric layer 128 may be aligned with side surfaces of the first dielectric layer 122.

Figure 41A:
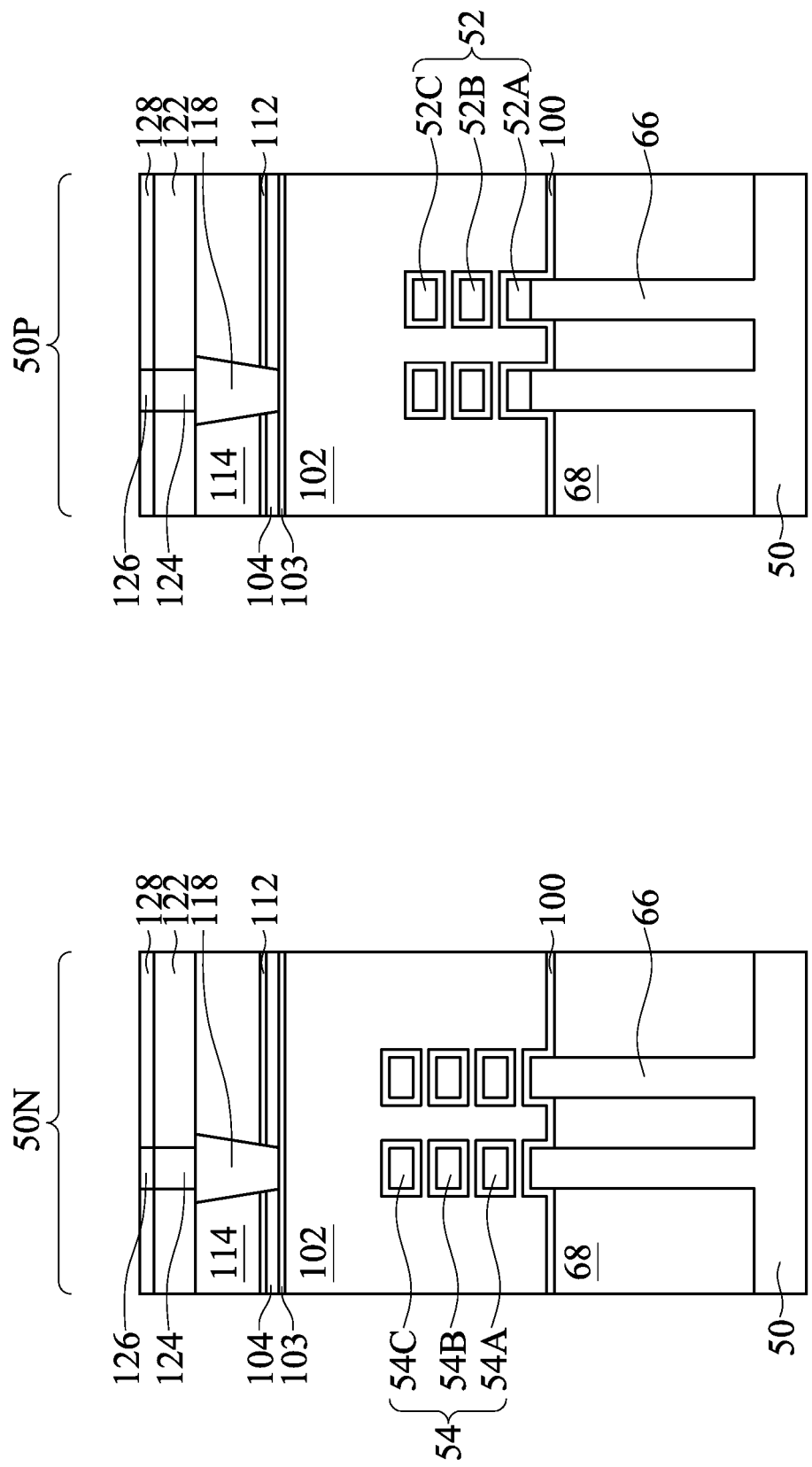
Figure 41B:
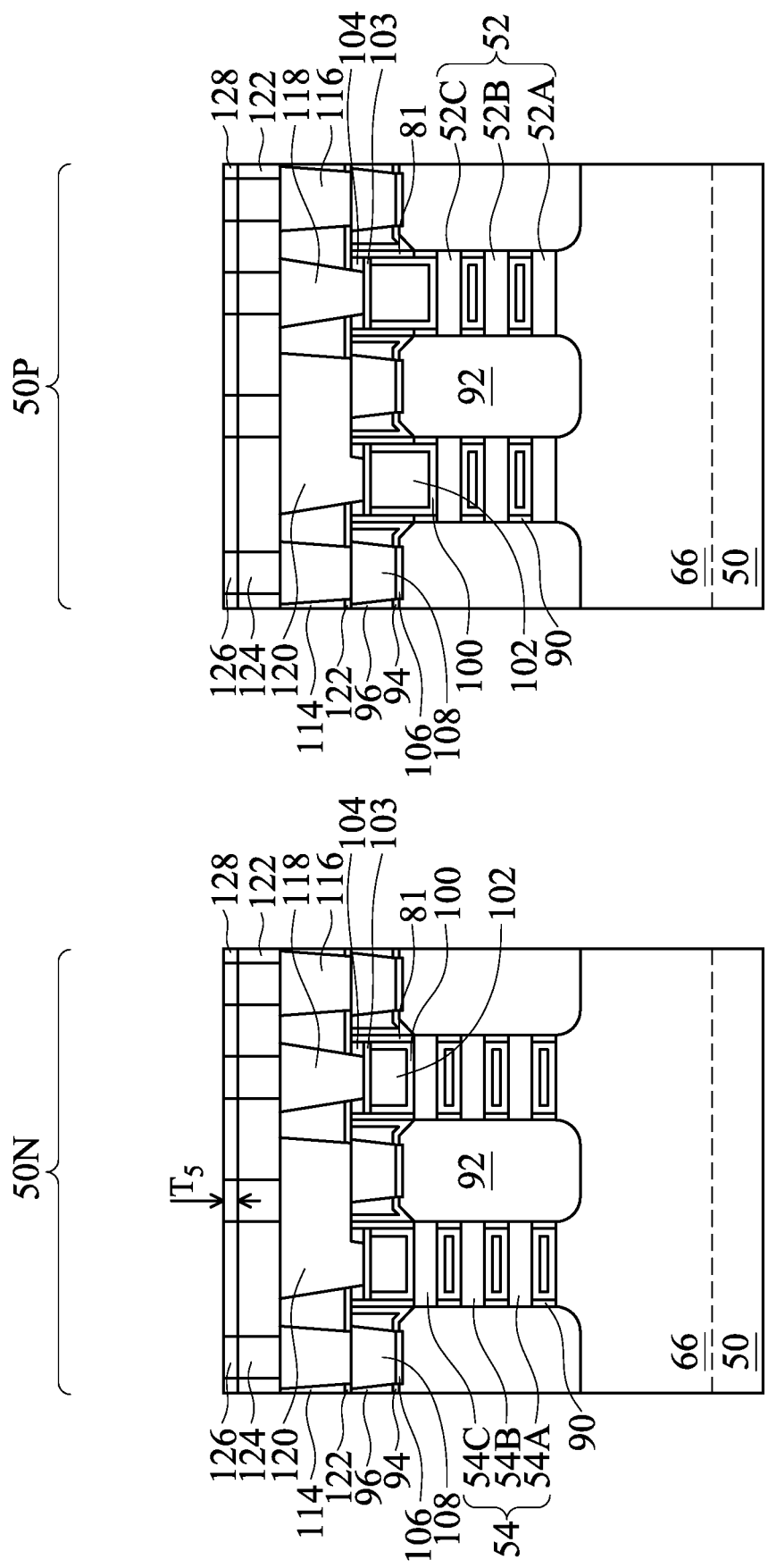

In FIGS. 41A and 41B, the sacrificial material 126 is deposited over the first conductive features 124, adjacent the second dielectric layer 128. In some embodiments, the sacrificial material 126 may be an organic polymer, such as a polyimide (PI), a polyamide, an organosilane, an organophosphonate, or the like. In embodiments in which the sacrificial material 126 comprises a polyimide, the sacrificial material 126 may comprise pyromellitic dianhydride (PMDA, $C_{10}H_2O_6$), 1,6-diaminohexane (hexamethylenediamine, hexane-1,6-diamine, $C_6H_{16}N_2$), combinations thereof, or the like. In embodiments in which the sacrificial material 126 comprises a polyamide, the sacrificial material 126 may comprise ethylenediamine (ethane-1,2-diamine, $C_2H_8N_2$), adipoyl chloride (hexanedioyl dichloride, $C_6H_8Cl_2O_2$), combinations thereof, or the like. In some embodiments, the sacrificial material 126 may comprise dodecylsilane ($C_{12}H_{28}Si$), octadecylphosphonic acid (ODPA, $C_{18}H_{39}O_3P$), or the like. In some embodiments, the sacrificial material 126 may have from 8 carbon atoms to 20 carbon atoms.

The sacrificial material 126 may be deposited by a deposition process that selectively deposits the sacrificial material 126 on metal surfaces of the first conductive features 124, without the sacrificial material 126 being deposited on dielectric surfaces of the first dielectric layer 122 and the second dielectric layer 128. The sacrificial material 126 may be deposited to the thickness $T_5$ ranging from about 25 Å to about 45 Å. As illustrated in FIGS. 41A and 41B, the sacrificial material 126 may be selectively deposited on the first conductive features 124, without being formed on the first dielectric layer 122 or the second dielectric layer 128. Sidewalls of the sacrificial material 126 may be aligned with sidewalls of the first conductive features 124. The sacrificial material 126 may be deposited in a wet deposition process or a dry deposition process. The sacrificial material 126 may be deposited at a temperature ranging from about 40° C. to about 300° C., for a time ranging from about 30 seconds to about 30 minutes, at a dry pressure ranging from about 1 Torr to about 10 Torr. Providing the sacrificial material 126 with a thickness less than the prescribed range may result in a subsequently deposited dielectric material (such as the third dielectric layer 130, discussed above with respect to FIGS. 36A and 36B) extending over the sacrificial material 126, and may lead to increased contact resistance between the first conductive features 124 and subsequently formed conductive features (such as the second conductive features 136, discussed above with respect to FIGS. 39A and 39B). Providing the sacrificial material 126 with a thickness greater than the prescribed range may result in the sacrificial material 126 extending over the second dielectric layer 128, which may result in damage to the second dielectric layer 128 after the sacrificial material 126 is subsequently removed. The steps illustrated in FIGS. 36A through 39B may then be performed on the structure of FIGS. 41A and 41B to form a structure the same as or similar to the structure illustrated in FIGS. 39A and 39B.

Forming the second dielectric layer 128, the sacrificial material 126, and the third dielectric layer 130 in the self-aligned manner, as described above, and replacing the sacrificial material 126 with the second conductive features 136 improves the alignment of the second conductive features 136 with respect to the first conductive features 124. This helps to reduce RC delay and reduce electromigration issues in completed devices. Further, removing the sacrificial material 126 using the high selectivity processes described above prevents damage to the second dielectric layer 128 and the first dielectric layer 122, which reduces time-dependent dielectric breakdown and stress migration. Forming the second dielectric layer 128 of a lower-k material and the third dielectric layer 130 of a material having good etch stop properties lowers parasitic capacitance of the structure including both the second dielectric layer 128 and the third dielectric layer 130, while the third dielectric layer 130 still functions as an effective etch stop layer. As such, the above-described methods may be used to improve device performance and reduce device defects.

Embodiments may achieve advantages. For example, forming the sacrificial material 126, the second dielectric layer 128, and the third dielectric layer 130 in the self-aligned manner, as described above, and replacing the sacrificial material 126 with the second conductive features 136 improves the alignment of the second conductive features 136 with respect to the first conductive features 124. This helps to reduce RC delay and reduce electromigration (EM) issues in completed devices. Further, removing the sacrificial material 126 using the high selectivity processes described above prevents damage to the third dielectric layer 130 and the second dielectric layer 128, which reduces time-dependent dielectric breakdown (TDDB) and stress migration (SM). Forming the second dielectric layer 128 of a lower-k material and the third dielectric layer 130 of a material having good etch stop properties lowers parasitic capacitance of the structure including both the second dielectric layer 128 and the third dielectric layer 130, while the third dielectric layer 130 still functions as an effective etch stop layer. As such, the above-described methods may be used to improve device performance and reduce device defects.

In accordance with an embodiment, a method includes forming a metal line extending through a first dielectric layer, the metal line being electrically coupled to a transistor; selectively depositing a sacrificial material over the metal line; selectively depositing a first dielectric material over the first dielectric layer and adjacent to the sacrificial material; selectively depositing a second dielectric material over the first dielectric material; removing the sacrificial material to form a first recess exposing the metal line; and forming a metal via in the first recess and electrically coupled to the metal line. In an embodiment, the method further includes etching back the sacrificial material after selectively depositing the first dielectric material, the second dielectric material being deposited along a top surface and a side surface of the first dielectric material. In an embodiment, the sacrificial material is etched back using an oxygen plasma. In an embodiment, the sacrificial material is deposited at least partially on the first dielectric layer, and portions of the sacrificial material extending on the first dielectric layer are removed by etching back the sacrificial material. In an embodiment, the method further includes depositing a second dielectric layer over the second dielectric material and the sacrificial material; and etching the second dielectric layer before removing the sacrificial material. In an embodiment, the method further includes depositing a second dielectric layer over the second dielectric material, the first dielectric material, and the metal line after removing the sacrificial material; and etching the second dielectric layer before forming the metal via. In an embodiment, the sacrificial material is removed using an oxygen plasma. In an embodiment, the first dielectric material has a first dielectric constant less than a second dielectric constant of the second dielectric material.

In accordance with another embodiment, a method includes forming a first conductive feature in a first dielectric layer, the first conductive feature being electrically coupled to a transistor; selectively depositing a first dielectric material over the first dielectric layer; selectively depositing a sacrificial material over the first conductive feature and adjacent to the first dielectric material; selectively depositing a second dielectric material over the first dielectric material, a first dielectric constant of the first dielectric material being less than a second dielectric constant of the second dielectric material; depositing a second dielectric layer over the second dielectric material, the first dielectric material, and the first conductive feature; etching the second dielectric layer to form a first recess; and forming a second conductive feature in the first recess and electrically coupled to the transistor. In an embodiment, the method further includes etching back the first dielectric material before selectively depositing the second dielectric material. In an embodiment, the method further includes removing the sacrificial material after etching the second dielectric layer to form the first recess. In an embodiment, a first top surface of the sacrificial material is level with a second top surface of the second dielectric material after selectively depositing the second dielectric material. In an embodiment, the method further includes removing the sacrificial material before depositing the second dielectric layer. In an embodiment, the method further includes removing the sacrificial material using an oxygen plasma.

In accordance with yet another embodiment, a semiconductor device includes a first dielectric layer over a semiconductor substrate; a metal line extending through the first dielectric layer and electrically coupled to a transistor; a second dielectric layer extending along a first top surface of the first dielectric layer; a third dielectric layer extending along opposite sidewalls and a second top surface of the second dielectric layer; a fourth dielectric layer extending along a third top surface of the third dielectric layer; and a metal via extending through the fourth dielectric layer and the third dielectric layer, the metal via being electrically coupled to the metal line, the metal via extending along the third top surface of the third dielectric layer, the third dielectric layer separating the second dielectric layer from the metal via. In an embodiment, the second dielectric layer has a first dielectric constant less than a second dielectric constant of the third dielectric layer. In an embodiment, the second dielectric layer has a first thickness ranging from 20 Å to 30 Å, and the third dielectric layer has a thickness ranging from 5 Å to 15 Å. In an embodiment, a first portion of the metal via extending through the fourth dielectric layer has a tapered shape, and a second portion of the metal via extending through the third dielectric layer has a reverse tapered shape. In an embodiment, a first portion of the metal via extending through the fourth dielectric layer has a tapered shape, and a second portion of the metal via extending through the third dielectric layer has vertical sidewalls extending in a direction perpendicular to a major surface of the semiconductor substrate. In an embodiment, the semiconductor device further includes a sacrificial material extending through the third dielectric layer, the sacrificial material including a polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a metal line extending through a first dielectric layer, wherein the metal line is electrically coupled to a transistor;
    selectively depositing a sacrificial material over the metal line;
    selectively depositing a first dielectric material over the first dielectric layer and adjacent to the sacrificial material;
    selectively depositing a second dielectric material over the first dielectric material;
    removing the sacrificial material to form a first recess exposing the metal line; and
    forming a metal via in the first recess and electrically coupled to the metal line.

2. The method of claim 1, further comprising etching back the sacrificial material after selectively depositing the first dielectric material, wherein the second dielectric material is deposited along a top surface and a side surface of the first dielectric material.

3. The method of claim 2, wherein the sacrificial material is etched back using an oxygen plasma.

4. The method of claim 2, wherein the sacrificial material is deposited at least partially on the first dielectric layer, and wherein portions of the sacrificial material extending on the first dielectric layer are removed by etching back the sacrificial material.

5. The method of claim 1, further comprising:
    depositing a second dielectric layer over the second dielectric material and the sacrificial material; and
    etching the second dielectric layer before removing the sacrificial material.

6. The method of claim 1, further comprising:
    depositing a second dielectric layer over the second dielectric material, the first dielectric material, and the metal line after removing the sacrificial material; and
    etching the second dielectric layer before forming the metal via.

7. The method of claim 1, wherein the sacrificial material is removed using an oxygen plasma.

8. The method of claim 1, wherein the first dielectric material has a first dielectric constant less than a second dielectric constant of the second dielectric material.

9. A method comprising:
    forming a first conductive feature in a first dielectric layer, wherein the first conductive feature is electrically coupled to a transistor;
    selectively depositing a first dielectric material over the first dielectric layer;
    selectively depositing a sacrificial material over the first conductive feature and adjacent to the first dielectric material;
    selectively depositing a second dielectric material over the first dielectric material, wherein a first dielectric constant of the first dielectric material is less than a second dielectric constant of the second dielectric material;
    depositing a second dielectric layer over the second dielectric material, the first dielectric material, and the first conductive feature;
    etching the second dielectric layer to form a first recess; and
    forming a second conductive feature in the first recess and electrically coupled to the transistor.

10. The method of claim 9, further comprising etching back the first dielectric material before selectively depositing the second dielectric material.

11. The method of claim 10, further comprising removing the sacrificial material after etching the second dielectric layer to form the first recess.

12. The method of claim 10, wherein a first top surface of the sacrificial material is level with a second top surface of the second dielectric material after selectively depositing the second dielectric material.

13. The method of claim 9, further comprising removing the sacrificial material before depositing the second dielectric layer.

14. The method of claim 9, further comprising removing the sacrificial material using an oxygen plasma.

15. A method comprising:
    depositing a first dielectric layer over a semiconductor substrate;
    forming a metal line extending through the first dielectric layer and electrically coupled to a transistor on the semiconductor substrate;
    selectively depositing a sacrificial dielectric material along a first top surface of the metal line;
    selectively depositing a second dielectric layer extending along a first top surface of the first dielectric layer;
    trimming back the sacrificial dielectric material to expose sidewalls of the second dielectric layer;
    depositing a third dielectric layer extending along the sidewalls and along a second top surface of the second dielectric layer;
    depositing a fourth dielectric layer extending along a third top surface of the third dielectric layer;
    patterning the fourth dielectric layer to expose the sacrificial dielectric material;
    removing the sacrificial dielectric material to form a recess; and
    forming a metal via in the recess, the metal via extending through the fourth dielectric layer and the third dielectric layer, wherein the metal via is electrically coupled to the metal line.

16. The method of claim 15, wherein the second dielectric layer has a first dielectric constant less than a second dielectric constant of the third dielectric layer.

17. The method of claim 15, wherein the second dielectric layer has a first thickness ranging from 20 Å to 30 Å, and wherein the third dielectric layer has a thickness ranging from 5 Å to 15 Å.

18. The method of claim 15, wherein the step of forming the metal via in the recess forms a metal via having a first portion extending through the fourth dielectric layer with a tapered shape, and a second portion extending through the third dielectric layer with a reverse tapered shape.

19. The method of claim 15, wherein the step of forming the metal via in the recess forms a metal via with a tapered shape, and a second portion extending through the third dielectric layer with vertical sidewalls extending in a direction perpendicular to a major surface of the semiconductor substrate.

20. The method of claim 15, selectively depositing the sacrificial dielectric material along the first top surface of the metal line comprises depositing a material selected from the group consisting of an organic polymer, a polyimide, a polyamide, an organosilane, an organophosphonate, pyromellitic dianhydride (PMDA, $C_{10}H_2O_6$), 1,6-diaminohexane (hexamethylenediamine, hexane-1,6-diamine, $C_6H_{16}N_2$), ethylenediamine (ethane-1,2-diamine, $C_2H_8N_2$), adipoyl chloride (hexanedioyl dichloride, $C_6H_8Cl_2O_2$), dodecylsilane ($C_{12}H_{28}Si$), octadecylphosphonic acid (ODPA, $C_{18}H_{39}O_3P$), and combinations thereof.

\* \* \* \* \*